United States Patent
Ikegawa et al.

(10) Patent No.: US 11,637,235 B2
(45) Date of Patent: Apr. 25, 2023

(54) IN-PLANE SPIN ORBIT TORQUE MAGNETORESISTIVE STACK/STRUCTURE AND METHODS THEREFOR

(71) Applicant: Everspin Technologies, Inc., Chandler, AZ (US)

(72) Inventors: Sumio Ikegawa, Phoenix, AZ (US); Han Kyu Lee, Chandler, AZ (US); Sanjeev Aggarwal, Scottsdale, AZ (US); Jijun Sun, Chandler, AZ (US); Syed M. Alam, Austin, TX (US); Thomas Andre, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 35 days.

(21) Appl. No.: 16/744,963

(22) Filed: Jan. 16, 2020

(65) Prior Publication Data

US 2020/0235288 A1 Jul. 23, 2020

Related U.S. Application Data

(60) Provisional application No. 62/793,957, filed on Jan. 18, 2019.

(51) Int. Cl.
*H01L 43/04* (2006.01)
*H01L 43/06* (2006.01)
(Continued)

(52) U.S. Cl.
CPC ............ *H01L 43/04* (2013.01); *H01L 27/228* (2013.01); *H01L 43/06* (2013.01); *H01L 43/10* (2013.01); *H01L 43/14* (2013.01)

(58) Field of Classification Search
CPC ......... H01L 43/04; H01L 43/06; H01L 43/08; H01L 43/10; H01L 43/12; H01L 43/14;
(Continued)

(56) References Cited

U.S. PATENT DOCUMENTS

| 8,686,484 B2 | 4/2014 | Whig et al. |
| 8,747,680 B1 | 6/2014 | Deshpande et al. |

(Continued)

FOREIGN PATENT DOCUMENTS

| CN | 107658382 A | 2/2018 |
| JP | 2014241449 A | 12/2014 |

(Continued)

OTHER PUBLICATIONS

PCT International Search Report and Written Opinion dated Apr. 17, 2020 in corresponding International Application No. PCT/US2020/013841 (20 pages).

(Continued)

*Primary Examiner* — Nelson Garces
(74) *Attorney, Agent, or Firm* — Bookoff McAndrews, PLLC

(57) ABSTRACT

The present disclosure is drawn to, among other things, a magnetoresistive device and a magnetoresistive memory comprising a plurality of such magnetoresistive devices. In some aspects, a magnetoresistive device may include a magnetically fixed region, a magnetically free region above or below the magnetically fixed region, and an intermediate region positioned between the magnetically fixed region and the magnetically free region, wherein the intermediate region includes a first dielectric material. The magnetoresistive device may also include encapsulation layers formed on opposing side walls of the magnetically free region, wherein the encapsulation layers include the first dielectric material.

26 Claims, 40 Drawing Sheets

(51) Int. Cl.
*H01L 43/10* (2006.01)
*H01L 43/14* (2006.01)
*H01L 27/22* (2006.01)

(58) Field of Classification Search
CPC . H01L 27/228; G11C 11/161; G11C 11/1675; G11C 11/18
See application file for complete search history.

(56) References Cited

U.S. PATENT DOCUMENTS

| | | | |
|---|---|---|---|
| 9,023,216 B2 | 5/2015 | Kochergin et al. | |
| 9,136,464 B1 | 9/2015 | Whig et al. | |
| 9,419,208 B2 | 8/2016 | Whig et al. | |
| 9,830,968 B2 | 11/2017 | Shimomura et al. | |
| 9,953,692 B1 | 4/2018 | Mihajlovic et al. | |
| 2003/0123197 A1 | 7/2003 | Mizuguchi et al. | |
| 2005/0185459 A1 | 8/2005 | Fukuzumi | |
| 2007/0164265 A1 | 7/2007 | Takeshi | |
| 2012/0122247 A1 | 5/2012 | Mather et al. | |
| 2013/0028010 A1* | 1/2013 | Li | G11C 11/1675 365/158 |
| 2015/0200003 A1 | 7/2015 | Buhman et al. | |
| 2016/0351238 A1 | 12/2016 | Doyle et al. | |
| 2017/0117323 A1 | 4/2017 | Braganca et al. | |
| 2017/0140804 A1 | 5/2017 | Apalkov et al. | |
| 2017/0169872 A1 | 6/2017 | Yoda et al. | |
| 2018/0040812 A1* | 2/2018 | Shimizu | H01L 43/08 |
| 2018/0061467 A1 | 3/2018 | Kan et al. | |
| 2018/0158498 A1 | 6/2018 | Aggarwal et al. | |
| 2018/0159024 A1* | 6/2018 | Buyandalai | H01L 43/12 |
| 2018/0174635 A1* | 6/2018 | Yoda | G11C 11/1673 |
| 2018/0268889 A1 | 9/2018 | Pathak et al. | |
| 2019/0006415 A1 | 1/2019 | Li et al. | |
| 2019/0088858 A1* | 3/2019 | Ohsawa | G11C 11/1675 |
| 2019/0189912 A1 | 6/2019 | Ebrahimi | |

FOREIGN PATENT DOCUMENTS

| | | |
|---|---|---|
| TW | I479487 B | 4/2015 |
| TW | I532138 B | 5/2016 |

OTHER PUBLICATIONS

A. R. Sitaram et al., "A 0.18 /spl mu/m logic-based MRAM technology for high performance nonvolatile memory applications," 2003 Symposium on VLSI Technology. Digest of Technical Papers (IEEE Cat. No. 03CH37407), Kyoto, Japan, 2003, pp. 15-16, doi: 10.1109/VLSIT.2003.1221063.
International Search Report and Written Opinion dated Jul. 29, 2020 in International Application No. PCT/US2020/013329 (18 pages).
W. J. Gallagher and S. S. P. Parkin, "Development of the magnetic tunnel junction MRAM at IBM: From first junctions to a 16-Mb MRAM demonstrator chip," in IBM Journal of Research and Development, vol. 50, No. 1, pp. 5-23, Jan. 2006, doi: 10.1147/rd.501.0005.
Taiwanese Office Action dated Jan. 11, 2023, in Taiwanese Patent Application No. 108146431 (6 pages).
Taiwanese Office Action dated Feb. 15, 2023 in counterpart Taiwanese Patent Application No. 109101640.

* cited by examiner

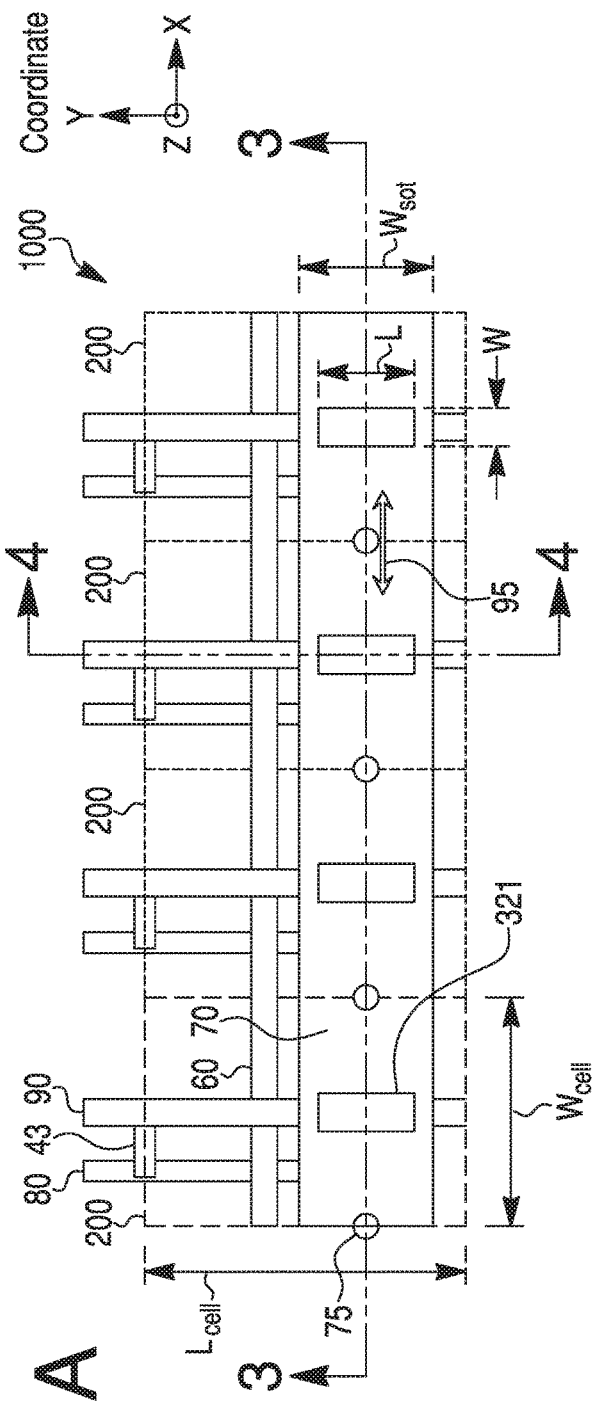
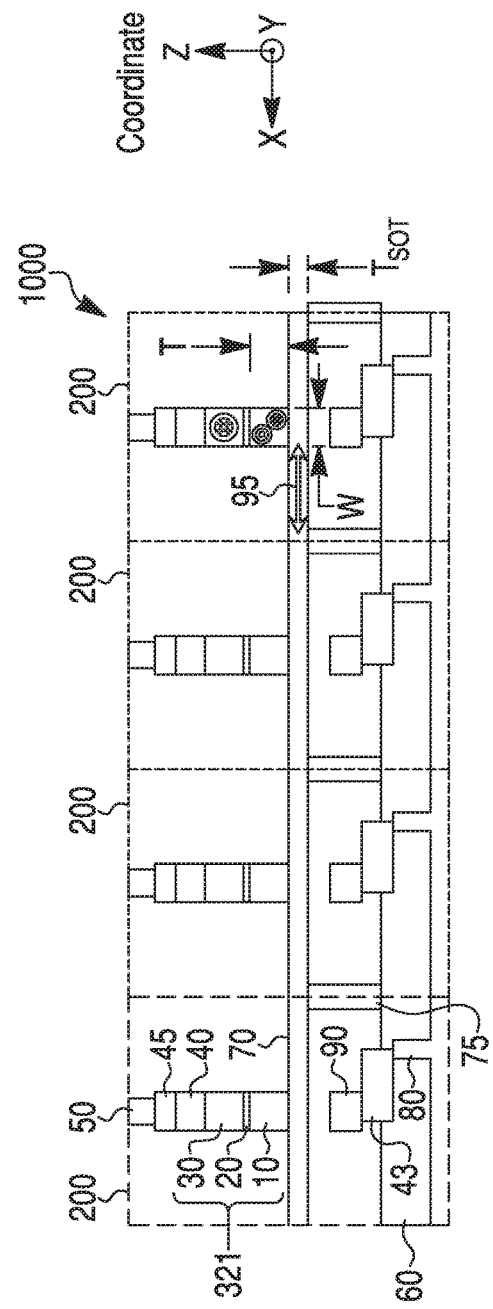

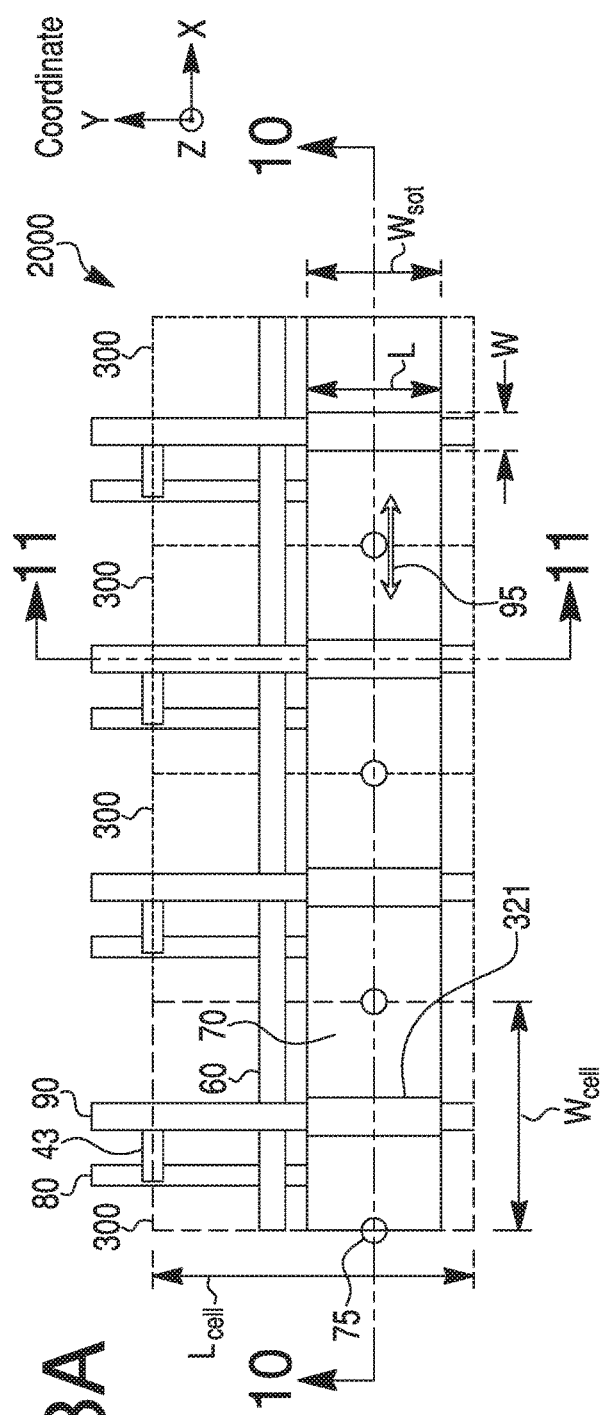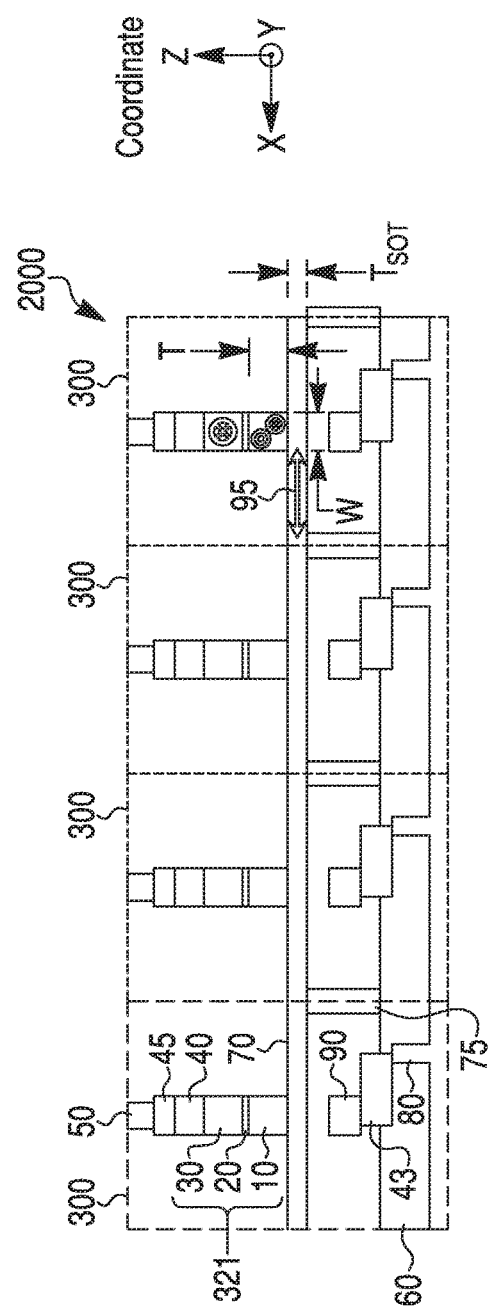

IN-PLANE SPIN ORBIT TORQUE MAGNETORESISTIVE STACK/STRUCTURE AND METHODS THEREFOR

CROSS-REFERENCE TO RELATED APPLICATION(S)

This application claims the benefit of priority to U.S. Provisional Application No. 62/793,957, filed on Jan. 18, 2019, which is incorporated by reference herein in its entirety.

TECHNICAL FIELD

The present disclosure relates to, among other things, magnetoresistive stacks and methods for fabricating and using the disclosed magnetoresistive stacks.

BACKGROUND

There are many inventions described and illustrated herein, as well as many aspects and embodiments of those inventions. In one aspect, the present disclosure relates to a magnetoresistive stack (for example, part of a magnetoresistive memory device, magnetoresistive sensor/transducer device, etc.) and methods of manufacturing the described magnetoresistive stacks. Exemplary magnetoresistive stacks (for example, used in a magnetic tunnel junction (MTJ) magnetoresistive device) of the current disclosure may include encapsulation layers formed on magnetic tunnel junctions. Exemplary magnetoresistive stacks of the current disclosure may also include spin-orbit-torque (SOT) write lines that are shared by multiple magnetoresistive stacks. Therefore, in some aspect, the present disclosure may relate to SOT magnetoresistive random access memory (SOT MRAM) devices and/or non-volatile logic devices and methods of manufacturing and using such devices. However, the exemplary magnetoresistive stacks of the current disclosure (including encapsulation layers formed on magnetic tunnel junctions) may be applicable to other types of devices, including but not limited to spin-transfer-torque (STT) devices.

Briefly, a magnetoresistive stack used in a memory device (e.g., MRAM) includes at least one non-magnetic layer (for example, at least one dielectric layer or a non-magnetic yet electrically conductive layer) disposed between a "fixed" magnetic region (hereinafter referred to as a "fixed region") and a "free" magnetic region (hereinafter referred to as a "free region"), each including one or more layers of ferromagnetic materials. Information may be stored in the magnetoresistive memory stack by switching, programming, and/or controlling the direction of magnetization vectors (i.e., magnetization direction) in the magnetic layer(s) of the free region. The direction of the magnetization vectors of the free region may be switched and/or programmed (for example, through spin-orbit-torque (SOT) or spin-transfer-torque (STT)) by applying a write signal (e.g., one or more current pulses) to the magnetoresistive memory stack (e.g., directing one or more current pulses through the magnetoresistive stack by STT switching, or along an SOT write line by SOT switching, etc.). In contrast, the magnetization vectors in the magnetic layers of a fixed region are magnetically fixed in a predetermined direction. When the magnetization vectors of the free region adjacent to the non-magnetic layer (e.g., a dielectric layer) are in the same direction as the magnetization vectors of the fixed region adjacent to the non-magnetic layer, the magnetoresistive memory stack has a first magnetic state having a first electrical resistance (e.g., a low resistance state). Conversely, when the magnetization vectors of the free region adjacent to the non-magnetic layer are opposite the direction of the magnetization vectors of the fixed region adjacent to the non-magnetic layer, the magnetoresistive memory stack has a second magnetic state having a second electrical resistance (e.g., a high resistance state). The magnetic state of the magnetoresistive memory stack is determined or read based on the resistance of the stack in response to a read current (e.g., by directing a read current through the stack).

It should be noted that, although exemplary embodiments in the disclosure are described and/or illustrated herein in the context of MTJ stacks/structures, embodiments may also be implemented in giant magnetoresistive (GMR) stacks/structures where a conductor (e.g., copper) is disposed between two ferromagnetic regions/layers/materials. Indeed, embodiments of the present disclosure may also be employed in connection with other types of magnetoresistive stacks (and/or structures) wherein such stacks include a fixed region, a free region, an intermediate region, etc. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

As magnetic memory devices (e.g., MRAM) advance towards smaller process nodes to, for example, increase density, individual MTJ bit sizes must laterally shrink to accommodate tighter pitch and space between bits. However, as the size and/or aspect ratio of the MTJ bit decreases, the energy barrier between the two magnetic states of the free region of the MTJ also may decrease. As the energy barrier decreases, however, the data retention and/or thermal stability of the MTJ bit also may decrease or otherwise become compromised. Typically, the decrease in energy barrier of the MTJ bit may be corrected or mitigated by increasing the magnetic anisotropy or magnetic moment of the free region by, e.g., altering its composition, material, and/or dimensions. However, doing so may also raise the critical current of the MTJ bit under certain instances. MTJ bits with high critical currents undergo a greater amount of periodic damage and degeneration during write and/or reset operations, for example, in spin-transfer-torque (STT) magnetoresistive devices. In the case of in-plane magnetic tunnel junctions, the existence of demagnetization field effect in relation to critical currents may also decrease the switching efficiency (due to an increase in the critical current). Furthermore, as the MTJ bit sizes become smaller, electrical encroachment effect in the MTJ bits becomes larger, leading to a decreased magnetoresistance ratio (MR) and an increased MTJ resistance in the low resistance state (Rmtj), and an increased STT-switching voltage.

In some embodiments, the present disclosure relates to devices and methods for attaining high energy barrier and switching efficiency in smaller-sized MTJ bits (i.e., MTJ bits with relatively smaller dimensions), by manipulating the shape, composition, and/or dimensions of such MTJ bits. Further, in some embodiments, the present disclosure relates to devices and methods for attaining high cycling endurance of MTJ bits, by utilizing a spin-orbit-torque (SOT) write line to switch the MTJ bits. The scope of the current disclosure, however, is defined by the attached claims, and not by any characteristics of the resulting device or method.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various described embodiments, as well as associated methods of manufacture. For ease of illustration, the figures depict the different regions along the thickness of the illustrated stacks as a layer having well-defined boundaries with straight edges (e.g., depicted using lines). However, one skilled in the art would understand that, in reality, at an interface between adjacent regions or layers, the materials of these regions may alloy together, or migrate into one or the other material, and make their boundaries ill-defined or diffuse. That is, although multiple layers with distinct interfaces are illustrated in the figures, in some cases, over time and/or due to exposure to high temperatures, materials of some of the layers may migrate into or interact with materials of other layers to present a more diffuse interface between these layers. Further, although the figures illustrate each region or layer as having a relatively uniform thickness across its width, one of ordinary skill in the art would recognize that, in reality, the different regions may have a non-uniform thickness (e.g., the thickness of a layer may vary along the width of the layer), and/or the thickness of one region or layer may differ relative to the thickness of another (e.g., adjacent) region or layer.

In the figures and description, details of well-known features (e.g., interconnects, etc.) and manufacturing techniques (e.g., deposition techniques, etching techniques, etc.) may be omitted for the sake of brevity (and to avoid obscuring other features and details), since these features/technique are well-known to those of ordinary skill in the art. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in reality, such regions/layers may be more "rounded" and/or gradually sloping. It should also be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations. Rather, it is intended to reflect or indicate the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks may have a different order (e.g., the opposite order (i.e., from top to bottom)).

Figure 1:
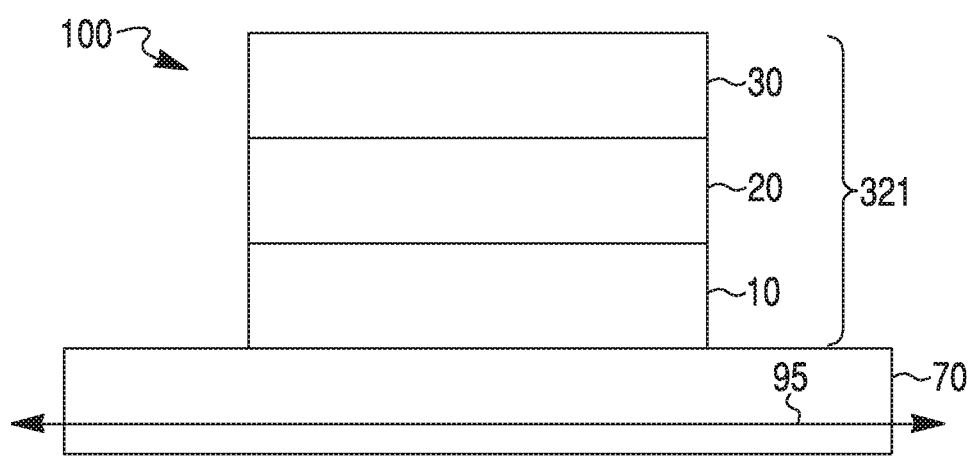

FIG. 1 illustrates a cross-sectional view of an exemplary magnetoresistive stack of the present disclosure.

Figure 2A:
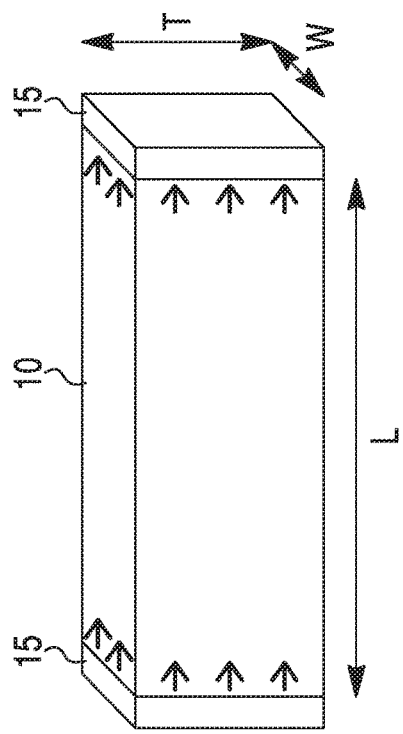

FIG. 2A illustrates a perspective view of a portion of an exemplary magnetoresistive stack of the present disclosure.

Figure 2B:
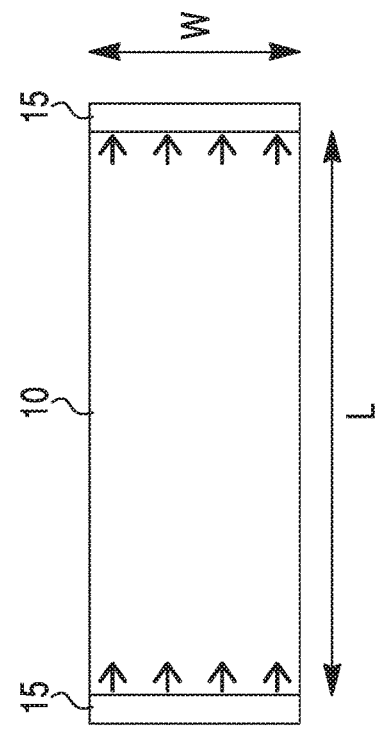

FIG. 2B illustrates a plan view of the portion of the exemplary magnetoresistive stack shown in FIG. 2A.

Figure 3:
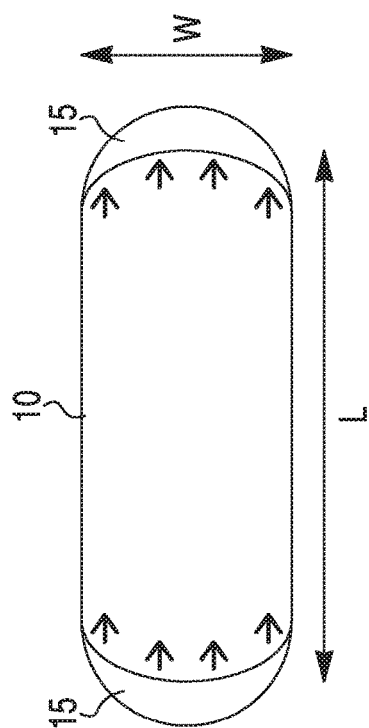

FIG. 3 illustrates a plan view of an exemplary magnetoresistive stack in another embodiment.

Figure 4:
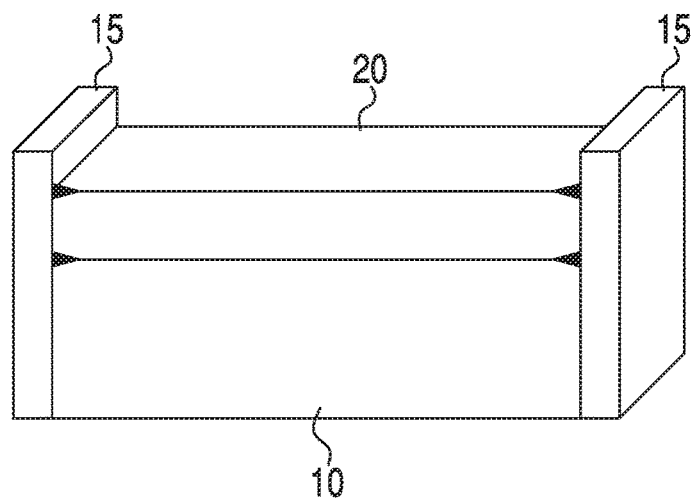

FIG. 4 illustrates a perspective view of a portion of an exemplary magnetoresistive stack of the present disclosure.

Figure 5A:
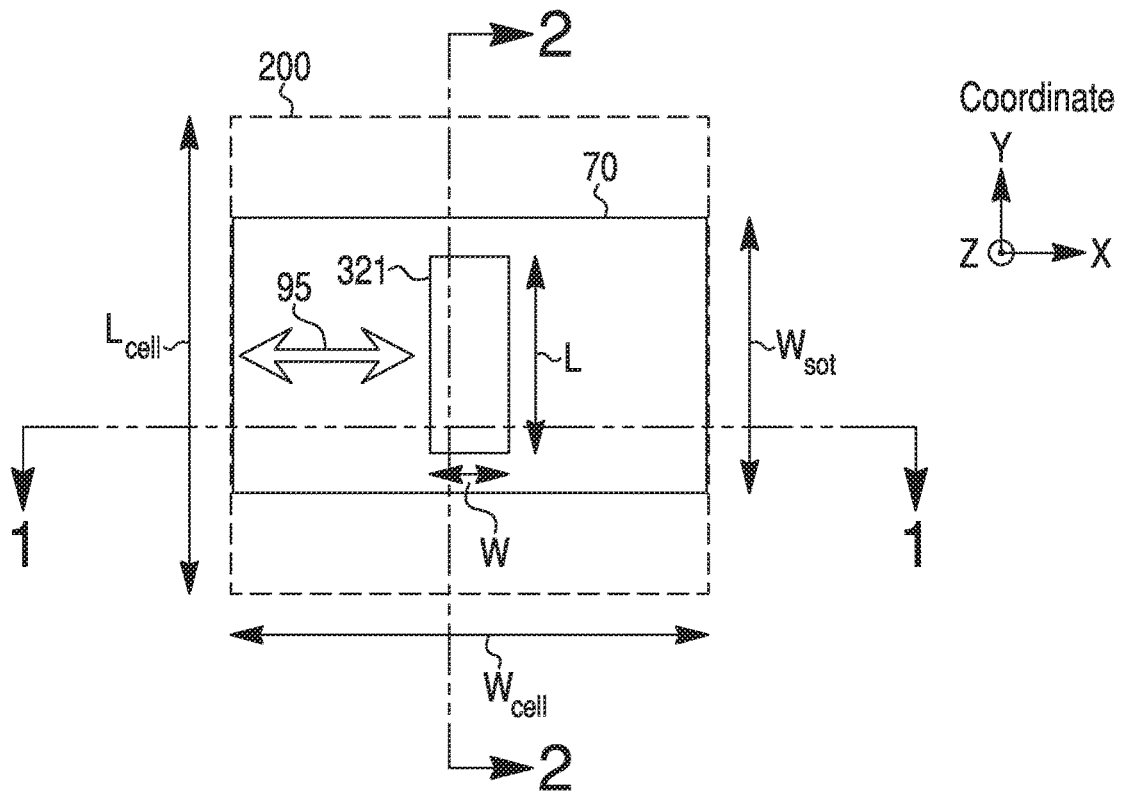

FIG. 5A illustrates a plan view of a portion of a memory cell including an exemplary magnetoresistive stack of the present disclosure.

Figure 5B:
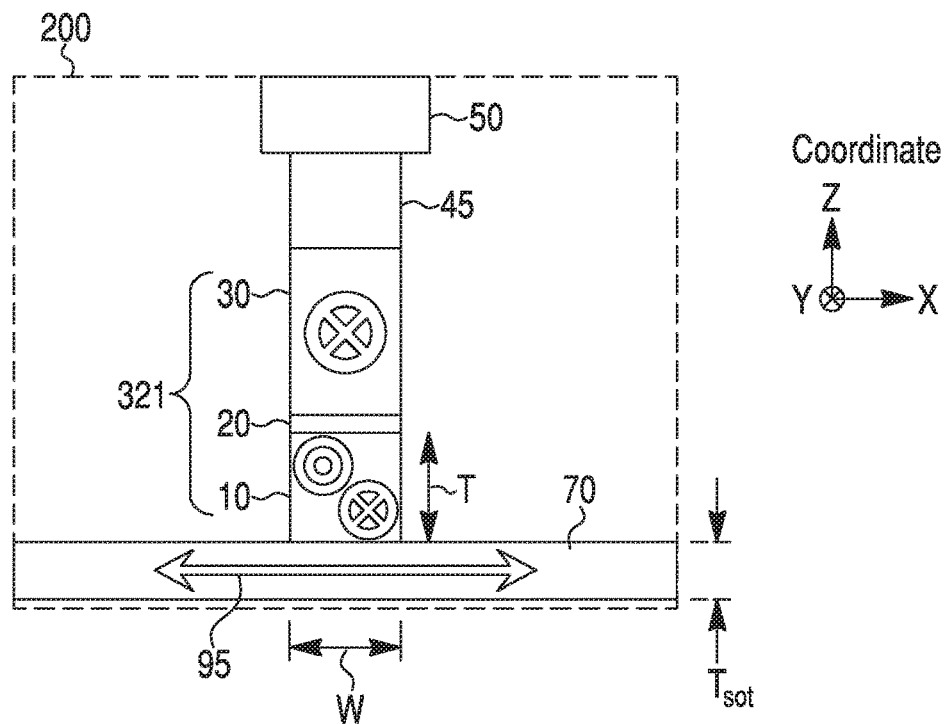

FIG. 5B illustrates a cross-sectional view of a portion of a memory cell including an exemplary magnetoresistive stack of the present disclosure, along the plane 1-1 shown in FIG. 5A.

Figure 5C:
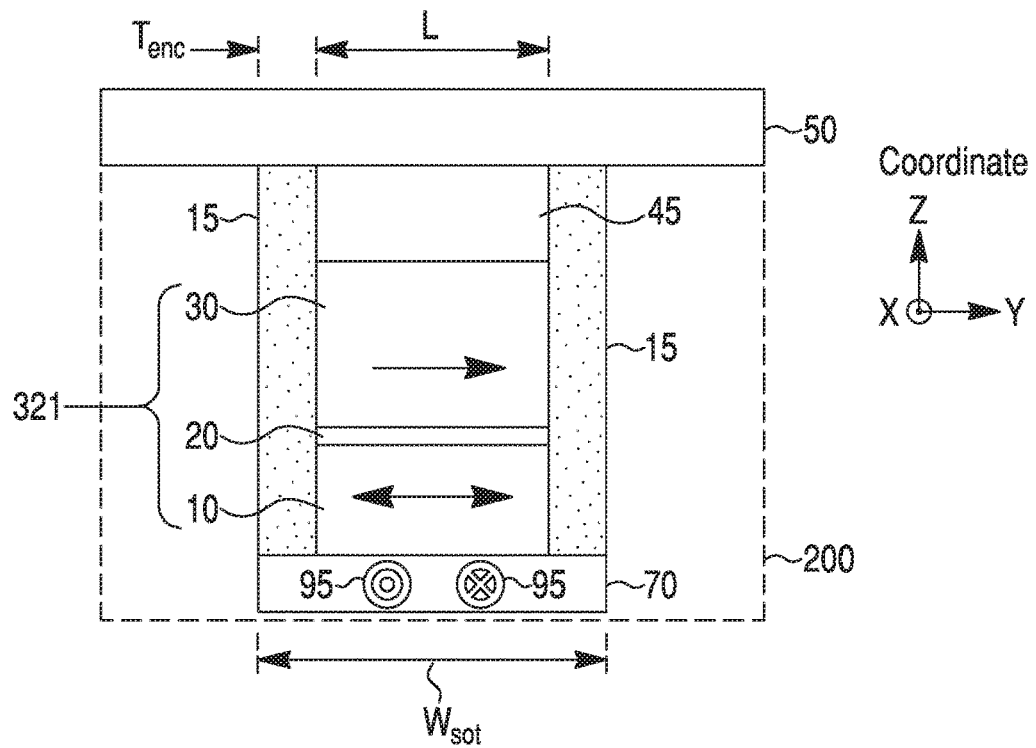

FIG. 5C illustrates another cross-sectional view of a portion of a memory cell including an exemplary magnetoresistive stack of the present disclosure, along the plane 2-2 shown in FIG. 5A.

FIG. 6A illustrates a plan view of a portion of a magnetoresistive device including an exemplary magnetoresistive stack of the present disclosure.

FIG. 6B illustrates a cross-sectional view of a portion of a magnetoresistive device including an exemplary magnetoresistive stack of the present disclosure, along the plane 3-3 shown in FIG. 6A.

Figure 6C:
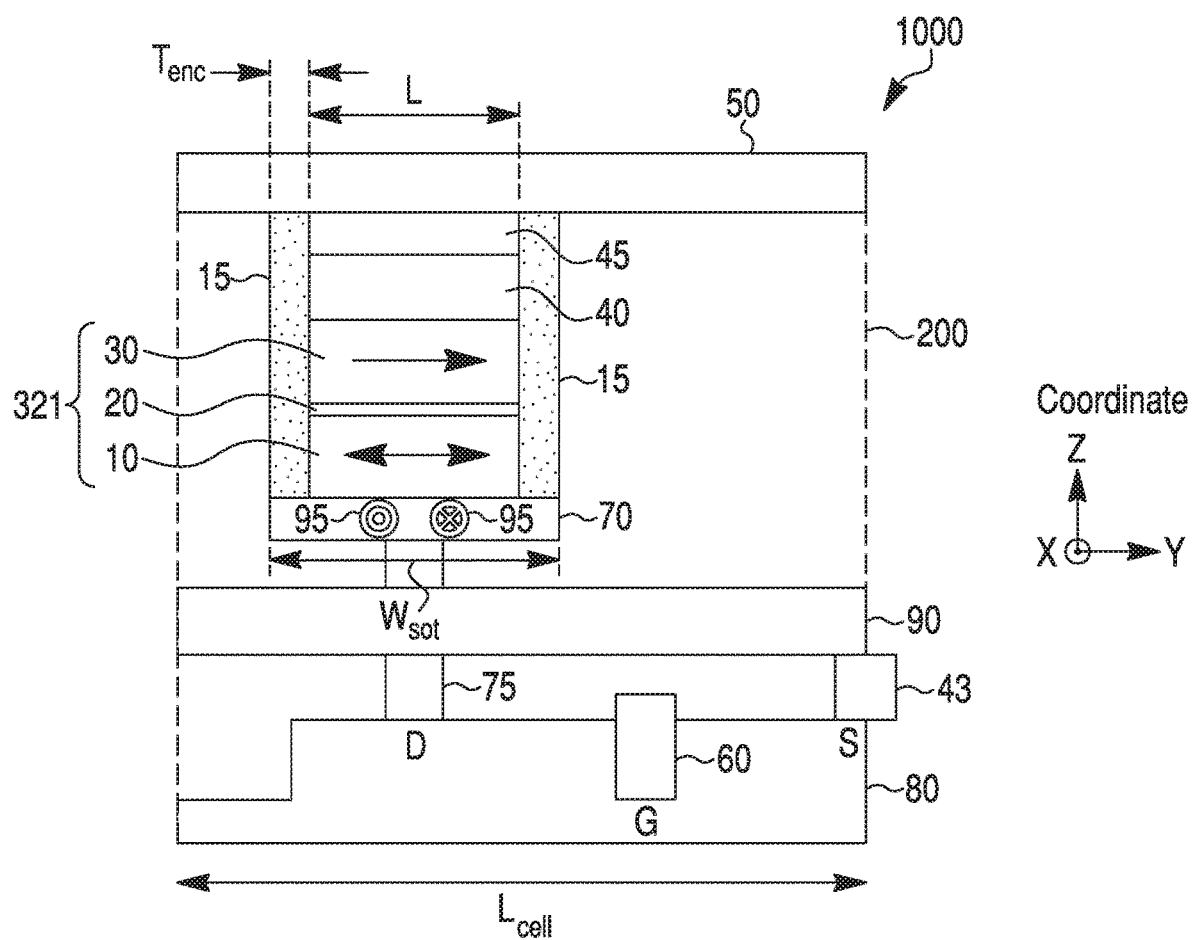

FIG. 6C illustrates another cross-sectional view of a portion of a magnetoresistive device including an exemplary magnetoresistive stack of the present disclosure, along the plane 4-4 shown in FIG. 6A.

Figure 7:
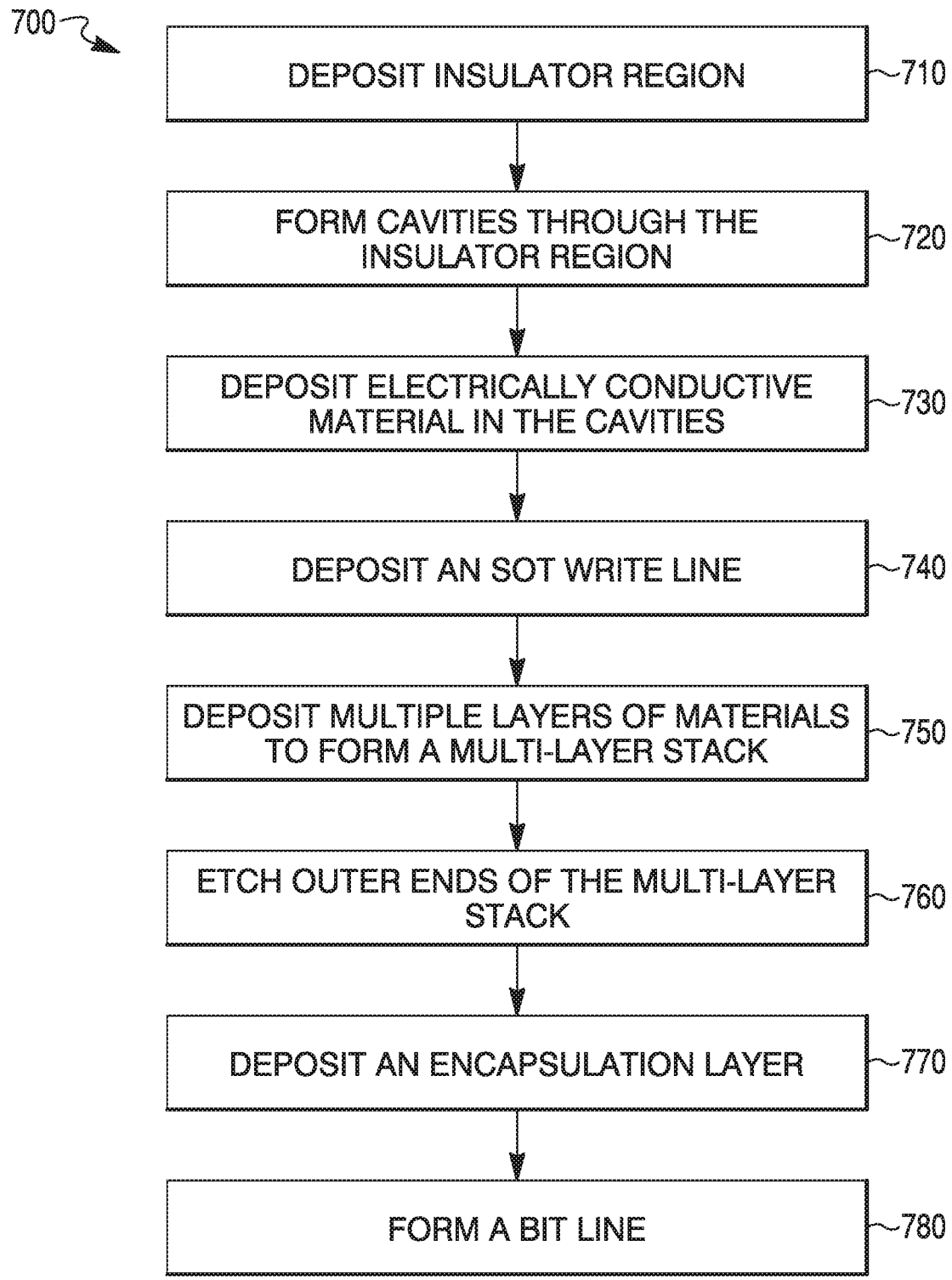

FIG. 7 is a flow chart of a method 700 of fabricating an exemplary magnetoresistive device 1000 of the present disclosure.

FIGS. 8A-8I are schematic cross-sectional views of the magnetoresistive device 1000 at various stages of the fabrication process.

Figure 9:
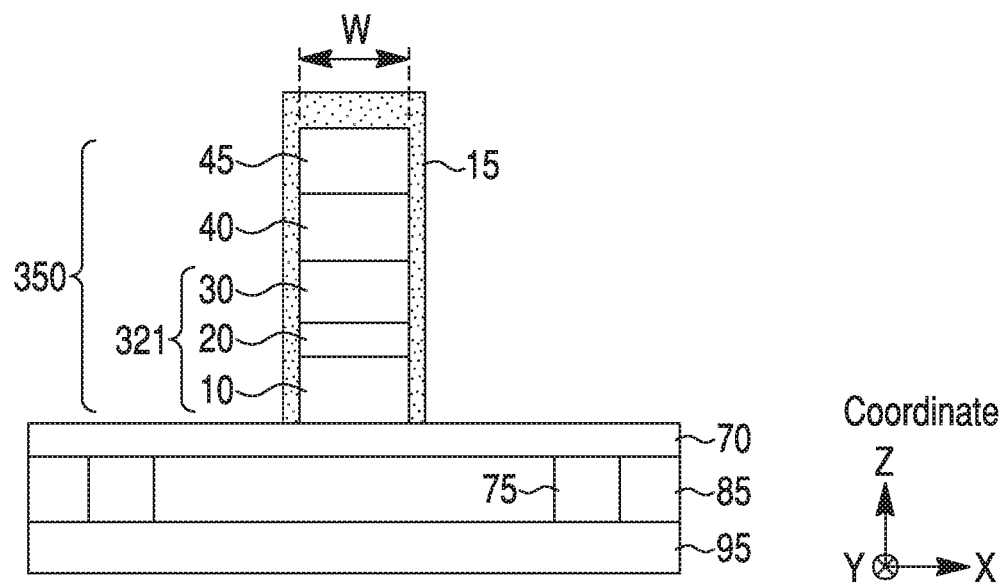

FIG. 9 is a schematic cross-sectional view of the magnetoresistive device 100 at one stage of the fabrication process.

Figure 10:
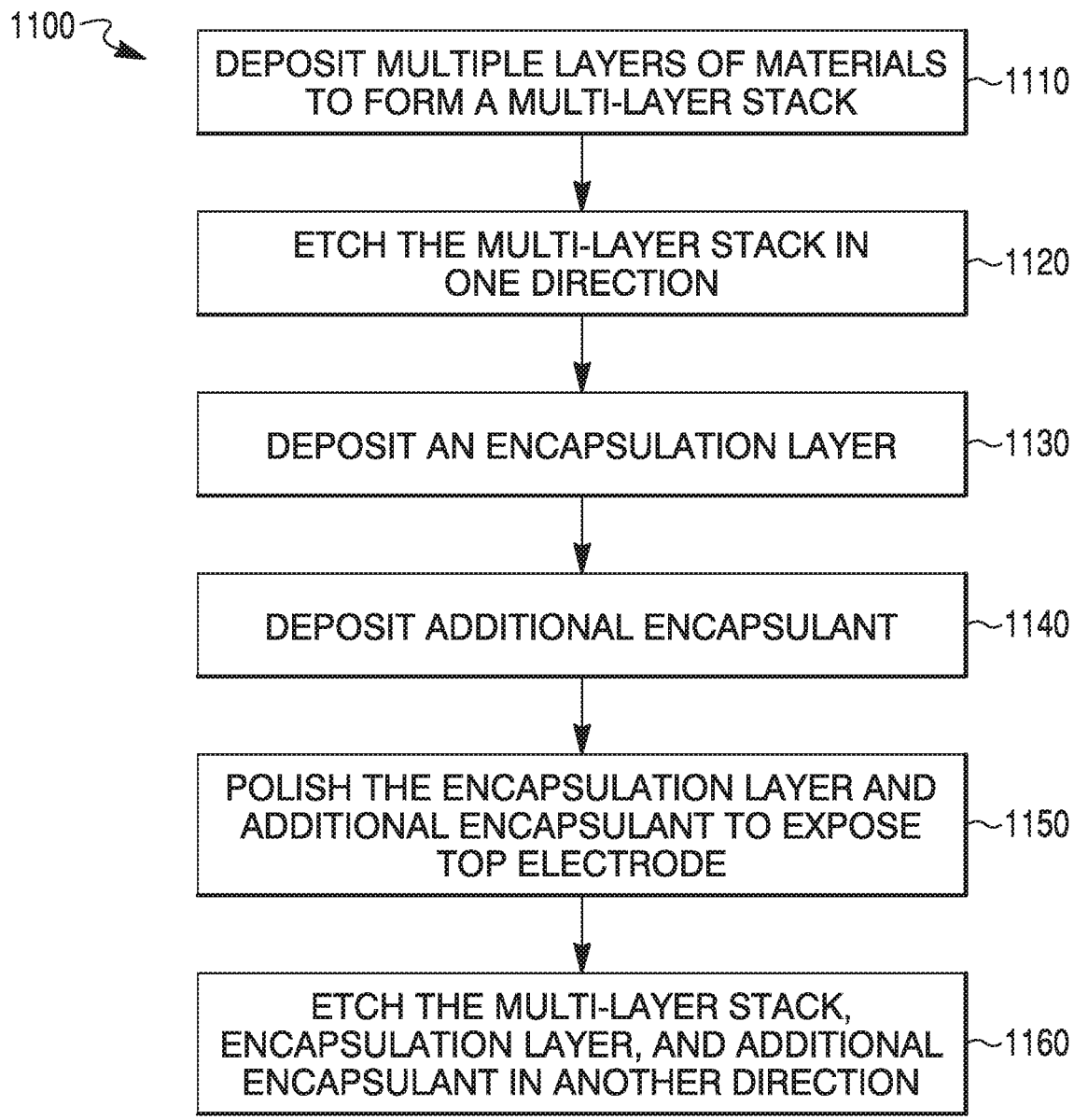

FIG. 10 is a flow chart of another method 1100 of fabricating an exemplary magnetoresistive device 1000 of the present disclosure.

FIGS. 11A, 11B, 11C, 11D, 11E, 11F, 11G, and 11H are schematic cross-sectional views of the magnetoresistive device 1000 at various stages of the fabrication process.

Figure 11A:
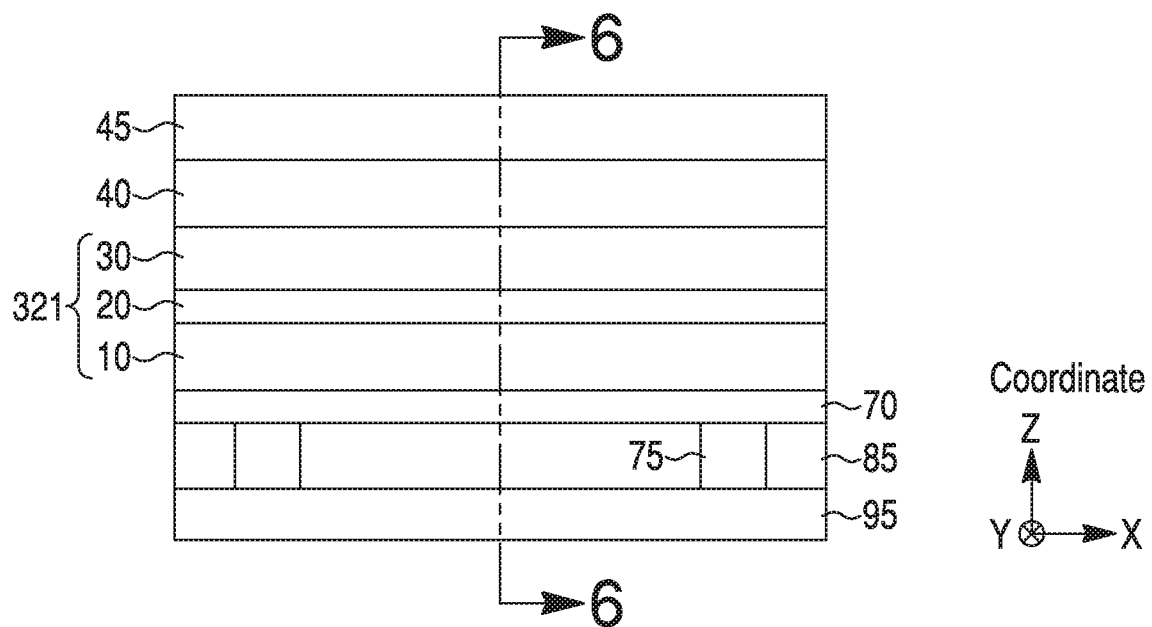
Figure 11A:

FIGS. 11AA, 11CC, 11FF, 11GG, and 11HH illustrate plan views of the magnetoresistive device 1000 at various stages of the fabrication process.

Figure 12A:
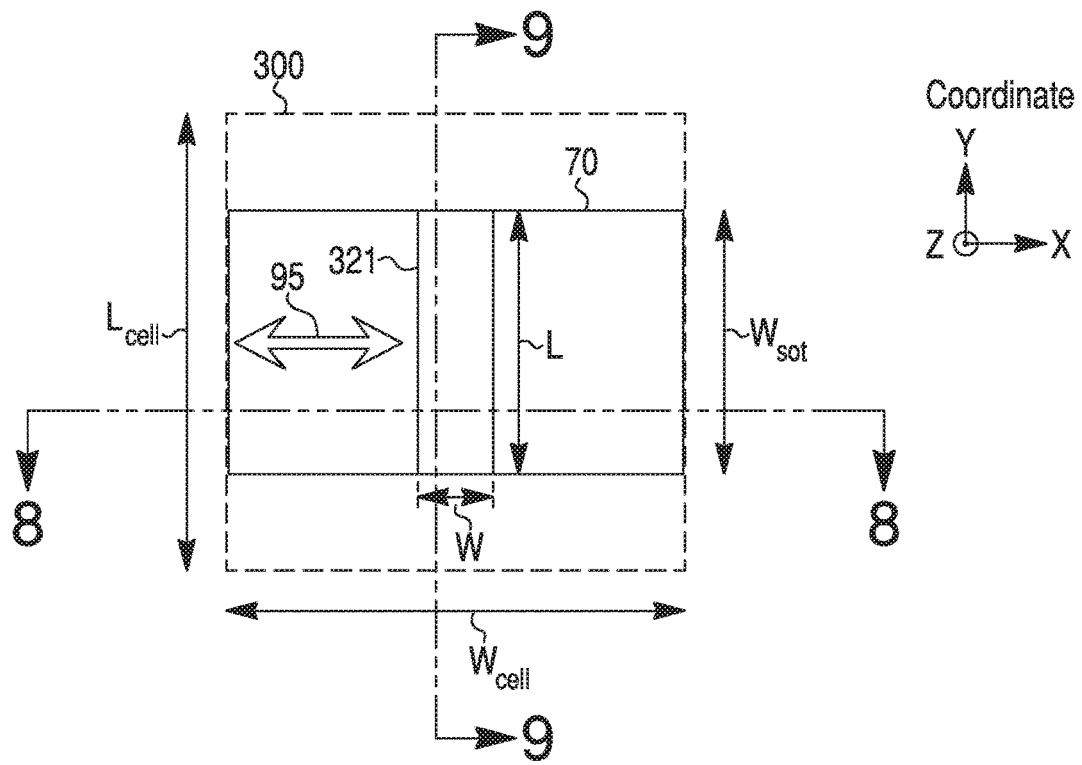

FIG. 12A illustrates a plan view of a portion of a memory cell including an exemplary magnetoresistive stack of the present disclosure.

Figure 12B:
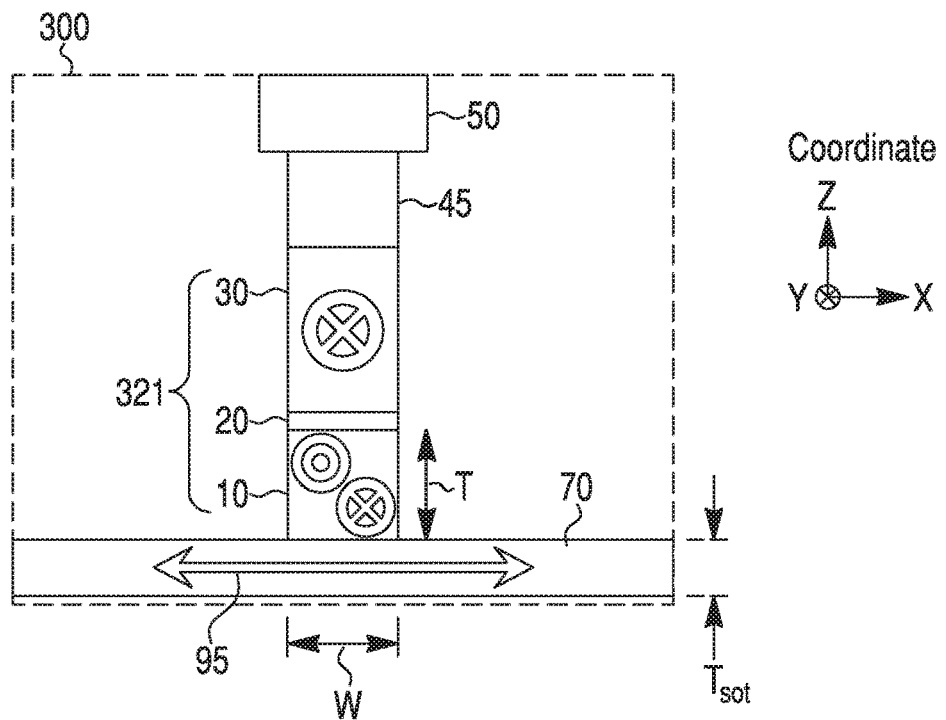

FIG. 12B illustrates a cross-sectional view of a portion of a memory cell including an exemplary magnetoresistive stack of the present disclosure, along the plane 8-8 shown in FIG. 12A.

Figure 12C:
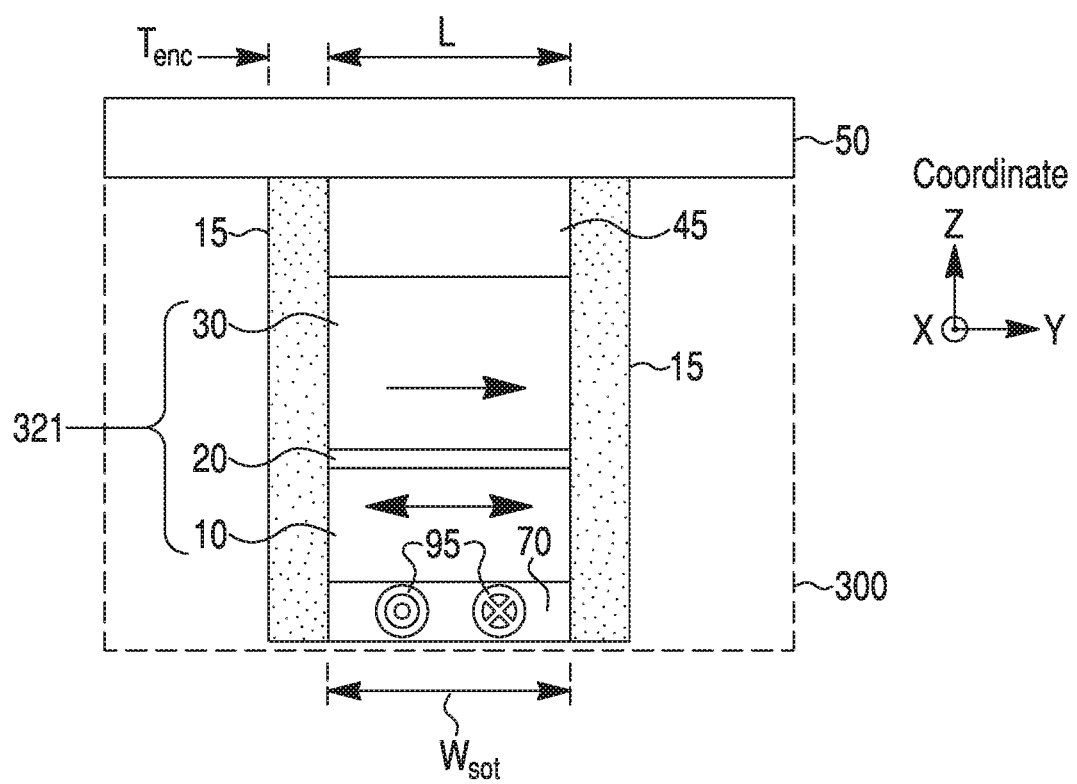

FIG. 12C illustrates another cross-sectional view of a portion of a memory cell including an exemplary magnetoresistive stack of the present disclosure, along the plane 9-9 shown in FIG. 12A.

FIG. 13A illustrates a plan view of a portion of a magnetoresistive device including an exemplary magnetoresistive stack of the present disclosure.

FIG. 13B illustrates a cross-sectional view of a portion of a magnetoresistive device including an exemplary magnetoresistive stack of the present disclosure, along the plane 10-10 shown in FIG. 13A.

Figure 13C:
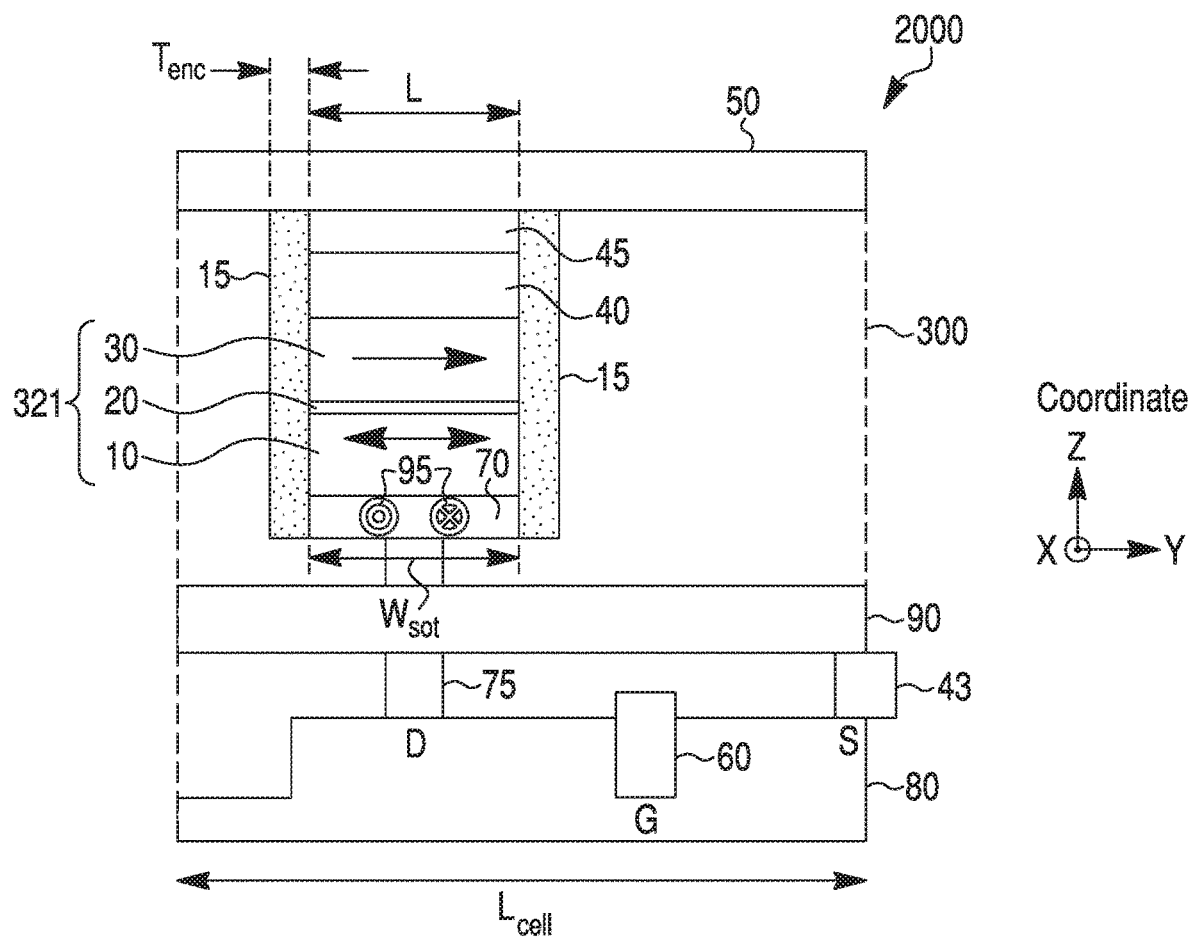

FIG. 13C illustrates another cross-sectional view of a portion of a magnetoresistive device including an exemplary magnetoresistive stack of the present disclosure, along the plane 11-11 shown in FIG. 13A.

Figure 14:
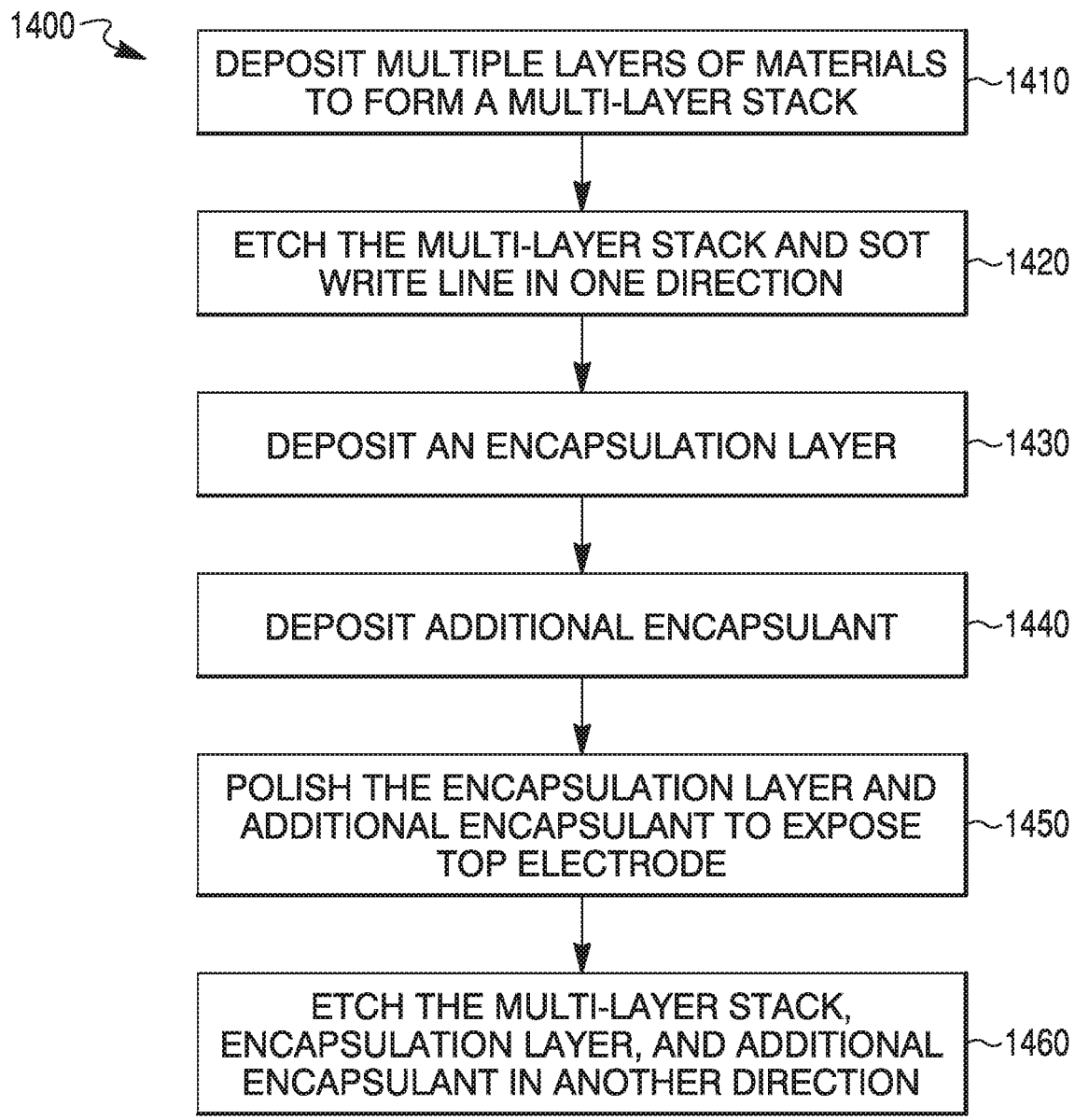

FIG. 14 is a flow chart of a method 1400 of fabricating an exemplary magnetoresistive device 2000 of the present disclosure.

FIGS. 15A, 15B, 15C, 15D, 15E, 15F, 15G, and 15H are schematic cross-sectional views of the magnetoresistive device 2000 at various stages of the fabrication process.

Figure 15A:
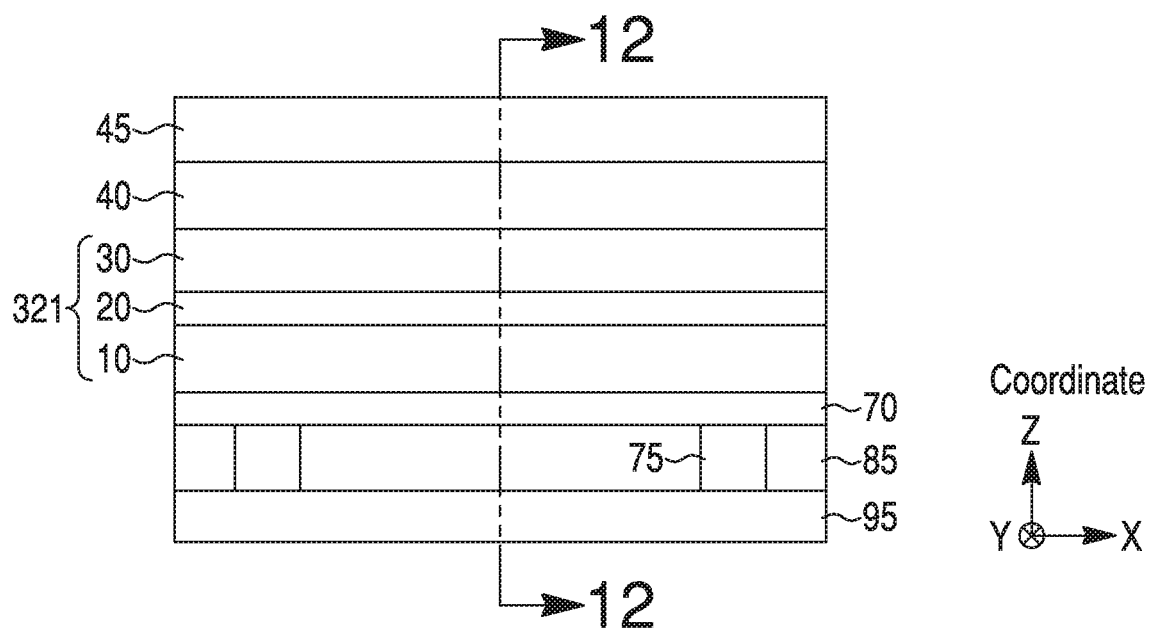
Figure 15A:
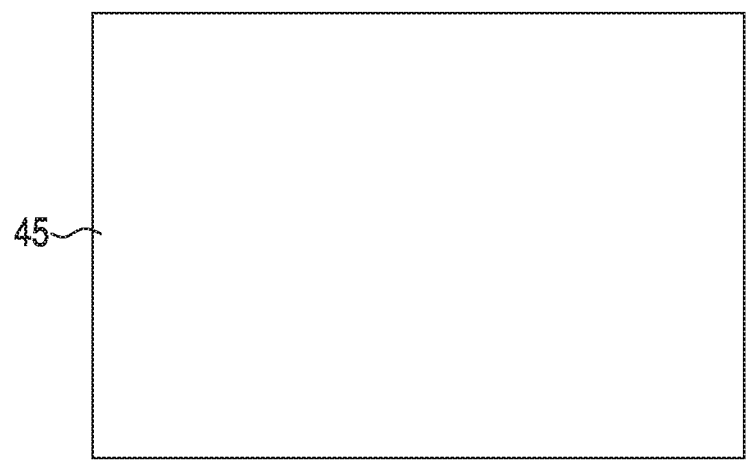

FIGS. 15AA, 15CC, 15FF, 15GG, and 15HH illustrate plan views of the magnetoresistive device 2000 at various stages of the fabrication process.

Figure 16A:
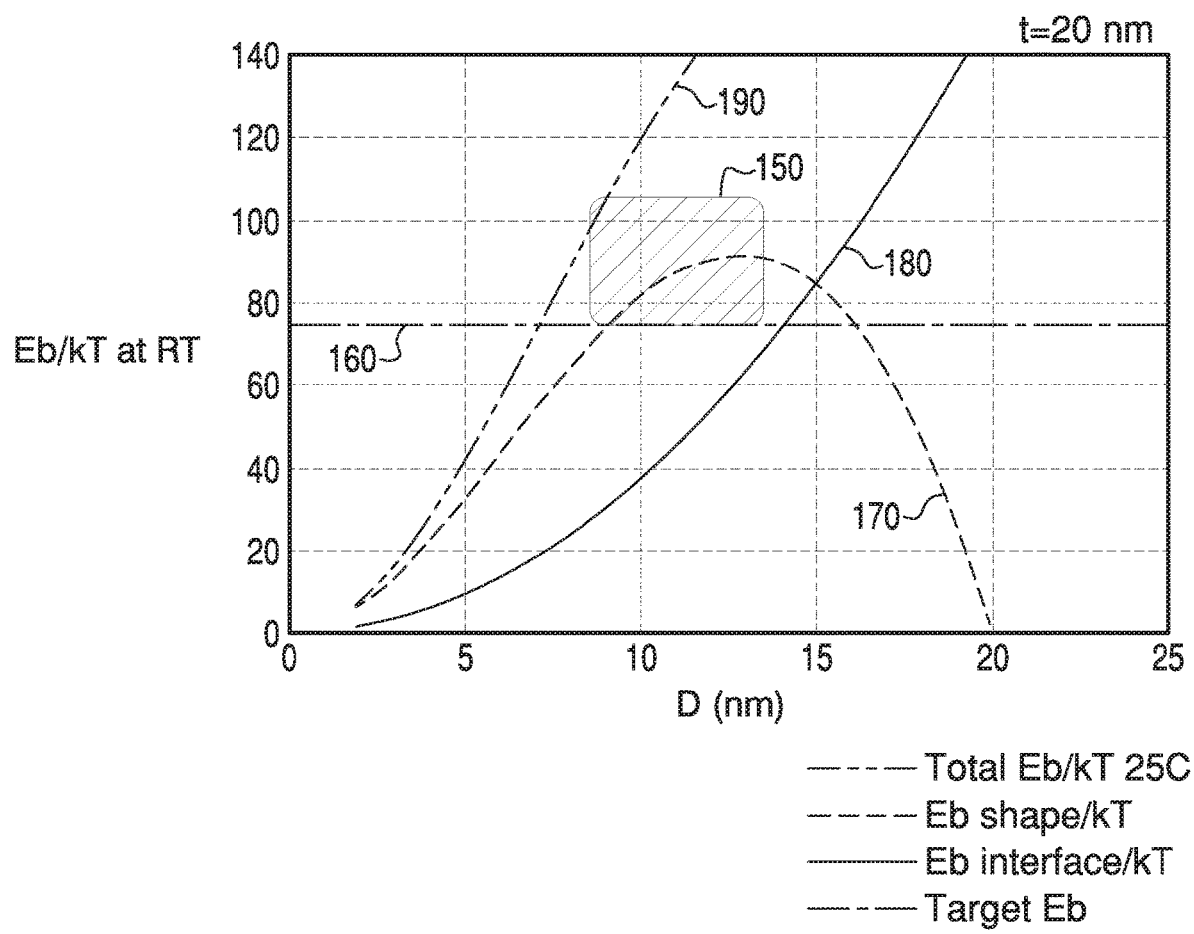

FIG. 16A shows a graph illustrating the relationship between a dimension of a free region and a thermal stability parameter of an MTJ bit.

Figure 16B:
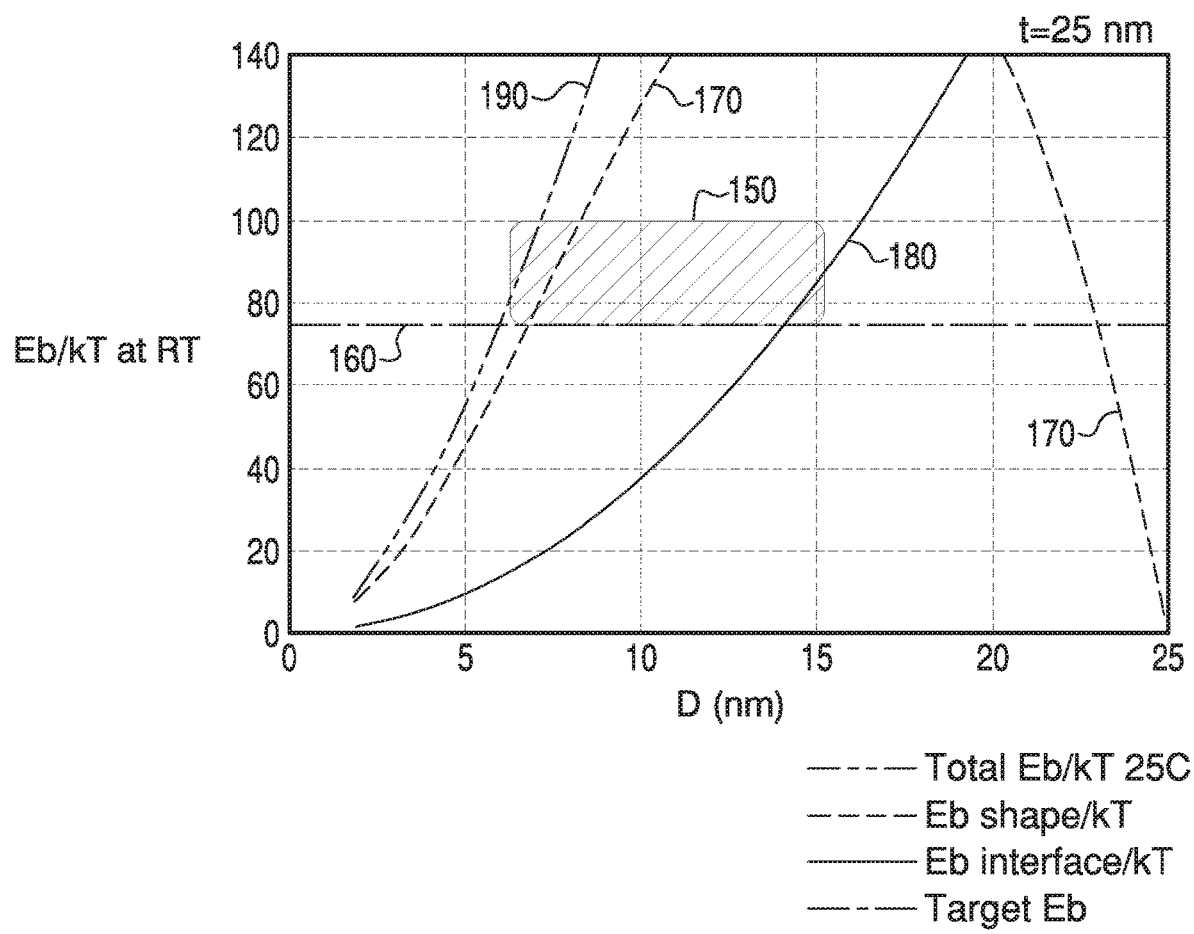

FIG. 16B shows another graph illustrating the relationship between a dimension of a free region and a thermal stability parameter of an MTJ bit.

Figure 16C:
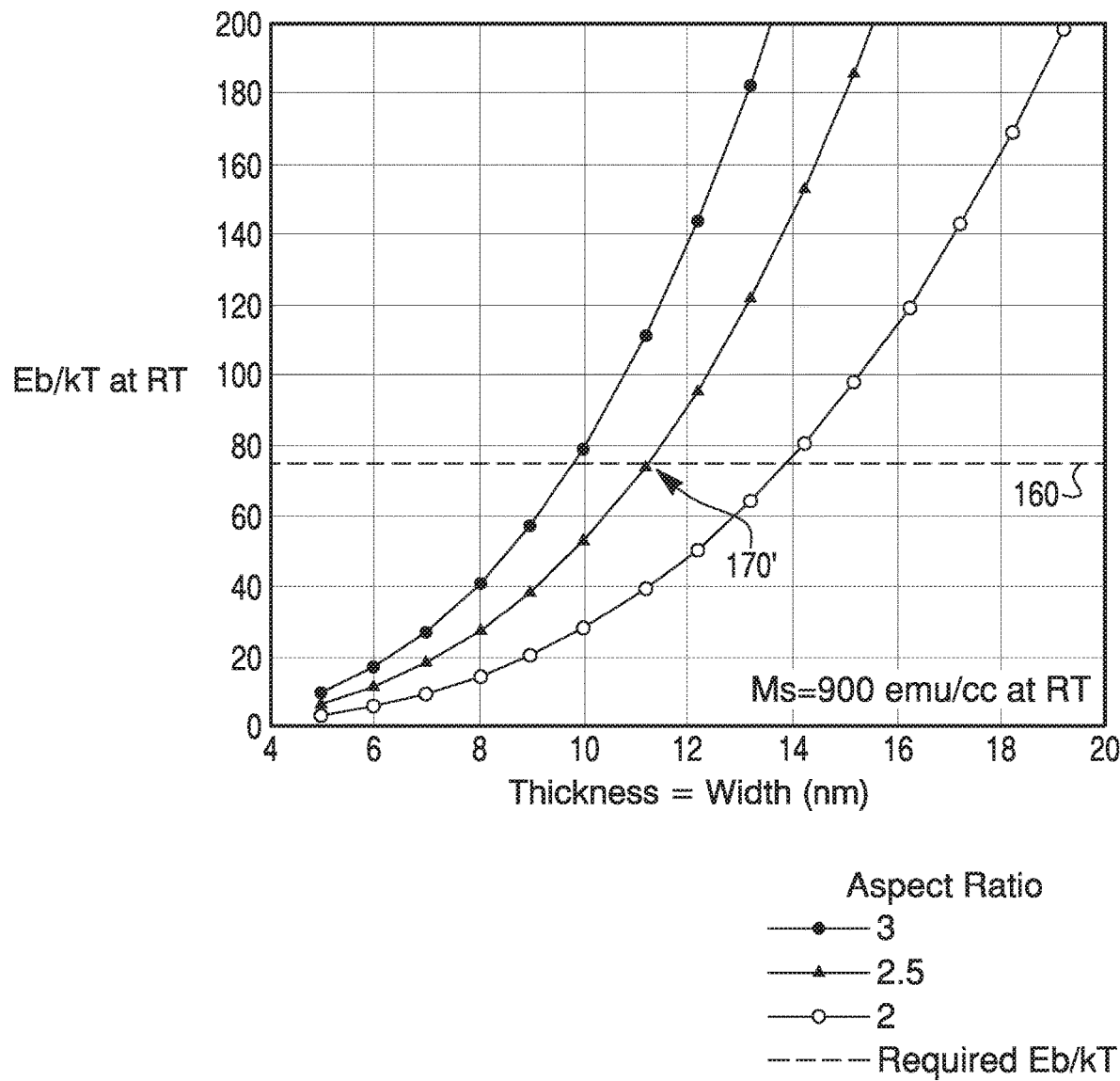

FIG. 16C shows another graph illustrating the relationship between a dimension of a free region of the present disclosure and a thermal stability parameter of an MTJ bit of the present disclosure.

Figure 16D:
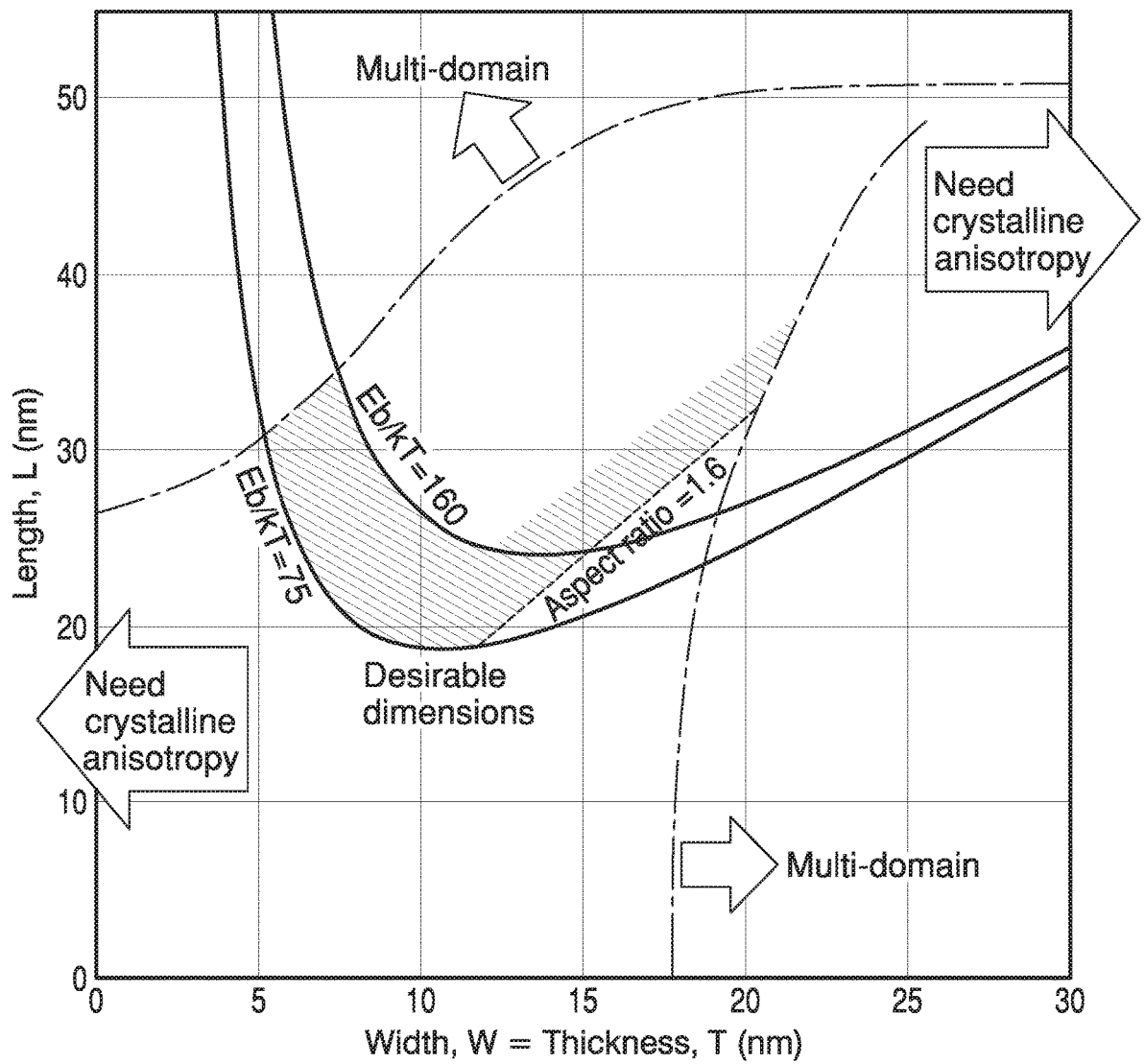

FIG. 16D shows a graph illustrating a range of desirable dimensions of a free region, with high thermal stability parameter of an MTJ bit of the present disclosure.

Figure 17A:
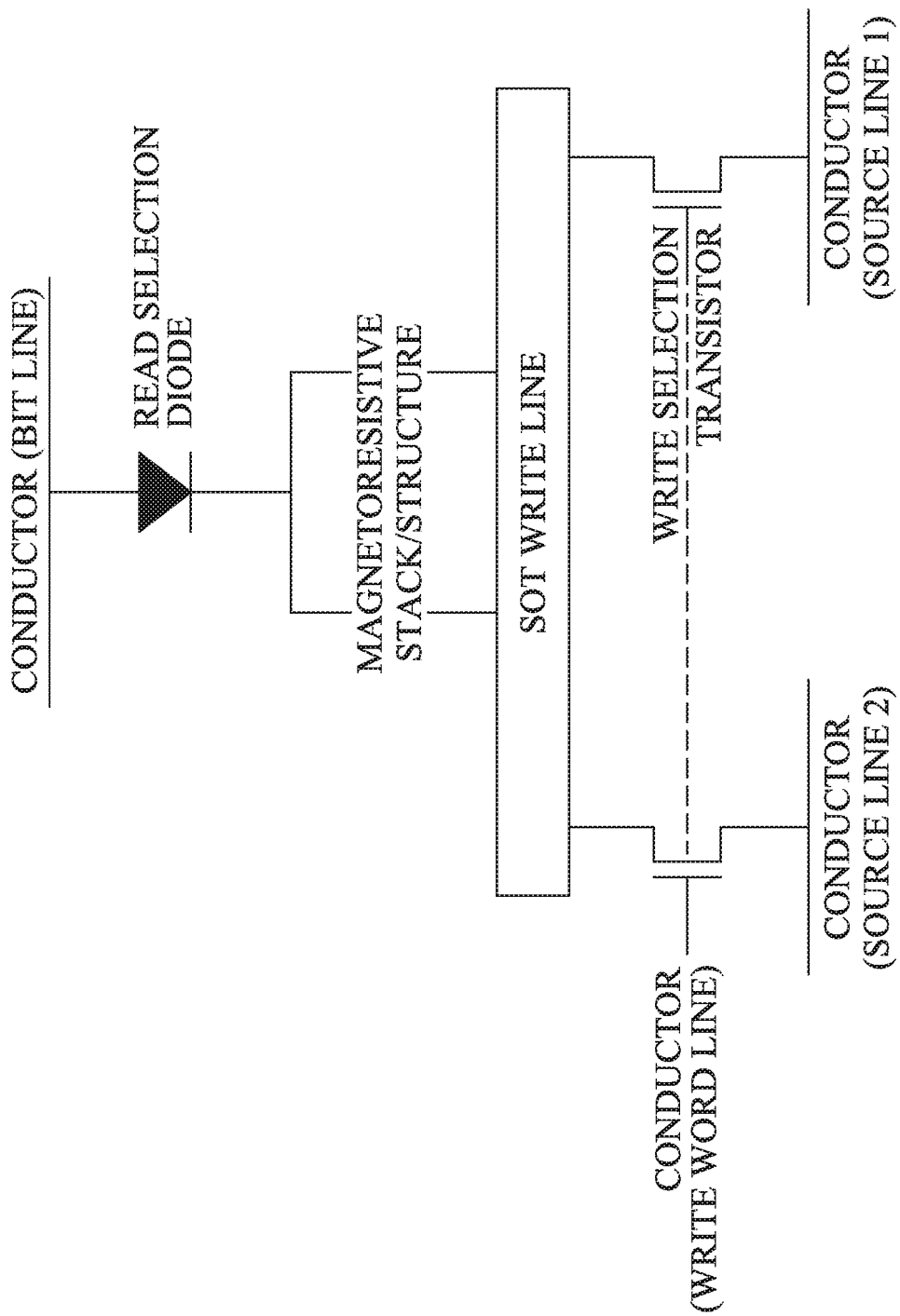

FIG. 17A is a schematic diagram of an exemplary magnetoresistive memory architecture comprising a read selection diode.

Figure 17B:
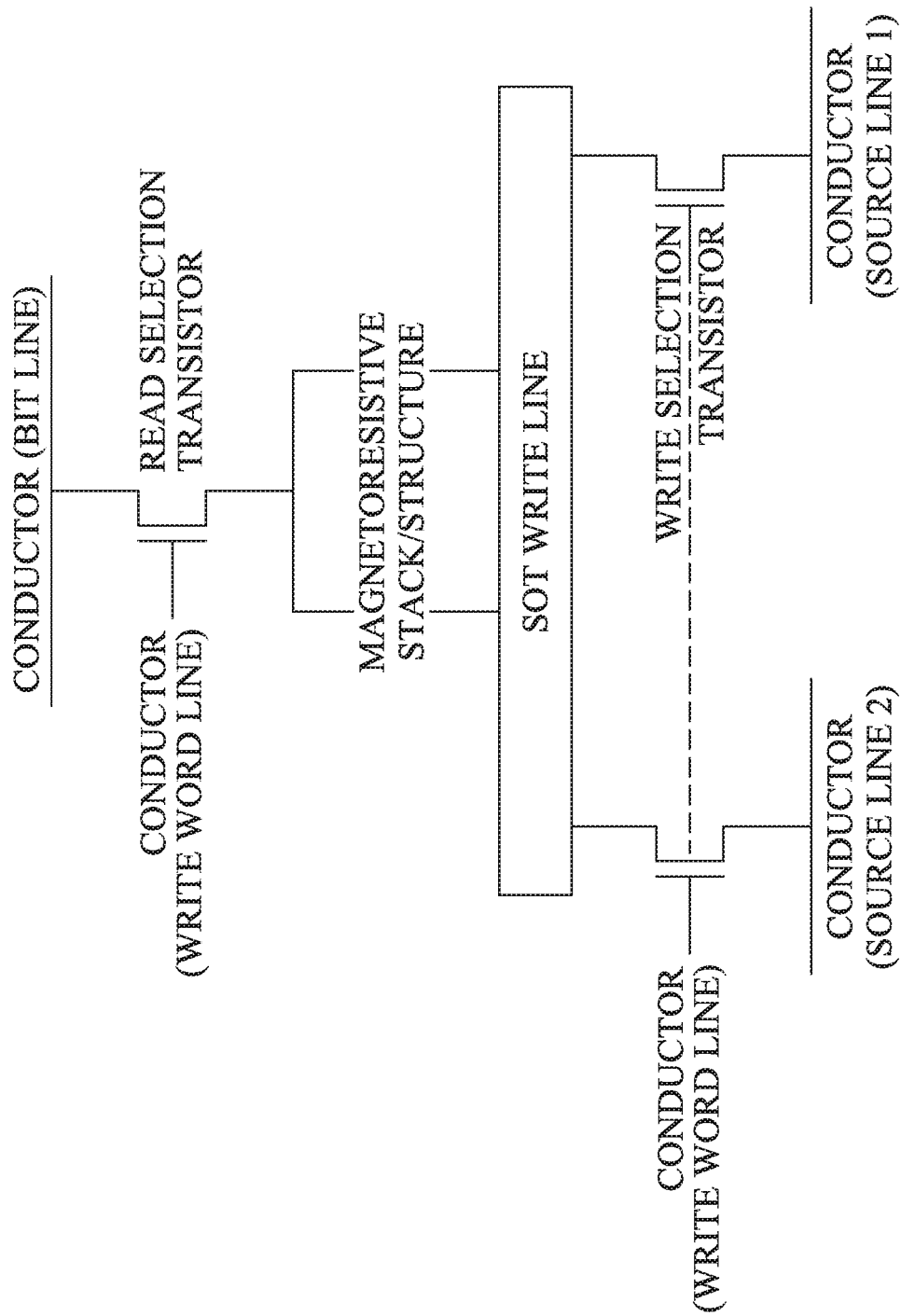

FIG. 17B is another schematic diagram of an exemplary magnetoresistive memory architecture comprising a read selection transistor.

Figure 18A:
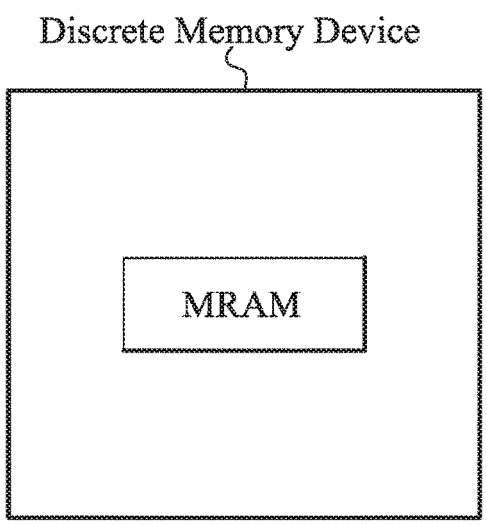

FIG. 18A is a schematic block diagram illustrating an exemplary discrete memory device that includes an exemplary magnetoresistive device of the current disclosure.

Figure 18B:
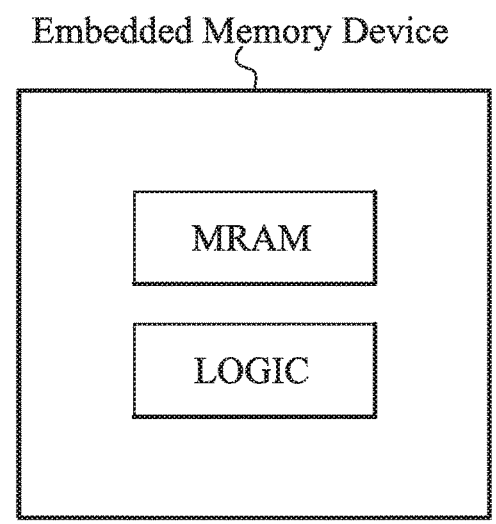

FIG. 18B is a schematic block diagram illustrating an exemplary embedded memory device that includes an exemplary magnetoresistive device of the current disclosure.

Figure 19A:
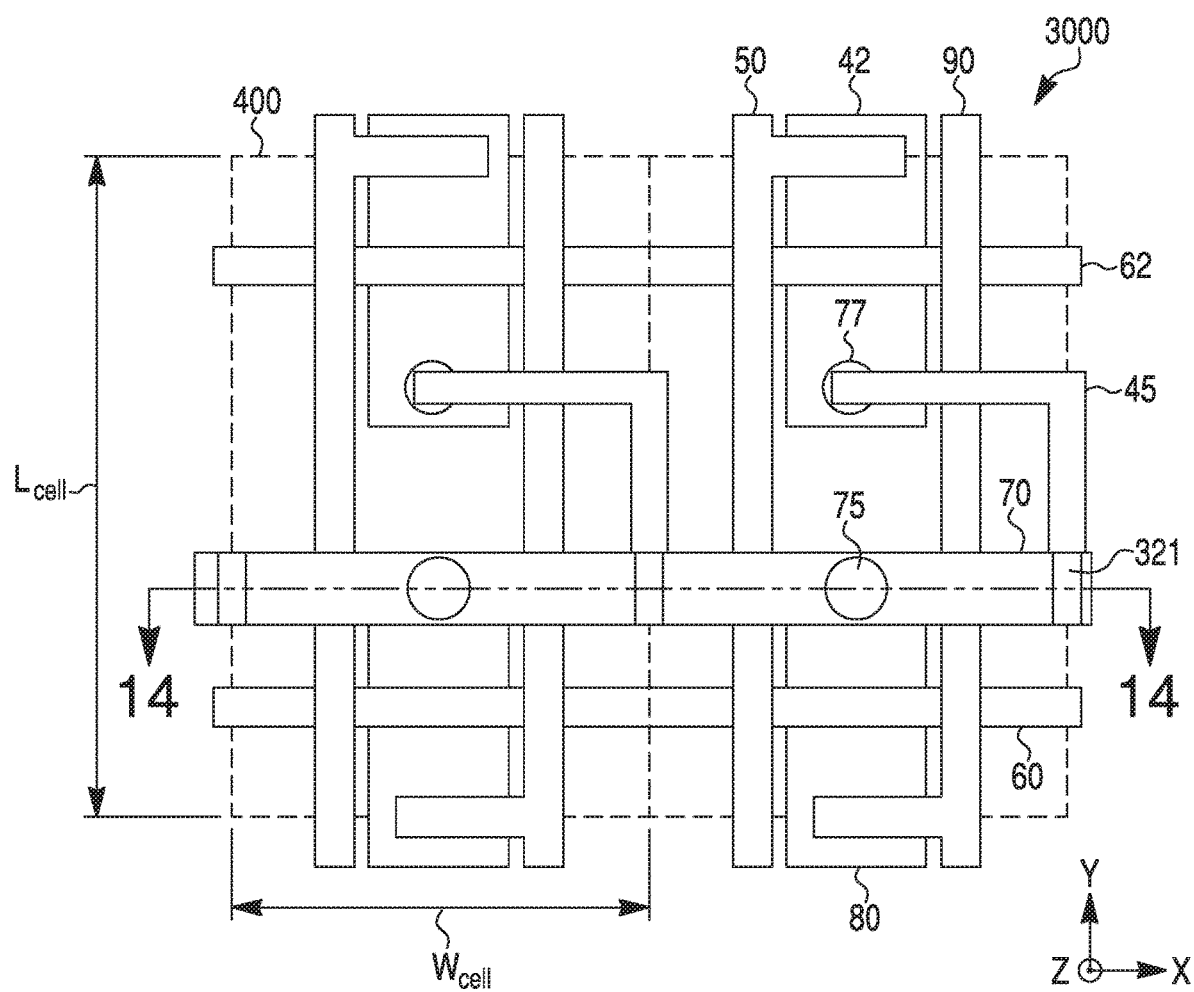

FIG. 19A illustrates a plan view of a portion of a magnetoresistive device including an exemplary magnetoresistive stack of the present disclosure.

Figure 19B:
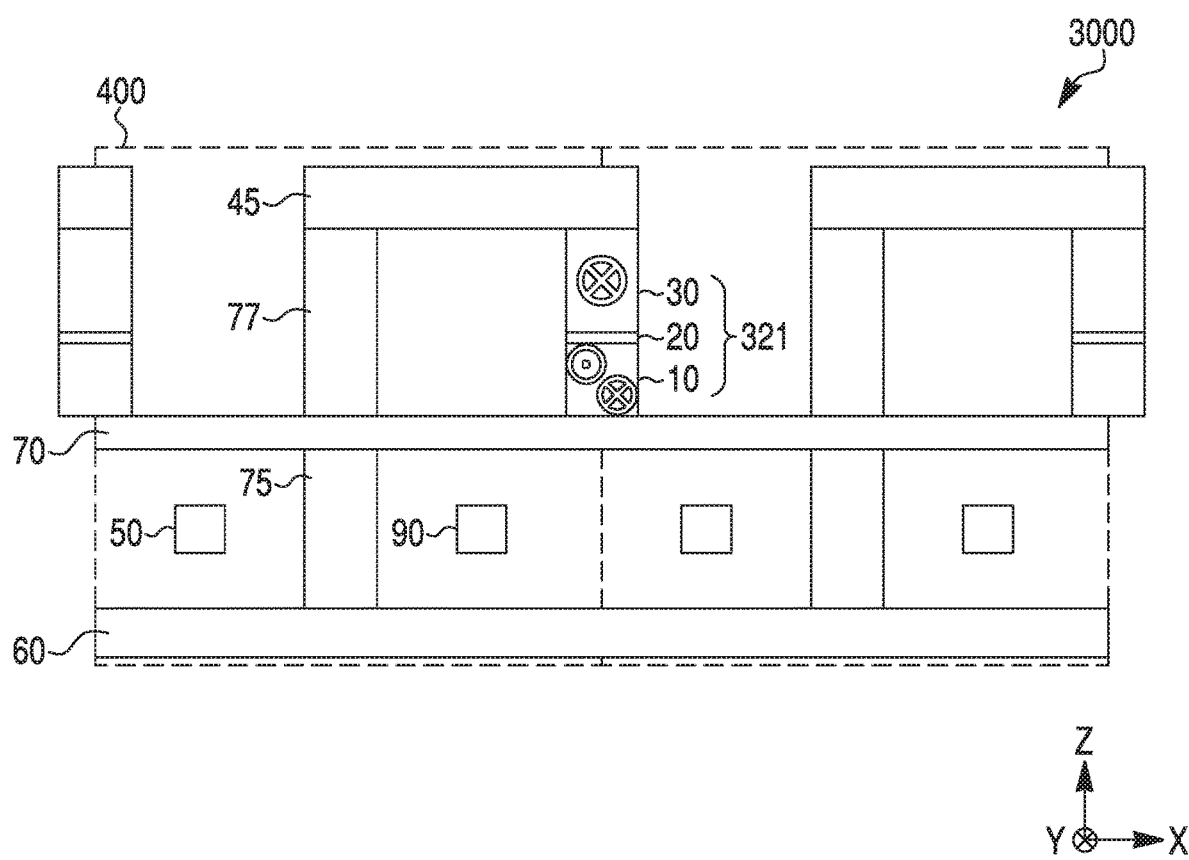

FIG. 19B illustrates a cross-sectional view of a portion of a magnetoresistive device including an exemplary magnetoresistive stack of the present disclosure, along the plane 14-14 shown in FIG. 19A.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

Unless defined otherwise, all terms of art, notations and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated herein by reference. None of the references described or referenced herein is admitted to be prior art to the current disclosure.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," "left," "right," etc. are used with reference to the orientation of the structure(s) illustrated in the figures being described. Moreover, the terms "a" and "an" herein do not denote a limitation of quantity, but rather denote the presence of at least one of the referenced item.

In this disclosure, the term "region" is used generally to refer to one or more layers of material. That is, a region (as used herein) may include a single layer (or film or coating) of material or multiple layers or coatings (or films) of materials stacked one on top of another to form a multi-layer system/structure. Further, although in the description below, the different regions in the disclosed stack are sometimes referred to by specific names (such as, e.g., free region, fixed region, intermediate region, top electrode layer, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the free region is depicted as being "below" an intermediate region, in some aspects the entire magnetoresistive stack may be flipped such that the intermediate region is "below" the free region.

In one exemplary aspect, the magnetoresistive stack of the present disclosure may be implemented as an SOT MRAM element ("memory element"). In such aspects, the magnetoresistive stack may include an intermediate region positioned (or sandwiched) between two ferromagnetic regions to form an MTJ device (or an MTJ-type device). In MTJ devices, the intermediate region may be a tunnel barrier and may include an insulating material, such as, e.g., a dielectric material. The intermediate layers may include now-known or future-developed electrically insulating materials (including, e.g., oxides, nitrides, carbonitrides, etc.). However, as previously explained, although not expressly described herein, in other embodiments the intermediate region may be a conductive material, e.g., copper, gold, or alloys thereof. In such other embodiments, the magnetoresistive stack includes a conductive material positioned between two ferromagnetic regions to form a giant magnetoresistance (GMR), or GMR-type, device.

Of the two ferromagnetic regions disposed on either side of the intermediate region, one ferromagnetic region may be a magnetically "fixed" (or "pinned") region, and the other ferromagnetic region may be a magnetically "free" region. The term "free" is intended to refer to ferromagnetic regions having a magnetization vector that may change or move significantly in response to applied magnetic fields or spin-polarized currents used to switch the magnetization vector. On the other hand, the words "fixed" and "pinned" are used to refer to ferromagnetic regions having a magnetization vector that does not move substantially in response to such applied magnetic fields or spin-polarized currents.

The direction of the magnetization vectors (i.e., magnetization direction) of the free region may be switched and/or programmed (for example, through spin-transfer-torque (STT), spin-orbit-torque (SOT), or a magnetic field generated by electrical current passing through a nearby conductor) by application of a write signal (e.g., one or more current pulses) to the magnetoresistive memory stack. As is known in the art, an electrical resistance of the described magnetoresistive stack may change based on whether the magnetization direction (e.g., the direction of the magnetic moment) of the free region adjacent to the non-magnetic layer is in a parallel alignment (P) or in an antiparallel alignment (AP) with the magnetization direction (e.g., the direction of the magnetic moment) of the fixed region adjacent to the non-magnetic layer. Typically, if the two regions have the same magnetization alignment (i.e., in the P magnetic state), the resulting relatively low(er) resistance ($R_L$) is considered as a digital "0," while if the alignment is antiparallel (i.e., in the AP magnetic state) the resulting relatively high(er) resistance ($R_H$) is considered to be a digital "1." A memory device (such as an MRAM) may include multiple such magnetoresistive stacks, which may be referred to as memory cells or elements, arranged in an array of columns and rows. By measuring the current through each cell, the resistance of each cell, and thus the data stored in the memory array can be "read."

Magnetoresistance ratio (MR) is the ratio of the change in resistance of a magnetoresistive stack between its high and low resistance states (MR=$(R_H-R_L)/R_L$, where $R_L$ and $R_H$ are the resistance of the magnetoresistive stack in the low and high resistance states, respectively. MR is indicative of the strength of the signal when a memory element is "read." For an MTJ-type magnetoresistive stack with a strong read signal, a larger MR (e.g., a larger difference between the individual resistances $R_H$ and $R_L$) is desirable. When the intermediate layer of magnetoresistive stack is a tunnel barrier made of a dielectric material, the resistance may be measured by the resistance-area product (RA).

In a magnetoresistive device utilizing SOT switching mechanics, switching the magnetization of the free region of a magnetoresistive stack may be accomplished by driving a current pulse through a spin Hall (SH) material proximate (e.g., in contact with or near) the free region. The polarity of the current pulse and the characteristics (e.g., positive or negative spin Hall angle) of the SH material determine the direction in which the magnetic moment of the free region is disposed. SH material may have a positive spin Hall angle or a negative spin Hall angle. SH materials with positive spin Hall angle may be referred to herein as positive SH materials, while SH materials with negative spin Hall angle may be referred to herein as negative SH materials. The terms "positive" and "negative" as used in this context are relative terms only, where the term "positive" indicates the material causes, e.g., a clockwise spin magnetization direction at the surface of the SH material relative to the direction of the current pulse passing through the SH material, and the term "negative" indicates the material causes, e.g., a counter-clockwise spin magnetization direction at the surface of the SH material relative to the direction of the current pulse through the SH material. In both positive and negative SH materials, spin current direction is perpendicular to the current pulse passing through the SH material. Examples of SH materials include, but are not limited to, platinum (Pt), tungsten (W), beta-tungsten (β-W), tantalum (Ta), palladium (Pd), hafnium (Hf), gold (Au), alloys including gold (e.g., AuPt, AuCu, AuW), alloys including bismuth (Bi) and selenium (Se) (e.g., $Bi_2Se_3$ or $(BiSe)_2Te_3$), alloys including bismuth (Bi) and antimony (Sb) (e.g., $Bi_xSb_{1-x}$), alloys including platinum (Pt) and one or more of hafnium (Hf), aluminum (Al), or iron (Fe) (e.g., PtHf alloys, PtAl alloys, PtFe alloys), alloys including copper (Cu) and one or more of platinum (Pt), bismuth (Bi), iridium (Ir), or lead (Pb) (e.g., CuPt alloys, CuBi alloys, CuIr alloys, CuPb alloys), alloys including silver (Ag) and bismuth (Bi) (e.g., AgBi alloys), alloys including manganese (Mn) and one or more of platinum (Pt), iridium (Ir), palladium (Pd), iron (Fe) (e.g., PtMn alloys, IrMn alloys, PdMn alloys, FeMn alloys), Ta—Nb—Hf—Zr—Ti alloy, or combinations thereof. In one or more embodiments, platinum (Pt), palladium (Pd), gold (Au), alloys including bismuth (Bi) and selenium (Se), alloys including bismuth (Bi) and antimony (Sb), CuIr alloys, and CuPt alloys may act as a positive SH material, while beta-tungsten (β-W), tantalum (Ta), hafnium (Hf), CuBi alloys, CuPb alloys, Ta—Nb—Hf—Zr—Ti alloy, and alloys including silver (Ag) and bismuth (Bi) alloys may act as a negative SH material. In some embodiments, an SH material may act as either a positive SH material or a negative SH material depending on the mode and manner of deposition.

The mean current required to be passed through a free region in STT switching or through a SH material in SOT switching in order to change its magnetic state may be referred to as the critical current (Ic). The critical current is indicative of the current required to "write" data in a magnetoresistive memory cell. Typically, to write data, a write current ($I_W$) having a magnitude greater than (or equal to) Ic is directed to the MTJ bit to change the MTJ bit from P to AP (or AP to P based on the polarity of the current). Reducing the critical current is desirable so that, among other things, a smaller access transistor can be used for each memory cell and that a higher density, lower cost memory can be produced. A reduced critical current may also lead to greater longevity and/or durability of a magnetoresistive memory cell.

Embodiments described herein may utilize what may be referred to as spin-orbit torque to switch or aid in switching the magnetic state of the free region in an MTJ or MTJ-like device, where such an MTJ device is often included in a memory cell in a magnetic memory. A charge current through a conductor, e.g., an SH material, referred to as a write line, adjacent to (and/or in contact with) the free region results in a spin torque acting on the free region due to the injection of a spin current into the free region from the spin-dependent scattering of electrons or spin-orbit interaction in the conductor, e.g., an SH material. This may be referred to as a spin Hall effect. The spin current is injected into the free region in a direction perpendicular to the boundary (or interface) where the free region and the SH material meet, and orthogonal to the direction of the charge current flow. The spin torque applied to the free region by the spin current impacts the magnetic state of the free region in a manner similar to spin-polarized tunneling current that flows through the MTJ in traditional spin-torque or STT magnetic tunnel junctions. There is an additional mechanism which may give rise to spin-orbit torque. If a charge current flows parallel to an interface between the free region and the SH material, the flowing electrons become spin polarized at the interface due to spin-orbit coupling. The polarized electrons exert a torque on the magnetization of the free region. This may be referred as a Rashba-Edelstein effect or an inverse spin galvanic effect. As the function of STT magnetic tunnel junctions is well known in the art, it will not be further described here.

As with write currents in conventional STT MTJ devices, in devices using SOT switching mechanisms, the direction of torque applied by the spin current is dependent on the direction of the current flow in the write line. In other words, the direction of current flow through the conductor adjacent to the free region determines the direction of torque that is applied to the free region. Accordingly, a free region of the present disclosure may be able to be switched between two stable states based on torque applied by current flowing though the neighboring write line in one direction or the other. In some embodiments, the free region may be able to be switched between two stable magnetic states based on the torque applied by a current flowing in either direction through the adjacent conductor. The magnetic state of the free region may also be switched by the torque resulting from both an STT current by applying an electrical current through MTJ bit and a spin current injected from one or more SH materials by applying an electrical current through one or more SH materials.

In some embodiments, the torque applied by the spin current (i.e., SOT current) alone is used to switch the free region into a particular magnetic state, whereas in other embodiments, the spin current works as an "assist" to reduce the magnitude of an STT write current required to switch the magnetic state of the free region, where the STT write current travels through the entirety of the MTJ stack to produce a spin polarized tunneling current between the free region and fixed region. Reading of data stored by the MTJ stack is accomplished as in a conventional STT MTJ device. For example, a read current, having a magnitude less than that of the STT critical current of the MTJ stack, is applied to the MTJ stack to sense the resistance of the MTJ stack. As a person of ordinary skill in the art would recognize, there are many techniques that may be used to detect or sense the resistance of the MTJ stack. In some embodiments, the resistance sensed based on the read current can be compared with a reference resistance to determine the state of the free region. In some embodiments, a self-referenced read operation is performed where the resistance through the MTJ is sensed, then the MTJ is written (or reset) so that the free region is in a known state, then the resistance is sensed again and compared with the resistance originally sensed. The original state of the free region can then be determined based on whether the resistance has changed based on the write or reset operation. In still other embodiments, a mid-point reference read operation may be performed.

For the sake of brevity, conventional techniques related to semiconductor processing may not be described in detail herein. The exemplary embodiments may be fabricated using known lithographic processes. The fabrication of integrated circuits, microelectronic devices, micro-electromechanical devices, microfluidic devices, and photonic devices involves the creation of several layers or regions (e.g., comprising one or more layers) of materials that interact in some fashion. One or more of these regions may be patterned so that various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of the developer. An etch may then be employed/applied whereby the layer (or material) not protected by the remaining resist is patterned. Alternatively, an additive process can be used in which a structure is built up using the photoresist as a template.

In one aspect, the disclosed embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (which may be referred to collectively herein as "depositing") regions which after further processing (e.g., etching) form a magnetoresistive stack.

In some embodiments, the disclosed magnetoresistive stacks may be formed between a top electrode/via/line and a bottom electrode/via/line, both of which may permit access to the stack by allowing for connectivity (e.g., electrical) to circuitry and other elements of the magnetoresistive device. Between the electrodes/vias/lines are multiple regions, including at least one fixed region, at least one free region, and one or more intermediate regions that form a tunnel barrier between the fixed region and the free region. In some embodiments, the one or more intermediate regions may be made of dielectric materials. Each of the fixed region and the free region may include, among other things, a plurality of ferromagnetic layers. In some embodiments, the fixed region (e.g., fixed region 30 discussed below) may include a synthetic antiferromagnetic (SAF) structure. In some embodiments, a top electrode (and/or) bottom electrode may be eliminated and a bit line may be formed on top of the stack. Additionally, each stack may be disposed adjacent to an SOT write line. The SOT write line carries the switching current that imparts a spin-orbit torque to the free region during write and reset operations. In at least one embodiment, the electrodes/vias/lines of the magnetoresistive stacks may comprise an SOT write line. In other embodiments, a magnetoresistive stack is formed between a top electrode/via/line and a bottom electrode/via/line and further is adjacent to an SOT write line, which may be independently connected to a current source. In such embodiments, the magnetoresistive device may be referred to as a "three-terminal" magnetoresistive device.

With reference now to FIG. 1, there is depicted a cross-sectional view of an exemplary magnetoresistive stack 100 of the current disclosure. Magnetoresistive stack 100 may include, for example, an in-plane or out-of-plane magnetic anisotropy magnetoresistive stack (e.g., a perpendicular magnetic anisotropy magnetoresistive stack). Magnetoresistive stack 100 may include multiple regions (or layers) arranged one over the other to form a stack of regions (including an MTJ bit 321 comprising a free region 10, an intermediate region 20, and a fixed region 30) above or otherwise adjacent to an SOT write line 70. As would be recognized by a person of ordinary skill in the art, several other commonly-used regions or layers of magnetoresistive stack 100 (e.g., various protective cap layers, seed layers, underlying substrate, electrically conductive interconnects, etc.) have not been illustrated in FIG. 1. Although not illustrated in FIG. 1, in some embodiments, the magnetoresistive stack 100 may be formed on a planar surface of a semiconductor substrate (e.g., surface of a semiconductor substrate having electrical circuit elements (e.g., CMOS circuits, such as transistors, diodes, etc.) formed thereon or therein) and may be connected to signal lines (e.g., bit line, source line, word line, etc.) directly or via any suitable electrical connection, including but not limited to, electrodes, vias, etc. The different regions of the magnetoresistive stack 100 will be described below.

In some embodiments, as shown in at least FIG. 1, the free region 10 may be deposited on (e.g., directly on) or otherwise adjacent to the SOT write line 70. For instance, in some embodiments, one or more layers or regions of materials (e.g., interfacial regions, etc.) may be provided between the SOT write line 70 and the free region 10. In some embodiments, the magnetoresistive stack 100 may include one or more magnetic interfacial layers (e.g., at the interface between SOT write line 70 and free region 10). During fabrication, the magnetic interfacial layer may assist in the formation of overlying regions (e.g., regions of the free region 10) on the SOT write line 70 and may promote or enhance the magnetic properties of the free region. The promoting or enhancing effect of a magnetic interfacial layer may improve SOT switching characteristics, such as, for example, an improved SOT switching efficiency. The magnetic interfacial layer(s) may include one or more of nickel (Ni), cobalt (Co), iron (Fe), and alloys thereof (for example, an alloy including cobalt (Co) and iron (Fe)).

Use of the SOT write line 70 in, for example, SOT magnetoresistive devices (e.g., SOT MRAM) may improve cycling endurance of the magnetoresistive devices. Further, because an SOT write line 70 may be in contact with, or positioned proximate to, multiple free regions 10 of a magnetoresistive device (as will be described in greater detail in the following sections), the magnetization direction of multiple free regions 10 may be switched in one direction or the other by driving a switching current (e.g., a write current) 95 through the SOT write line 70 during, for example, a reset/set operation.

It should be noted that the construction/configuration of the free region 10 illustrated in at least FIG. 1 and described below is only exemplary, and many other constructions/configurations are possible. Notwithstanding the specific construction/configuration of the free region 10, as explained previously, a magnetization vector in free region 10 may be moved or switched by applied magnetic fields or electrical currents. In some embodiments, the construction/configuration of the free region 10 may be adjusted or manipulated to achieve desirable free region characteristics, such as, e.g., adequate energy barrier, high switching efficiency, etc. For example, in one embodiment, the size of the free region 10 may be adjusted to achieve a single domain, coherent magnetization reversal. Additionally, one or more additional materials may be formed on one or more surfaces of the free region 10 to achieve a uniform magnetization direction. These contemplated embodiments will be discussed in greater detail in the following sections.

FIG. 2A illustrates a perspective view of a portion of an exemplary magnetoresistive stack of the present disclosure. FIG. 2B illustrates a plan view of the portion of the exemplary magnetoresistive stack shown in FIG. 2A. In particular, FIGS. 2A-2B illustrate a free region 10 that is substantially rectangular parallelepiped-shaped, and encapsulation layers 15 formed on opposing ends of the free region 10. The easy axis of magnetization of the free region 10 is in the horizontal direction in FIGS. 2A-2B. The size of the free region 10 may be relatively small. In one embodiment, the length (L) of the free region 10 may be approximately 15-30 nm (nanometer), and the thickness (T) of the free region 10 may be approximately 6-16 nm. The width (W) of the free region 10 may be approximately the same as the thickness (T) of the free region 10, at approximately 6-16 nm. The relatively smaller size of the free region 10 may aid in achieving a single domain, coherent magnetization reversal of the free region 10. In some embodiments, the free region 10 may be made of material having a large exchange stiffness constant $A_{ex}$ (e.g., an alloy composed of more than approximately 90% Iron (Fe) or Cobalt (Co)), to further promote the single domain magnetization reversal. Further, the relatively thicker construction of the free region 10 (i.e., T W) may eliminate or minimize the demagnetization field effect in relation to the critical current for the MTJ bit including the free region 10. Typically, a critical current (i.e., a switching current by spin-orbit-torque) of an MTJ bit may be calculated by the following equation:

$$I_{c0}^{SOT} = \alpha \frac{2e}{\hbar} \frac{M_s t_F}{\theta_{SH}^{eff}} \left( H_k + \frac{H_d}{2} \right) A_H$$

where

α represents Gilbert damping constant of the free layer, e represents elementary charge, h represents reduced Planck constant, $M_s$ represents saturation magnetization of the free layer, $t_F$ represents thickness of the free layer, $\theta_{SH}^{eff}$ represents effective spin Hall angle in the magnetoresistive device, $H_k$ represents magnetic anisotropy field of the free layer, $H_d$ represents demagnetizing field in the free layer along its thickness direction, and $A_H$ represents cross-sectional area of SOT write line made of heavy metal.

By adjusting the free region 10 to be relatively thicker as discussed above, the demagnetization field effect, expressed by $$\frac{H_d}{2}$$

in the above equation, may be removed. In addition to the adjustment of the thickness (T), the adjustment of the interface between the SOT write line 70 and the free region 10 and the adjustment of the interface between the free region 10 and the intermediate region 20 may also decrease the demagnetization field effect. The adjustment may produce an interfacial perpendicular magnetic anisotropy (iPMA) having a proper strength at the interface (i.e., an interfacial magnetic anisotropy that is perpendicular to the interface). For example, the interface between an SOT write line 70 made of platinum (Pt) and a free region 10 made of cobalt (Co) may have the interfacial perpendicular magnetic anisotropy, and the interface between a free region 10 made of iron (Fe) and an intermediate region 20 made of magnesium oxide (MgO) may have the interfacial perpendicular magnetic anisotropy. The interfacial perpendicular magnetic anisotropy may decrease the demagnetization field effect. The interfacial perpendicular magnetic anisotropy should not be too large, in order to maintain the easy axis in the horizontal direction. If the interfacial perpendicular magnetic anisotropy is utilized, the thickness (T) of the free region 10 may not necessarily be the same as the width (W) of the free region 10, and may be slightly smaller than the width (W) in order to remove the demagnetization field effect. The resultant expression for the critical current (i.e., switching current by spin-orbit-torque) may be as follows:

$$I_{c0}^{SOT} = \alpha \frac{2e}{\hbar} \frac{M_s t_F}{\theta_{SH}^{\text{eff}}} (H_k + \tfrac{\text{y}}{\text{x}}) A_H = \alpha \frac{2e}{\hbar} \frac{M_s t_F}{\theta_{SH}^{\text{eff}}} H_k A_H$$

Accordingly, the elimination of the demagnetization field effect may substantially decrease the critical current needed to switch the free region 10, which in turn may lead to a better switching efficiency.

With continuing reference to FIG. 2A, encapsulation layers 15 may be formed on opposing ends of the free region 10. In particular, the encapsulation layers 15 may be formed on the "shorter," or "smaller" ends of the free region 10. As discussed above, the width (W) of the free region 10 may be shorter than the length (L) of the free region 10. The encapsulation layers 15 may be formed on the sides of the free region 10 that correspond to the width (W) of the free region 10. Each encapsulation layer 15 may cover substantially the entire adjoining surface of the free region 10 (i.e., the surface of the free region 10 that adjoins with the encapsulation layer 15). As will be further discussed below, in some embodiments, each encapsulation layer 15 may extend vertically beyond the adjoining surface of the free region 10 and may also cover a portion or substantially the entire adjoining surface of an intermediate region 20 (e.g., as illustrated in FIG. 4). Further, the encapsulation layer 15 may extend vertically beyond the adjoining surface of the intermediate region 20 and cover a portion or substantially the entire adjoining surface of a fixed region 30 (e.g., as illustrated in FIG. 5C). Furthermore, the encapsulation layer 15 may extend vertically beyond the adjoining surface of the fixed region 30 and cover other regions or layers of the magnetoresistive stack (e.g., as illustrated in FIG. 5C, FIG. 6C, etc.).

As shown in FIG. 2B, each encapsulation layer 15 may extend across substantially the entire width of the adjoining surface of the free region 10. The formation of the encapsulation layers 15 on the opposing ends of the free region 10 may induce interfacial perpendicular magnetic anisotropy, and may promote a uniform magnetization direction in the free region 10 by preventing magnetization from curling or pointing to the edges of the free region 10. As indicated by the arrows in FIGS. 2A-2B, the magnetic moment in the free region 10 disposed between the encapsulation layers 15 may be oriented uniformly in one direction, from one end of the free region 10 toward the other end of the free region 10 (i.e., from one encapsulation layer 15 toward the other encapsulation layer 15). In one embodiment, the encapsulation layers 15 may be made of dielectric material such as, e.g., magnesium oxide (MgO). It should be noted however that the material for the encapsulation layers 15 is not limited to the dielectric material specifically discussed herein, and may also include any dielectric material, for example, $MgO_xN_y$, $AlO_x$, capable of attaining the desirable characteristics (e.g., perpendicular interface anisotropy, uniform magnetization direction).

FIG. 3 illustrates an alternative embodiment to the portion of the exemplary magnetoresistive stack shown in FIGS. 2A-2B. In particular, FIG. 3 illustrates an oval-shaped free region 10 and encapsulation layers 15, when viewed from the top of the regions 10 and 15. Notably, the shorter ends of the free region 10 and the adjoining encapsulation layers 15 may have a rounded or an oval-shaped curvature, compared to the rectangular shaped regions 10 and 15 in FIGS. 2A-2B. The length, width, and thickness of the free region 10 of the magnetoresistive stack illustrated in FIG. 3 may otherwise be the same or approximately the same as those of the free region 10 illustrated in FIGS. 2A-2B. Constructing the free region 10 to have the oval-shaped ends and forming the like-shaped encapsulation layers 15 over the ends of the free region 10 may further promote the single domain, coherent magnetization reversal within the free region 10 since it removes the sharp edges of the free region 10.

FIG. 4 illustrates a perspective view of a portion of an exemplary magnetoresistive stack of the present disclosure. In particular, FIG. 4 illustrates the free region 10 of FIG. 2A, an intermediate region 20 formed above the free region 10, and encapsulation layers 15 formed over the opposing ends (i.e., shorter ends) of the free region 10 and the intermediate region 20. As alluded to above, each encapsulation layer 15 may extend vertically beyond the adjoining surface of the free region 10 and may also cover substantially the entire adjoining surface of the intermediate region 20, as shown in FIG. 4. The intermediate layer 20 may be a tunnel barrier made of dielectric material, such as, e.g., magnesium oxide (MgO), which may be the same dielectric material as that of the encapsulation layers 15. However, as discussed above, the intermediate region 20 may be made of any suitable dielectric material that is now known or future developed. Nonetheless, in order to provide an additional benefit discussed below, the same material (e.g., magnesium oxide (MgO)) may be used for the intermediate region 20 and the encapsulation layers 15.

Typically, the material forming the intermediate region 20 may be different from the material forming the regions surrounding the magnetoresistive stack that includes the intermediate region 20. For example, an intermediate region 20 may be formed of magnesium oxide (MgO), whereas the regions surrounding the magnetoresistive stack (i.e., encapsulant) may be formed of Silicon Nitride (SiN) or Silicon Oxide (SiO$_2$). As a result, large encroachment effects may occur at the interface between the intermediate region 20 and regions surrounding the magnetoresistive stack. More particularly, a large encroachment may occur at the edges of the opposing ends of the intermediate region 20 that interface with the surrounding regions. The edges of the intermediate region 20 usually have high resistance. An oxidant, such as oxygen or water, may penetrate through the encapsulant into the intermediate region 20 and may over-oxidize the interface materials between the intermediate region 20 and the free region 10 and between the intermediate region 20 and the fixed region 30 at the edge. This is called an encroachment effect. A large encroachment effect may cause higher MTJ resistance (Rmtj) than expected from the dimensions, and lower magnetoresistance ratio (MR) than expected from the blanket film properties. The exemplary stack configuration shown in FIG. 4 may alleviate or mitigate this encroachment problem. As shown in FIG. 4, the opposing ends of the intermediate region 20 may also be covered by the encapsulation layers 15, which are made of the same material (i.e., MgO) as the intermediate region 20. As a result, the encroachment occurring at the edges of the intermediate region 20 may be substantially reduced and the magnetoresistance ratio (MR) of the magnetoresistive stack may be improved accordingly. The small triangular marks shown in FIG. 4 indicate the reduced encroachment at the edges of the intermediate region 20.

FIG. 5A illustrates a plan view of a portion of a memory cell including an exemplary magnetoresistive stack of the present disclosure. FIG. 5B illustrates a cross-sectional view of a portion of a memory cell including an exemplary magnetoresistive stack of the present disclosure, along the plane 1-1 shown in FIG. 5A. FIG. 5C illustrates another cross-sectional view of a portion of a memory cell including an exemplary magnetoresistive stack of the present disclosure, along the plane 2-2 shown in FIG. 5A. In the discussion below, reference will be made to FIGS. 5A-5C.

As shown in FIG. 5A, in each memory cell 200, an SOT write line 70 may be formed at the bottom of a magnetoresistive stack including an MTJ bit 321 (MTJ 321). The SOT write line 70 may be made of spin Hall (SH) material discussed above. MTJ 321 may be formed on or above the SOT write line 70. As discussed above in reference to FIG. 1, the SOT write line 70 may be in contact with or positioned proximate to a plurality of MTJ's 321 in a memory array, so that a switching current 95 (i.e., a write current) driven through the SOT write line 70 may impart a spin torque to the proximately-positioned free regions 10 of the plurality of MTJ's 321. In one embodiment, as shown in FIG. 5B, a bit line 50 made of electrically conductive material may be formed above the MTJ 321 to provide a read current through the MTJ 321. In some embodiments, a suitable conductive line (i.e., top electrode 45) made of electrically conductive material, such as, e.g., an electrode, an interconnect, etc. may be formed between the bit line 50 and the MTJ 321, to provide an electrical connection to the MTJ 321 as shown in FIG. 5B. The bit line 50 and the top electrode 45 are not shown in the plan view illustrated in FIG. 5A, so as to not obscure the MTJ 321 formed on the SOT write line 70. In one embodiment, the width of the memory cell 200 ($W_{cell}$) may be approximately 50-120 nm and the length of the memory cell 200 ($L_{cell}$) may be approximately 50-120 nm. In some embodiments, the width and the length of the memory cell 200 may be approximately the same. However, in other embodiments, the width and the length of the memory cell 200 may not be the same. In one embodiment, the width of the SOT write line 70 ($W_{sot}$) may be approximately 35 nm and the thickness of the SOT write line 70 ($T_{sot}$) may be approximately 5 nm. As discussed above in reference to FIGS. 2A-2B, the width of the MTJ 321 (or of the free region 10 of the MTJ 321) (W) may be approximately 10 nm and the length of the MTJ 321 (or of the free region 10 of the MTJ 321) (L) may be approximately 25 nm, to provide a single domain, coherent magnetization reversal in the free region 10. Notably, in the exemplary embodiment illustrated in FIGS. 5A-5C, the length of the MTJ 321 (or of the free region 10 of the MTJ 321) (L) may be smaller than the width of the SOT write line 70 ($W_{sot}$). The spaces remaining on the sides of the MTJ 321 due to the difference between the length of the MTJ 321 (L) and the width of the SOT write line 70 ($W_{sot}$) may be at least partially occupied by encapsulation layers 15, as illustrated in FIG. 5C. Thus, the encapsulation layers 15 may not extend vertically downward beyond a top surface of the SOT write line 70, as shown in FIG. 5C for example. Because FIG. 5A is provided primarily for purposes of illustrating the position and placement of the MTJ 321 with respect to the SOT write line 70, the encapsulation layers 15 are not shown in FIG. 5A for the sake of clarity. It should be noted that the dimensions of various components of the magnetoresistive device discussed herein are merely exemplary. In other words, dimensions other than the dimensions discussed herein may be used to form the various components of the magnetoresistive device of the present disclosure.

Now with reference to FIG. 5B, each memory cell 200 may include an MTJ 321 positioned between a top electrode 45 coupled to a bit line 50 and an SOT write line 70. The MTJ 321 may be formed on or above the SOT write line 70. More particularly, the free region 10 of the MTJ 321 may be formed on or proximate to the SOT write line 70. Intermediate region 20 may be formed on or above the free region 10, and may be disposed between the fixed region 30 and the free region 10. As indicated by the symbol in the fixed region 30 (i.e., an X enclosed in a circle), the magnetization direction of the fixed region 30 is "pinned" or "fixed" in one direction (e.g., pointing into the page), which is parallel to the SOT write line plane and orthogonal to the switching current 95. It should be noted that, in these figures, the symbol of an X enclosed in a circle is used to represent a magnetization direction pointing into the page, and the symbol of a dot enclosed in a circle is used to represent a magnetization direction pointing out of the page. As indicated by the symbols in the free region 10 (i.e., an X enclosed in a circle and a dot enclosed in a circle), the magnetization direction of the free region 10 may be "switched" in one direction or the other (e.g., pointing into or out of the page), which is also parallel to the SOT write line plane and orthogonal to the switching current 95. This configuration may lead to a more deterministic and low-current switching of the free region 10 during, for example, a write or reset/set operation. In other words, the likelihood of the free region 10 fully (or substantially fully) switching due to the SOT switching current 95 provided through the SOT write line 70 may be high, and the strength of the SOT switching current 95 needed to switch the magnetization direction of the free region 10 (i.e., critical current) may be relatively low. The mathematical expression for the relatively-low critical current (i.e., switching current by spin-orbit-torque) may expressed by the equation below. Since all the parameters in this equation were explained above with reference to FIGS. 2A-2B, they are not described again.

$$I_{c0}^{SOT} = \alpha \frac{2e}{\hbar} \frac{M_s t_F}{\theta_{SH}^{eff}} H_k A_H$$

In some embodiments, the same memory cell architecture, or a memory cell architecture that is substantially similar to the memory cell architecture illustrated in FIGS. 5A-5C may be used, but with the magnetization directions of the regions 30 and 10 being parallel to the SOT write line plane as well as to the SOT switching current 95. Alternatively, the magnetization directions of the regions 30 and 10 may also be orthogonal to the SOT write line plane as well as to the SOT switching current 95. These latter configurations may lead to a non-deterministic (or less-deterministic), high-current switching of the free regions 10 (i.e., significant parts of the free region 10 failing to switch or a strong switching current being necessary to fully switch the free region 10), compared to the configuration explicitly shown in FIGS. 5B-5C. In some embodiments, the configurations likely to experience non-deterministic switching may be assisted with an external magnetic field provided by an external magnet or a conductor, so that the magnetization direction of the free region 10 may be more fully and completely switched. The mathematical expression for the relatively-high critical current (i.e., switching current by spin-orbit-torque) in the latter configurations may be as follows:

$$I_{c0}^{SOT} = \frac{2e}{\hbar} \frac{M_s t_F}{\theta_{SH}^{eff}} \left( \frac{H_k}{2} - \frac{H_x}{\sqrt{2}} \right) A_H$$

where $H_x$ represents external applied magnetic field along x-direction.

(The rest of the parameters are explained above with reference to FIGS. 2A-2B.)

Comparing the mathematical expressions for the relatively-low and relatively-high critical currents, the relatively-high critical current needed in the latter configurations may be approximately 50 times (i.e., $1/(2\alpha)$) greater than the relatively-low critical current needed in the former configuration (i.e., the configuration explicitly shown in FIGS. 5B-5C). Therefore, the switching efficiency of the former configuration may be substantially higher than that of the latter configurations, and the former configuration may be preferred over the latter configurations. Nonetheless, any of these configurations may be used in the magnetoresistive device of the present disclosure.

With renewed reference to FIG. 5B, free region 10 may be in contact with or positioned proximate to the SOT write line 70, so that the switching current 95 (i.e., a write current) driven through the SOT write line 70 may impart a spin torque to the proximately-positioned free region 10. The magnetization direction of the free region 10 may be dependent on the direction of the switching current 95. For example, in FIG. 5B, if the switching current 95 is driven toward right, the magnetization direction of the free region 10 may be pointing out of the page, indicated by the symbol comprising a dot enclosed in a circle in the free region 10. Conversely, if the switching current 95 is driven toward left, the magnetization direction of the free region 10 may be pointing into the page, indicated by the symbol comprising an X enclosed in a circle in the free region 10.

As discussed above with reference to FIGS. 2A-2B, encapsulation layers 15 may be formed on opposing ends of the free region 10. Notably, the encapsulation layers 15 may be formed such that the encapsulation layer plane may be orthogonal to the magnetization direction of the free region 10 (and also of the fixed region 30) and to the SOT write line plane, as shown in FIG. 5C. In one embodiment, the capsulation layers 15 may be formed on opposing ends of the free region 10, intermediate region 20, and fixed region 30. Each encapsulation layer 15 may be formed as a continuous layer covering substantially the entire adjoining surfaces of the regions 10, 20, and 30. Further, in some embodiments, the encapsulation layers 15 may also cover substantially the entire adjoining surfaces of other regions in the magnetoresistive stack, such as, e.g., top electrode 45. Each encapsulation layer 15 may thus be formed as a continuous layer covering substantially the entire adjoining surfaces of the regions 10, 20, 30, and the top electrode 45, as shown in FIG. 5C. For example, the encapsulation layers 15 may be formed on the shorter sides of the MTJ 321 and the top electrode 45 (i.e., the sides corresponding to width (W) of the free region 10), once the MTJ 321 and the top electrode 45 are patterned to desired dimensions by etching. As shown in FIG. 5C, the width of the SOT write line 70 may be approximately equal to or greater than the sum of the length of the free region 10 (or of the MTJ 321) and the total thickness of the encapsulation layers 15 (i.e., $W_{sot} \geq L + 2T_{enc}$). Further, the width of the SOT write line 70 may be equal to or slightly greater than the length of the free region 10 (or of the MTJ 321) (i.e., $W_{sot} \geq L$) to lower the SOT switching current. A bit line 50 may be formed on or above the top electrode 45 and the encapsulation layers 15. As alluded to above, the bit line 50 may provide a read signal through the MTJ 321 to determine a magnetic state of the MTJ 321, based on the voltage drop or the current measured across the MTJ 321.

FIG. 6A illustrates a plan view of a portion of a magnetoresistive device including an exemplary magnetoresistive stack of the present disclosure. FIG. 6B illustrates a cross-sectional view of a portion of a magnetoresistive device including an exemplary magnetoresistive stack of the present disclosure, along the plane 3-3 shown in FIG. 6A. FIG. 6C illustrates another cross-sectional view of a portion of a magnetoresistive device including an exemplary magnetoresistive stack of the present disclosure, along the plane 4-4 shown in FIG. 6A. In particular, a portion of the magnetoresistive device 1000 illustrated in FIGS. 6A-6C includes a horizontal array of memory cells 200 discussed above with reference to FIGS. 5A-5C. Further, each memory cell 200 depicted in FIGS. 6A-6C is a one-transistor, one-diode, one-MTJ memory cell including the exemplary magnetoresistive stack discussed in reference to FIGS. 2A-2B. In the discussion below, reference will be made to FIGS. 6A-6C.

As shown in FIG. 6A, each horizontal array of memory cells 200 in the exemplary magnetoresistive device 1000 may include multiple memory cells 200 spaced apart from each other horizontally. As would be known to a person of ordinary skill in the art, the exemplary magnetoresistive device 1000 may include any number of such horizontal arrays arranged in rows to form a memory array. As alluded to above with reference to FIG. 5A, each memory cell 200 may measure approximately 50-120 nm in width ($W_{cell}$) and 50-120 nm in length ($L_{cell}$). More particularly, in one embodiment, each memory cell 200 may measure approximately 60 nm in width ($W_{cell}$) and 84 nm in length ($L_{cell}$). Each memory cell 200 may include an MTJ 321 formed in an in-plane magnetoresistive stack configuration discussed above with reference to FIGS. 5B-5C. As shown in FIG. 6B, MTJ 321 may be positioned between a top electrode 45 coupled to a bit line 50 and an SOT write line 70. In particular, the free region 10 of the MTJ 321 may be formed on or proximate to the SOT write line 70, such that the switching current provided through the SOT write line 70 may impart a spin torque to the free region 10, to switch the magnetization direction of the free region 10. Intermediate region 20 may be formed on or above the free region 10, and fixed region 30 may be formed on or above the intermediate region 20. The fixed region 30 may be connected to a bit line 50, via a top electrode 45 positioned therebetween. In FIG. 6A, the bit line 50 and/or the top electrode 45 are not shown so as to not obscure the MTJ 321 formed on the SOT write line 70. The stack configuration including the bit line 50 and the top electrode 45 is more clearly shown in FIGS. 6B-6C. In some embodiments, as illustrated in FIG. 6B, a diode 40 may be formed between the fixed region 30 and the top electrode 45, to prevent sneak current (e.g., current traveling through and/or along unintended pathways), which may degrade the read current strength. In some embodiments, the diode 40 may be a thin film diode (TFD) formed on (or above) the fixed regions 30 and coupled to the top electrode 45. Diode 40 may be any type of diode however, including but not limited to metal-insulator-metal (MIM) diode or P-N junction diode. The top electrode 45 may be connected to the bit line 50, from which a read signal is provided to determine the magnetic state of the MTJ 321. By controlling the voltages applied to the supply lines (i.e., bit line 50, source line 90, word line 60, etc.), a read current may be generated and may travel from the bit line 50 through the MTJ 321, in order to determine the resistive state of the MTJ 321 (e.g., parallel/low-resistance or antiparallel/high-resistance), for example, during a read operation. Further, each bit line 50 may be connected to MTJs 321 of all the (or multiple) memory cells (e.g., by way of top electrodes 45 and diodes 40) positioned along the corresponding column in the memory array.

As discussed above, the SOT write line 70 may be in contact with or positioned proximate to the free regions 10 of all the MTJs 321 in the horizontal array. In each memory cell 200, the SOT write line 70 may be connected to the drain (marked "D" in FIG. 6C) of a transistor 80 by way of via 75. In one embodiment, as shown in FIGS. 6A-6C, the transistor 80 may be a fin field-effect transistor (i.e., Fin-FET). As would be known to a person of ordinary skill in the art, FinFET is a nonplanar (i.e., three-dimensional), double-gate transistor built on a substrate (e.g., silicon on insulator). In FIG. 6B, via 75, which is in contact with the SOT write line 70 at one end (e.g., top end of the via 75 in FIG. 6B), appears to be in contact with word line 60 at the other end (e.g., bottom end of the via 75 in FIG. 6B). However, this is because the contact point between the bottom end of the via 75 and the transistor 80 is obscured by the word line 60 in FIG. 6B. In reality, the bottom end of the via 75 may actually be in contact with the drain D of the transistor 80, as shown in FIG. 6C.

With continuing reference to FIG. 6C, encapsulation layers 15 may be formed in a manner similar to the description provided with reference to FIG. 5C. For example, the encapsulation layers 15 may be formed vertically, over the opposing ends of the portion of the magnetoresistive stack including the MTJ 321, diode 40, and top electrode 45. Each capsulation layer 15 may be formed as a continuous layer covering substantially the entire adjoining surfaces of the free region 10, intermediate region 20, fixed region 30, diode 40, and top electrode 45. The width of the SOT write line 70 may be approximately equal to or greater than the sum of the length of the free region 10 (or of the MTJ 321) and the total thickness of the encapsulation layers 15 (i.e., $W_{sot} \geq L + 2T_{enc}$). Additionally, the width of the SOT write line 70 may be equal to or greater than the length of the free region 10 (or of the MTJ 321) (i.e., $W_{sot} \geq L$) to lower the SOT switching current. Word line 60 may be in contact with the gate (marked "G" in FIG. 6C) of the transistor 80. As discussed above, a voltage may be applied to word line 60 to "turn on" the transistor 80 to pass a current through. Further, word line 60 may be in contact with the gates of the transistors 80 of all the memory cells in the horizontal array (e.g., FIGS. 6A-6B). Therefore, applying a voltage to the word line 60 may activate/select the horizontal array for an operation, by "turning on" all the transistors 80 in the horizontal array. Further with reference to FIG. 6C, source line 90 may be in electrical contact with the source (marked "S" in FIG. 6C) of the transistor 80, by way of an interconnect 43 (e.g., electrode, via, etc.) connected between the source line 90 and the source of the transistor 80. A suitable source line voltage may be applied to one or more source lines 90 in the horizontal array to drive a current through a desired portion of the SOT write line 70, in order to switch the magnetization direction of a target free region 10 during, for example, a write or a reset/set operation. Each source line 90 may be connected to the sources of the transistors 80 of all the (or multiple) memory cells positioned along the corresponding column in the memory array.

For a write operation, the following bias application methods may be possible: (A) Constant-I mode in which a regulated current, $I_w$, may flow from a source line 90, through a transistor 80, a via 75, a part of the SOT write line 70, another via 75, and another transistor 80, to another source line 90; or (B) Constant-V mode in which a regulated voltage, $V_{cell}$, may be applied between a source line 90 and another source line 90. In order to achieve a low write error rate in the SOT MRAM array, a writing current density, $j_w$ [A/cm$^2$], at the portions of SOT write line 70 underneath the free region 10 in all cells may need to be greater than a certain threshold value, thereby overcoming a variety of bit-to-bit distribution. In order to make a power-efficient and reliable memory array, the bit-to-bit distribution of the writing current density, $j_w$, may need to be minimized. In the Constant-I mode, $j_w$ may approximately equal $I_w/(T_{sot}W_{sot})$, where the variation factors for $j_w$ may be $W_{sot}$ and $T_{sot}$. In the Constant-V mode, $j_w$ may approximately equal $V_{cell}/[\rho W_{cell} + T_{sot}W_{sot}(R_{para1}+R_{para2})]$, and $j_w$ may have more variation factors (e.g., $\rho$, $W_{cell}$, $R_{para1}$, and $R_{para2}$) than those of Constant-I mode (e.g., $W_{sot}$ and $T_{sot}$). Here, $\rho$ represents resistivity of the SOT write line 70, $R_{para1}$ represents a combined resistance value of a transistor resistance, a via resistance, and other miscellaneous line and contact resistances on the current path, and $R_{para2}$ represents a combined resistance value of another transistor resistance, another via resistance, and other miscellaneous line and contact resistances on the current path. Therefore, the bit-to-bit distribution of the writing current density, $j_w$, may be smaller in the Constant-I mode than in the Constant-V mode, and the Constant-I mode may thus be preferred for a more power-efficient and reliable memory array. This is because the required writing current may be smaller in the Constant-I mode, and the writing error rate and the endurance failure rate due to electromigration in the write current paths may be lower in the Constant-I mode than in the Constant-V mode. On the other hand, for a simpler circuit, the Constant-V mode may be preferred.

It should be noted that although FIGS. 6A-6C each illustrate just four memory cells 200 in a horizontal array, this is only for the sake of simplicity and clarity. As will be known to a person of ordinary skill in the art, any number of memory cells 200 may be included in a horizontal array. Further, the resultant magnetoresistive device may include any number of such horizontal arrays arranged in rows.

Methods of fabricating an exemplary magnetoresistive device 1000 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive device remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 7 is a flow chart of a method 700 of fabricating an exemplary magnetoresistive device 1000 of the present disclosure. FIGS. 8A-8I are schematic cross-sectional views of the magnetoresistive device 1000 at various stages of the fabrication process. In the description below, reference will be made to FIG. 7 and FIGS. 8A-8I. It should be noted that, in the discussion below, layer(s) of material(s) (e.g., in FIGS. 8A-8I) that will eventually form each of the SOT write line, free region, intermediate region, fixed region, diode, etc. are referred to as SOT write line, free region, intermediate region, fixed region, diode, etc., respectively. For the sake of brevity, conventional manufacturing techniques related to semiconductor processing may not be described in detail herein.

Figure 8A:
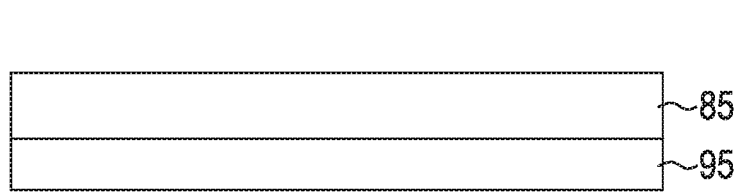

On the surface of a substrate, such as, for example, a surface of an integrated circuit device (IC) 95, insulator region 85 may be formed or deposited (step 710). FIG. 8A illustrates an IC 95 with the insulator region 85 formed thereon in one exemplary embodiment. Insulator regions 85 may include any now-known or later-developed dielectric material (e.g., oxides, nitrides, carbonitrides, etc.). In some embodiments, silicon nitride (e.g., $Si_3N_4$, SiN, etc.), silicon oxide (e.g., $SiO_2$, $SiO_x$, etc.), a low-k ILD material (e.g., carbon doped $SiO_2$ (SiOC), Carbon Doped Oxide (CDO), Organo Silicate Glass (OSG) spin-on organics, etc.), aluminum oxide (e.g., $Al_2O_3$), magnesium oxide (e.g., MgO), tetraethoxysilane (TEOS), and/or one or more combinations thereof may be used as the insulator region 85. IC 95 may be any semiconductor substrate, which may or may not have various electrical components, such as, e.g., fin field-effect transistor (FINFET) devices, complementary metal-oxide-semiconductor (CMOS) devices, etc. formed thereon. The insulator region 85 may be deposited or formed on IC 95 by any now-known or later-developed technique (e.g., physical vapor deposition (PVD), chemical vapor deposition (CVD), atomic layer deposition (ALD), etc.).

Figure 8B:
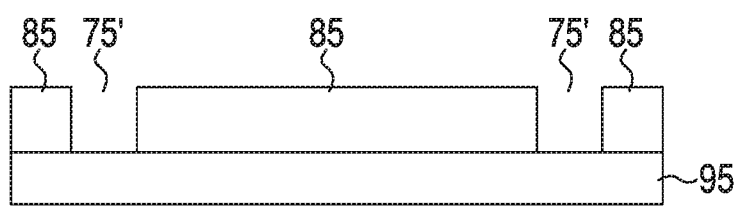

An array of cavities 75' may then be formed by etching through the insulator region 85 to expose a surface of the IC 95 (step 720). FIG. 8B illustrates exemplary cavities 75' formed through the insulator region 85, exposing the IC 95. Any suitable etching process may be used to etch the cavities 75'. For example, in some embodiments, reactive ion etching (RIE) or ion beam etching (IBE) may be used to etch through the insulator region 85 and form the cavities 75'. As known to those of ordinary skill in the art, IBE and RIE may use beams of charged ions (comprising one or more of Argon, Krypton, Xenon, etc.) (reactive charged ions in the case or RIE) to etch through the insulator region 85 to form the cavities 75'. As known to those of ordinary skill in the art, in some cases, etching cavities 75' may include multiple steps (e.g., photolithography, etc.) that are not described herein for the sake of brevity.

Figure 8C:
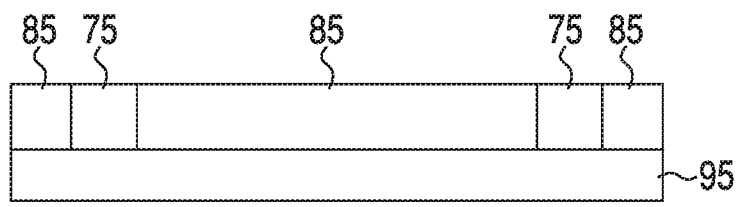

An electrically conductive material may then be deposited in the etched cavities 75' to form electrically conductive vias 75 (step 730). FIG. 8C illustrates the vias 75 formed through the insulator region 85 over the IC 95. It should be noted that multiple cavities 75' may be etched at the same time on IC 95, and the electrically conductive vias 75 may be formed in all the etched cavities 75' at the same time. Although not shown in FIG. 8C, in some embodiments, cavity 75' may be formed such that it lands on (or exposes) a metal interconnect structure (e.g., a metal pad, via, etc.) of IC 95 so that the subsequently formed electrically conductive via 75 will be electrically coupled to the transistors or other circuitry of IC 95.

Figure 8D:
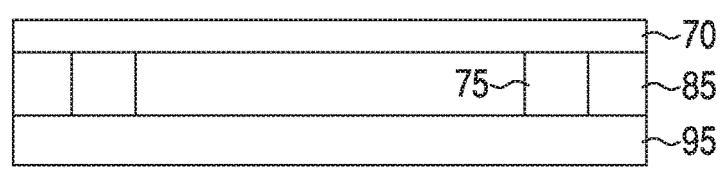
Figure 11B:
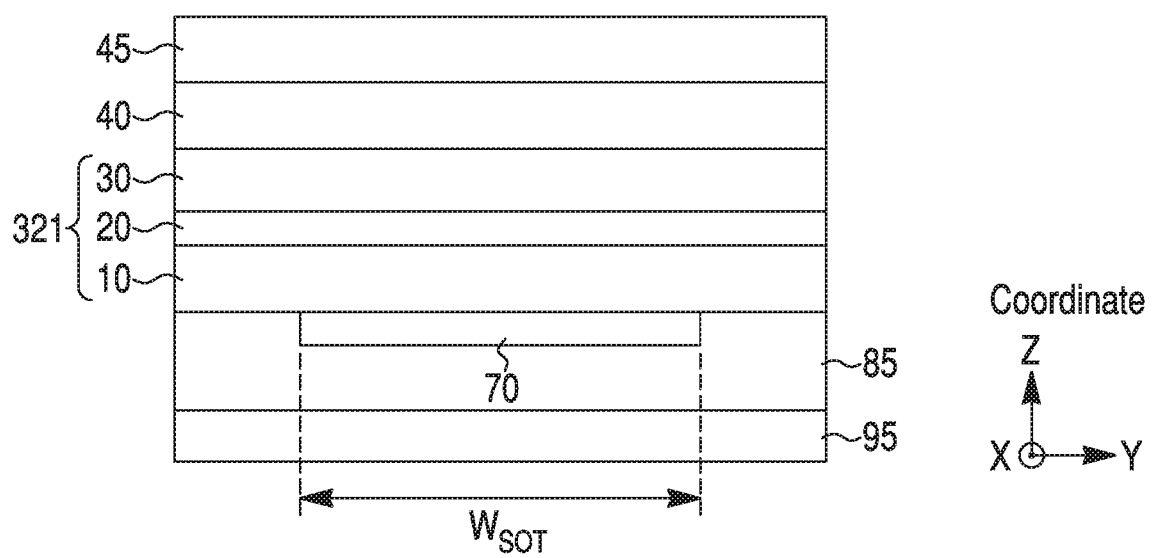

An SOT write line 70 may then be formed or deposited over the insulator region 85 having exposed surfaces of vias 75 that are connected to the circuitry of IC 95 (step 740). FIG. 8D illustrates the SOT write line 70 formed over the insulator region 85 and in contact with the vias 75. As discussed above with respect to step 710, any now-known or later-developed technique may be used to deposit or form the SOT write line 70 (e.g., physical vapor deposition (PVD), chemical vapor deposition (CVD), atomic layer deposition (ALD), etc.). In one embodiment, the SOT write line 70 may be patterned (e.g., pre-patterned) using any now-known or later-developed fabrication processes, in order to achieve a desired width (i.e., $W_{sot}$) of the SOT write line 70. As known to a person of ordinary skill in the art, patterning uses the process of photolithography and masks to print patterns that guide the deposition or removal of material from the wafer at specific steps during the device fabrication process. For example, FIG. 11B shows an SOT write line 70 that is patterned and embedded in the insulator region 85. In some embodiments, however, pre-patterning of the SOT write line 70 may not be necessary and the SOT write line 70 may be deposited over the insulator region 85 without such a patterning step (e.g., FIG. 15B).

Figure 8E:
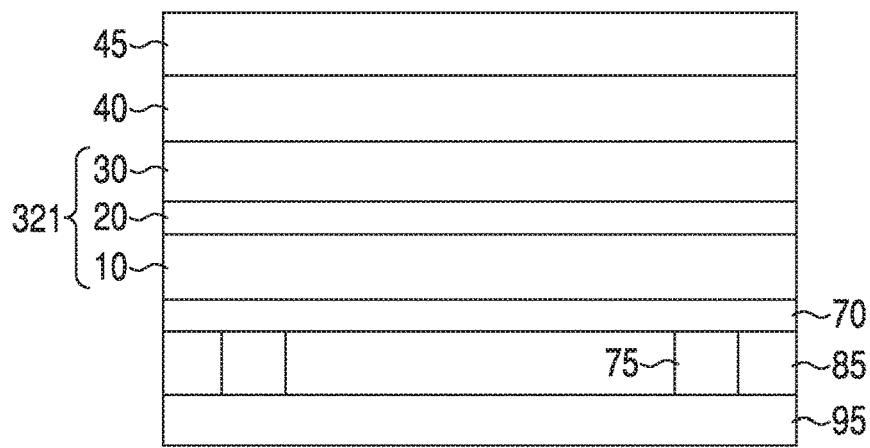

On the surface of SOT write line 70, multiple layers of materials (e.g., free region 10, intermediate region 20, fixed region 30, diode 40, top electrode 45, in order) may be sequentially formed or deposited to form a multi-layer stack (step 750). FIG. 8E illustrates the multi-layer stack formed on the SOT write line 70 in one exemplary embodiment. As discussed above with respect to step 710, any now-known or later-developed technique may be used to deposit or form the multi-layer stack (e.g., physical vapor deposition (PVD), chemical vapor deposition (CVD), etc.). In some embodiments, the multiple layers of materials may be sequentially deposited over the SOT write line 70 using atomic layer deposition (ALD) (a type of PVD). In embodiments where a region includes multiple layers stacked one on top of another (e.g., a free region 10 and/or a fixed region 30 formed of multiple ferromagnetic layers separated by anti-ferromagnetic coupling layers, a diode 40 formed of multiple layers of materials that form a metal-insulator-metal (MIM) structure, etc.), the multiple layers may be sequentially deposited to form the corresponding region. In some embodiments, diode 40 may be formed by depositing an electrode and then depositing the diode 40 on or above the electrode (e.g., diode 40 in FIG. 8E may include a layer of material that forms an electrode and multiple layers of materials stacked one on top of another that collectively form the diode). In some embodiments, the electrode may be eliminated and materials that comprise the diode (e.g., a metal-insulator-metal (MIM) structure, etc.) 40 may be directly deposited on or above the fixed region 30.

Figure 8F:
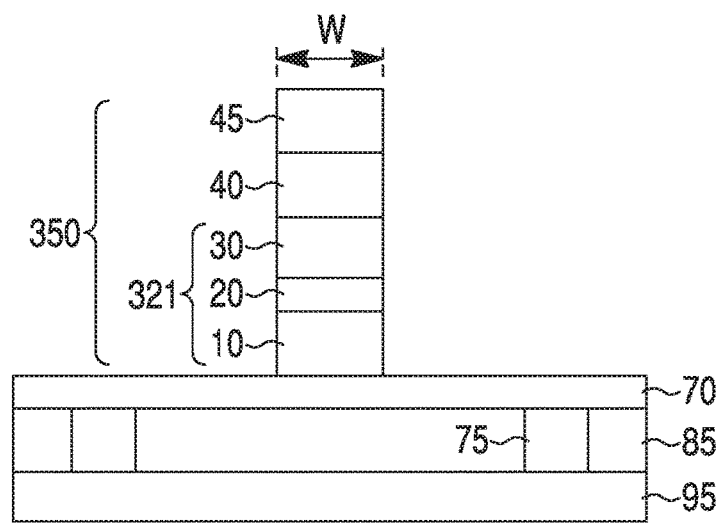

The outer ends of the multi-layer stack (including free region 10, intermediate region 20, fixed region 30, diode 40, and top electrode 45) may then be etched to form a multi-layer stack conforming to desired dimensions (e.g., W 6-16 nm and L 15-30 nm) (step 760). Such a multi-layer stack (i.e., a multi-layer stack etched to desired dimensions) may be referred to as a size-adjusted stack 350 hereinafter. FIG. 8F illustrates the size-adjusted stack 350. As discussed in step 720, any suitable etching process may be used to etch the outer ends of the multi-layer stack (e.g., reactive ion etching (RIE), ion beam etching (IBE), etc.). During RIE or IBE, the impact of ions abrade portions of the multi-layer stack. During this process, some of the abraded material may redeposit on the outer walls of the multi-layer stack. In some cases, this redeposited layer may affect the electrical and/or magnetic performance of the eventually formed magnetoresistive device 1000. Therefore, in some embodiments, during or after the etching process, any redeposited material may be cleaned or otherwise removed from the outer walls of the multi-layer stack by using processes, such as, for example, angled etch, isotropic etch, etc. In some embodiments, this cleaning step may be eliminated or performed on only select portions of outer walls of the multi-layer stack. Moreover, in some embodiments, the formation of the size-adjusted stack 350 shown in FIG. 8F may include multiple alternating etching and cleaning steps.

Figure 8G:
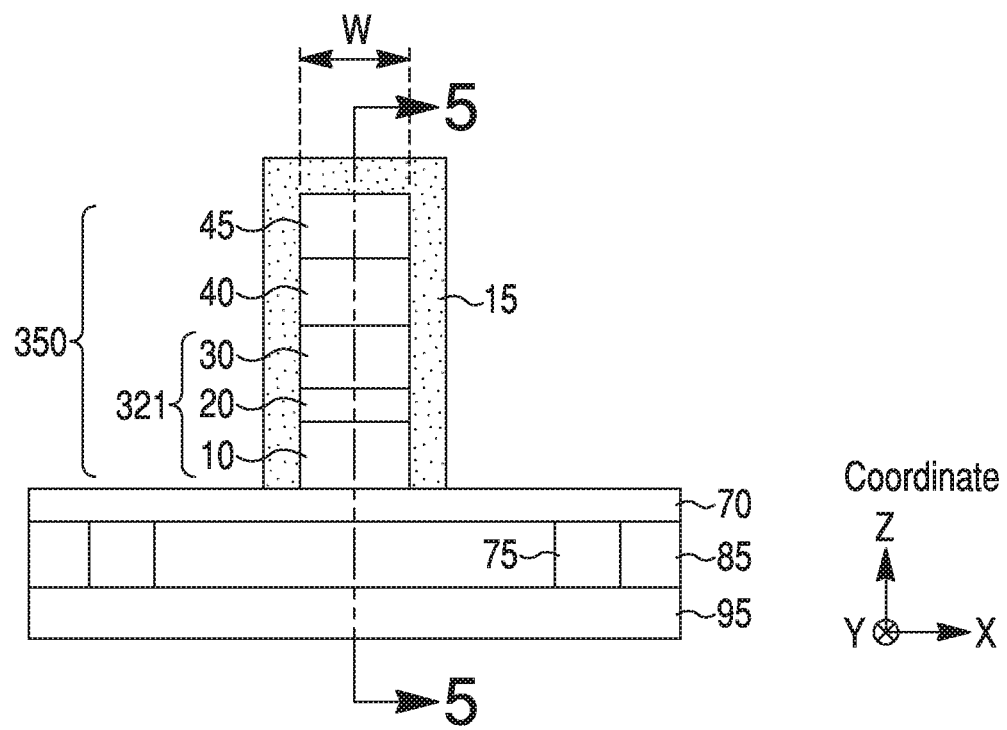
Figure 8H:
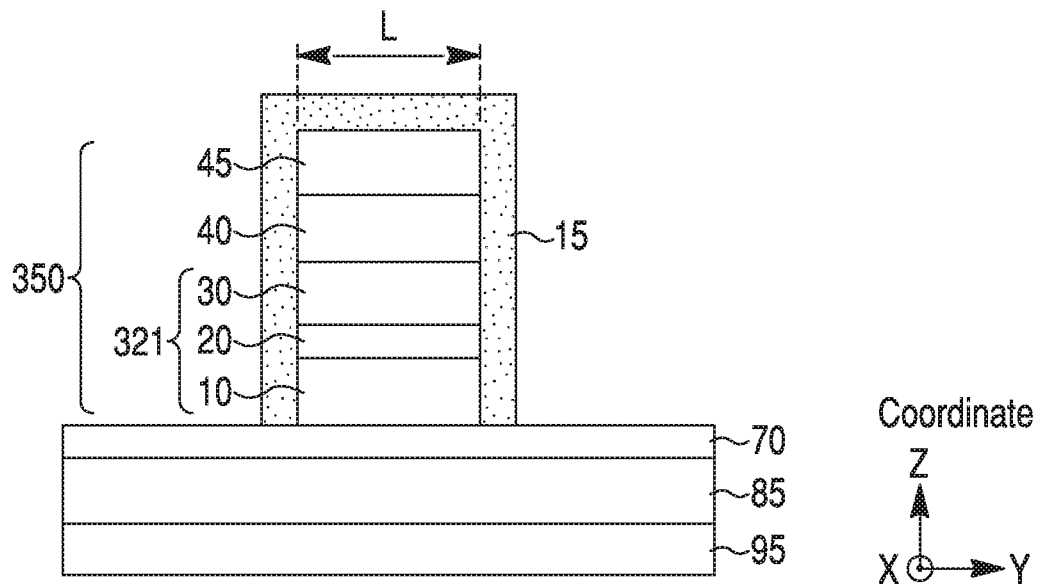

Once the size-adjusted stack 350 is formed, an encapsulation layer 15 may be formed or deposited over the exposed surfaces of the stack 350 (step 770). FIG. 8G illustrates the size-adjusted stack 350 with the encapsulation layer 15 formed thereon. FIG. 8H illustrates another schematic cross-sectional view of the size-adjusted stack 350 with the encapsulation layer 15 formed thereon, along the plane 5-5 shown in FIG. 8G. As discussed in step 710, any now-known or later-developed technique may be used to deposit or form the encapsulation layer 15 (e.g., physical vapor deposition (PVD), chemical vapor deposition (CVD), atomic layer deposition (ALD), etc.). As discussed above with reference to FIGS. 2A-2B, the encapsulation layers 15 may be made of any suitable dielectric material. For example, in one embodiment, the encapsulation layers 15 may be made of magnesium oxide (MgO). However, other materials such as, for example, aluminum oxide (such as, e.g., $Al_2O_3$), a Tetraethyl orthosilicate (TEOS), and/or one or more combinations thereof, may also be used as the encapsulation layers 15. In general, the encapsulation layer 15 may have any thickness. In some embodiments, the thickness of the encapsulation layer 15 may be approximately 5 nm.

In some embodiments, after the encapsulation layer 15 is formed over the exposed surfaces of the size-adjusted stack 350 (step 770), the portions of the encapsulation layer 15 formed on the "long" sides of the stack 350 may be removed or substantially removed (e.g., thinned down), for example, by etching. The "long" sides of the size-adjusted stack 350 refer to the sides of the stack 350 that correspond to the length (L) discussed above with reference to FIGS. 2A-2B and 5A-5C. For example, the left and the right side of the size-adjusted stack 350 illustrated in FIG. 8G are the "long" sides. As discussed in step 720, any suitable etching process may be used to etch the portions of the encapsulation layer 15 (e.g., reactive ion etching (RIE), ion beam etching (IBE), etc.). FIG. 9 illustrates the size-adjusted stack 350 after the portions of the encapsulation layer 15 formed on the "long" sides of the stack 350 are thinned down. It should be noted that, although FIG. 9 illustrates a thinned down encapsulation layer 15 on the "long" sides, in some embodiments, the encapsulation layer 15 on the "long" sides may be removed or substantially removed. In some embodiments, the portions of the encapsulation layer 15 formed on the "long" sides of the size-adjusted stack 350 may be retained without affecting the performance of the resultant magnetoresistive device 1000.

Figure 8I:
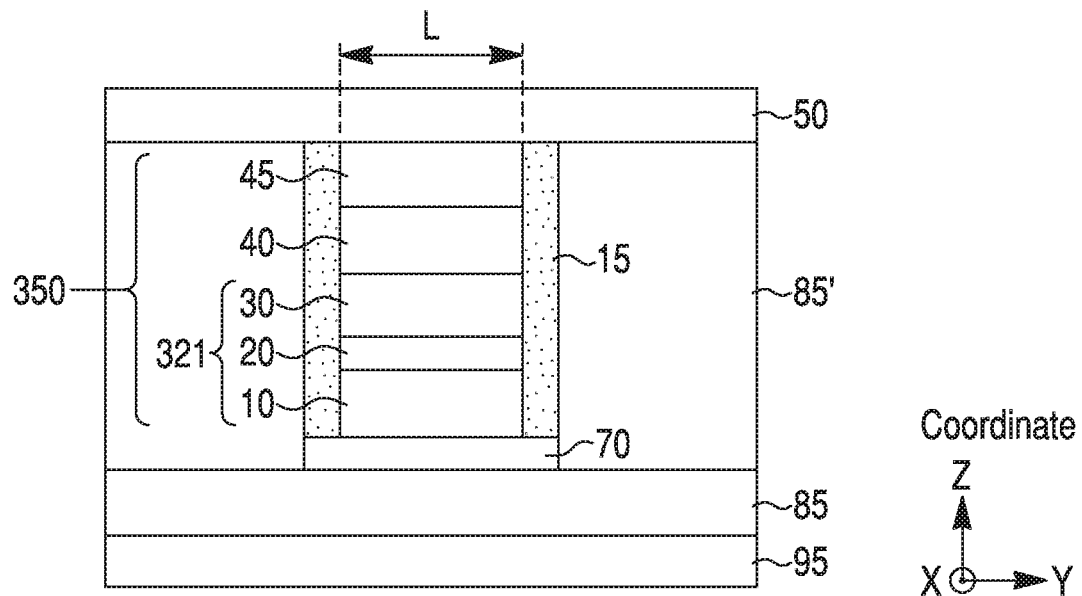

With continuing reference to FIG. 7, after forming the encapsulation layer 15, a bit line 50 may be formed on the size-adjusted stack 350 (step 780). More particularly, the bit line 50 may be formed such that the top electrode 45 of the size-adjusted stack 350 may come in contact with the bit line 50. It also should be noted that, before forming the bit line 50, the SOT write line 70 may be patterned to a desired width (i.e., $W_{sot}$) by either pre-patterning or post-patterning of the deposition at step 740. FIG. 8I illustrates the patterned SOT write line 70, and the bit line 50 formed on the size-adjusted stack 350 and in contact with the top electrode 45. Forming the bit line 50 may be part of, for example, back end of line (BEOL) processing. The BEOL processing may include additional processing steps, such as, e.g., depositing additional encapsulant 85' (e.g., any electrically nonconductive material, such as, for example, silicon nitride, silicon oxide, a low-k ILD material, etc.) over the size-adjusted stacks 350 with the encapsulation layers 15 formed thereon, polishing a top surface of the formed structure to expose a conductive region of the size-adjusted stacks 350 (i.e., top electrode 45), forming a bit contact structure on the exposed regions of the size-adjusted stacks 350 to make electrical contact with the MTJs 321, forming top contacts, bond pads, bit lines, etc., in order to fabricate a magnetoresistive device from the MTJs 321. Since these additional processing steps are known to those of ordinary skill in the art, they are not described in detail herein for the sake of brevity.

FIG. 10 is a flow chart of another method 1100 of fabricating an exemplary magnetoresistive device 1000 of the present disclosure. FIGS. 11A-11H are schematic cross-sectional views of the magnetoresistive device 1000 at various stages of the fabrication process. FIGS. 11AA, 11CC, 11FF, 11GG, and 11HH illustrate plan view of the magnetoresistive device 1000 at corresponding stages of the fabrication process. In the description below, reference will be made to FIG. 10, FIGS. 11A-11H, and FIGS. 11AA, 11CC, 11FF, 11GG, and 11HH. For the sake of brevity, conventional manufacturing techniques related to semiconductor processing, and processing steps that are similar to those in the previously described method (e.g., method 700), may not be described in detail in the following sections. Further, the fabrication processes of the SOT write line 70 and the vias 75 over the IC 95, which are described above with reference to FIGS. 8A-8D, may equally apply to method 1100, and therefore may not be described again in the following sections.

After SOT write line 70 is formed (e.g., step 740 of FIG. 7), multiple layers of materials (e.g., free region 10, intermediate region 20, fixed region 30, diode 40, top electrode 45, in order) may be sequentially formed or deposited on the SOT write line 70 to form a multi-layer stack (step 1110). FIG. 11A illustrates the multi-layer stack formed on the SOT write line 70 in one exemplary embodiment. FIG. 11AA illustrates a plan view of the structure formed in step 1110 and FIG. 11A, showing the exposed surface of the multi-layer stack (i.e., exposed surface of the top electrode 45). FIG. 11B illustrates another schematic cross-sectional view of the multi-layer stack, along the plane 6-6 shown in FIG. 11A. As discussed above with respect to step 710, any now-known or later-developed technique may be used to deposit or form the multi-layer stack (e.g., physical vapor deposition (PVD), chemical vapor deposition (CVD), atomic layer deposition (ALD), etc.). As shown in FIG. 11B, the SOT write line 70 may be patterned (e.g., pre-patterned) using any now-known or later-developed fabrication processes, in order to achieve a desired width (i.e., $W_{sot}$) of the SOT write line 70, as discussed above with reference to FIG. 8D.

Figure 11C:
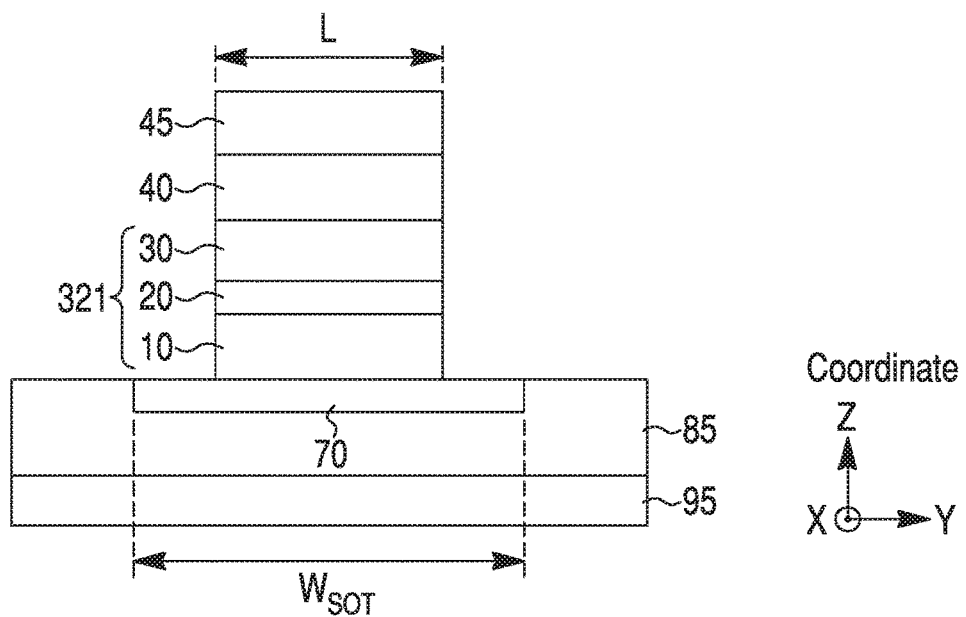
Figure 11C:
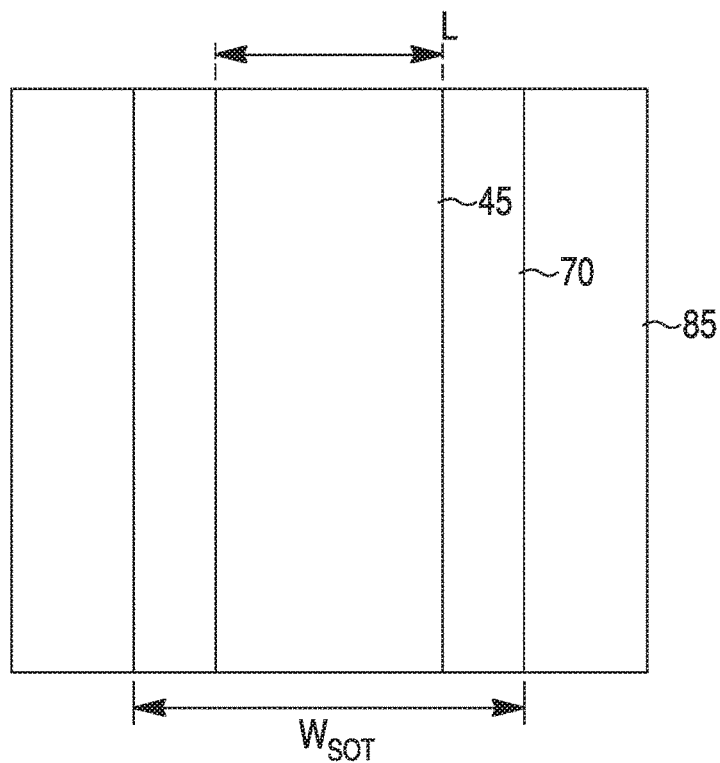

The multi-layer stack (including free region 10, intermediate region 20, fixed region 30, diode 40, and top electrode 45) may then be etched in one direction (e.g., in the direction of the x-axis), to form a line of multi-layer stack with a desired length (e.g., L≈15-30 nm) (step 1120). More particularly, two opposing sides of the multi-layer stack may be etched in the direction of the x-axis until the top surfaces of the insulator region 85 and the SOT write line 70 are exposed, to achieve a desired length (L) of the free region 10. FIG. 11C illustrates the multi-layer stack etched in one direction, to achieve the desired length. FIG. 11CC illustrates a plan view of the etched multi-layer stack. More particularly, the plan view of FIG. 11CC better illustrates the line of multi-layer stack formed along the x-axis. As discussed above with respect to step 720, any suitable etching process may be used to etch the multi-layer stack (e.g., reactive ion etching (ME), ion beam etching (IBE), etc.).

Figure 11D:
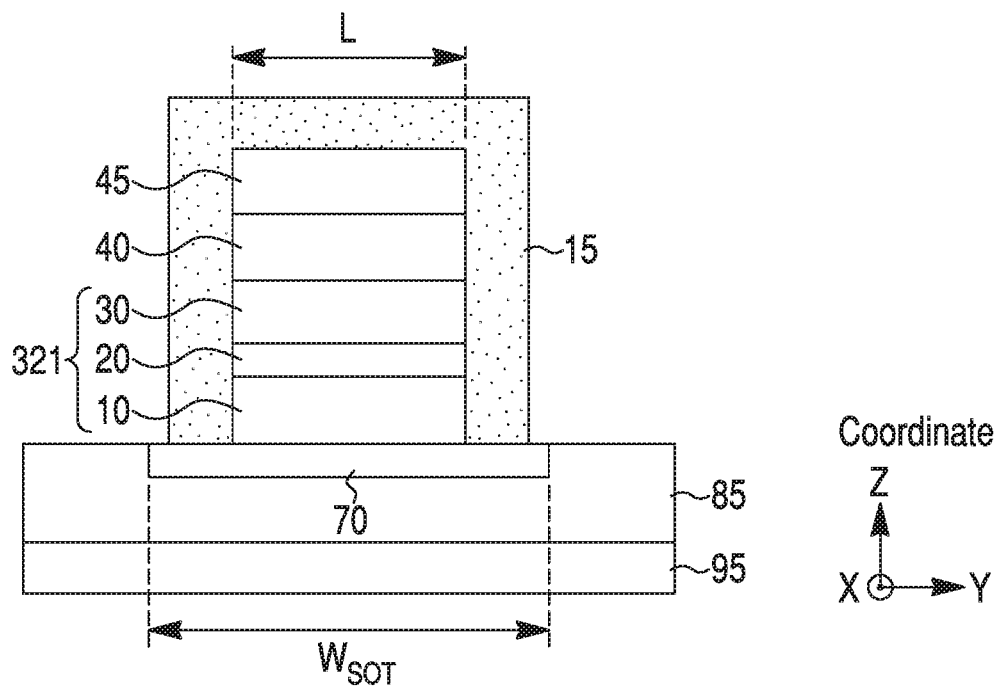
Figure 11E:
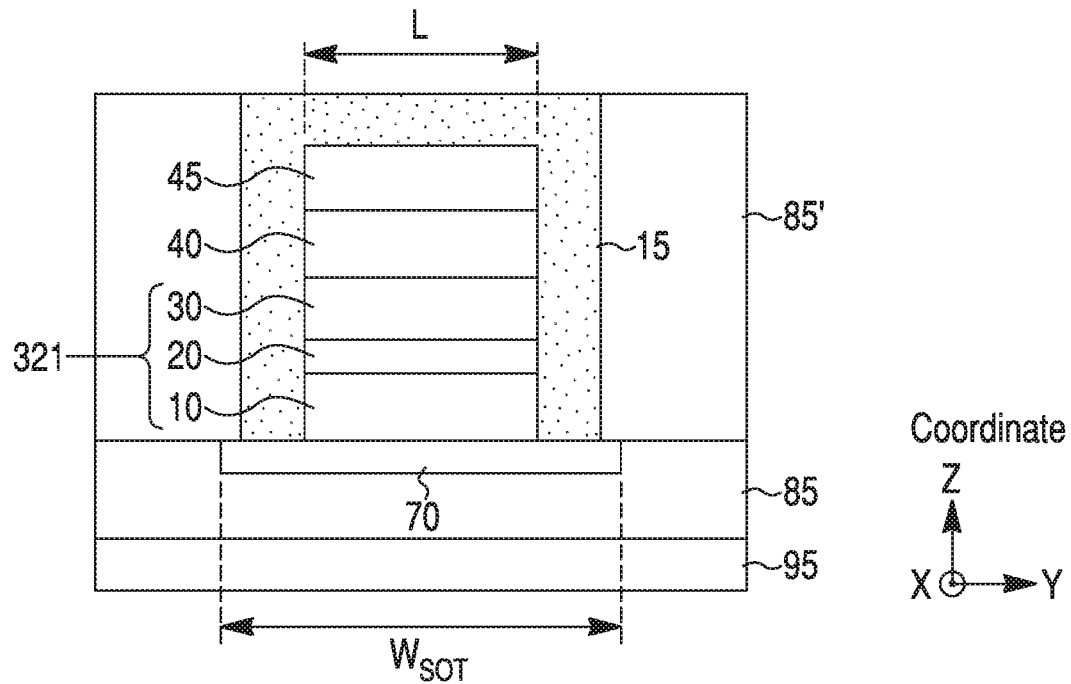

Once the multi-layer stack is etched in one direction, an encapsulation layer 15 may be formed or deposited over the exposed surfaces of the multi-layer stack (step 1130). FIG. 11D illustrates the multi-layer stack with the encapsulation layer 15 formed thereon (i.e., coated multi-layer stack). As discussed in step 710, any now-known or later-developed technique may be used to deposit or form the encapsulation layer 15 (e.g., physical vapor deposition (PVD), chemical vapor deposition (CVD), atomic layer deposition (ALD), etc.). Then, additional encapsulant 85' may be deposited on the periphery of the coated multi-layer stack, over the exposed surfaces of the insulator region 85 and the SOT write line 70 (at step 1140). FIG. 11E illustrates the additional encapsulant 85' deposited on the periphery of the coated multi-layer stack. As discussed in step 710, any now-known or later-developed technique may be used to deposit or form the additional encapsulant 85' (e.g., physical vapor deposition (PVD), chemical vapor deposition (CVD), atomic layer deposition (ALD), etc.).

Figure 11F:
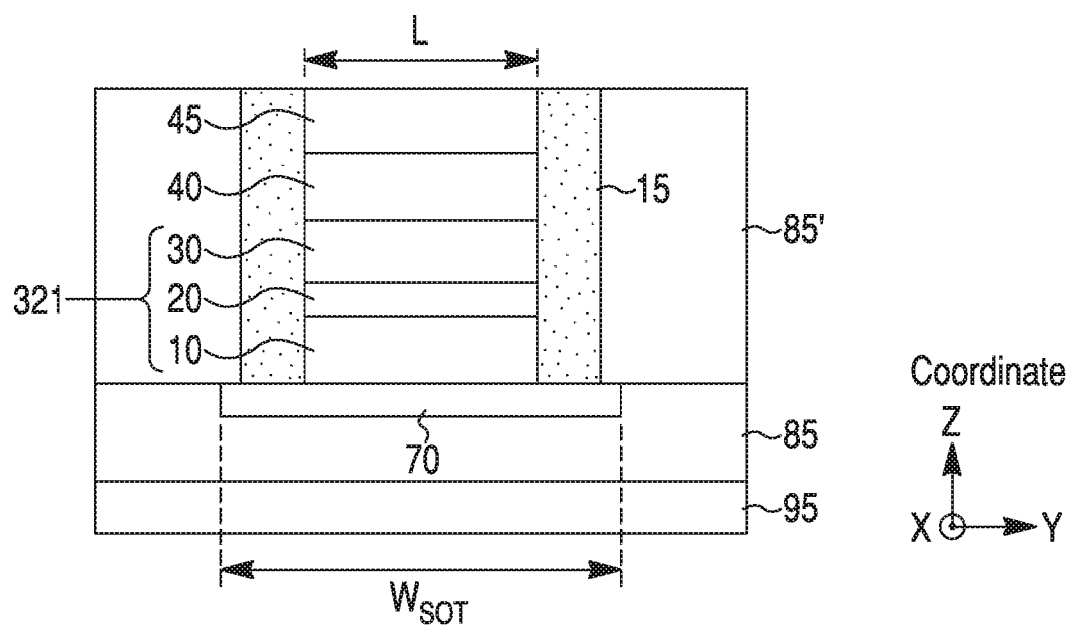
Figure 11F:
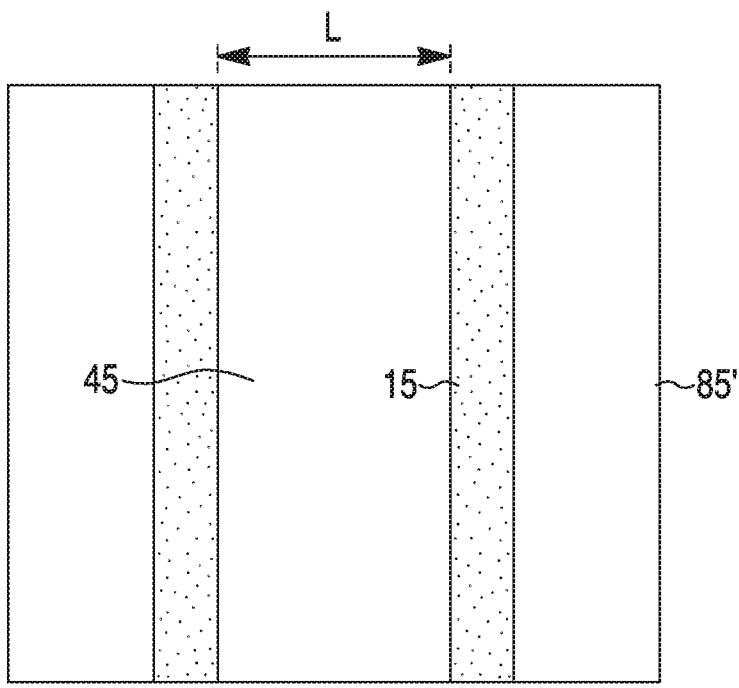

The exposed surfaces of the encapsulation layer 15 and the additional encapsulant 85' may then be polished until the top electrode 45 of the multi-layer stack is exposed (step 1150). FIG. 11F illustrates the exposed top electrode 45 of the multi-layer stack after a suitable polishing process. FIG. 11FF illustrates a plan view of the structure formed in step 1150 and FIG. 11F. Any known process may be used to polish the encapsulation layer 15 and the additional encapsulant 85'. In some embodiments, a technique, such as, e.g., chemical mechanical polishing (CMP) may be used to polish the encapsulation layer 15 and the additional encapsulant 85'. Since CMP processes are known in the art, they are not described herein.

Figure 11G:
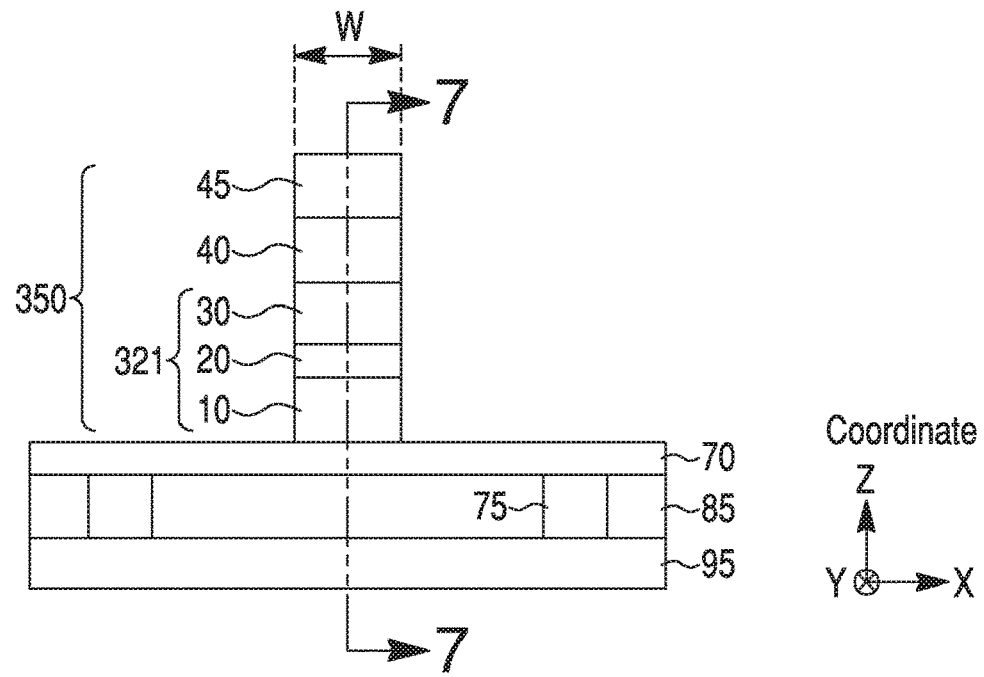
Figure 11G:
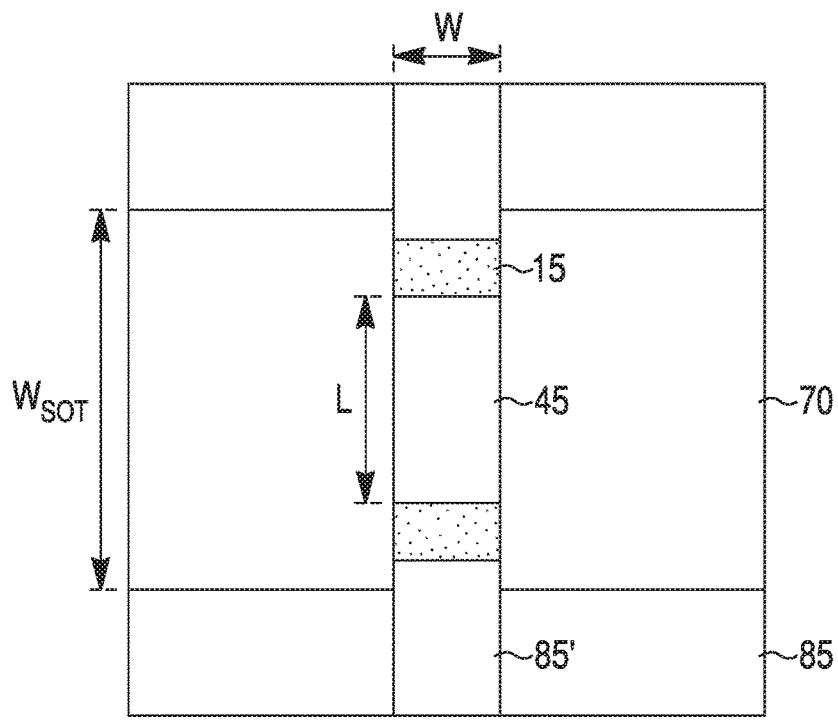
Figure 11H:
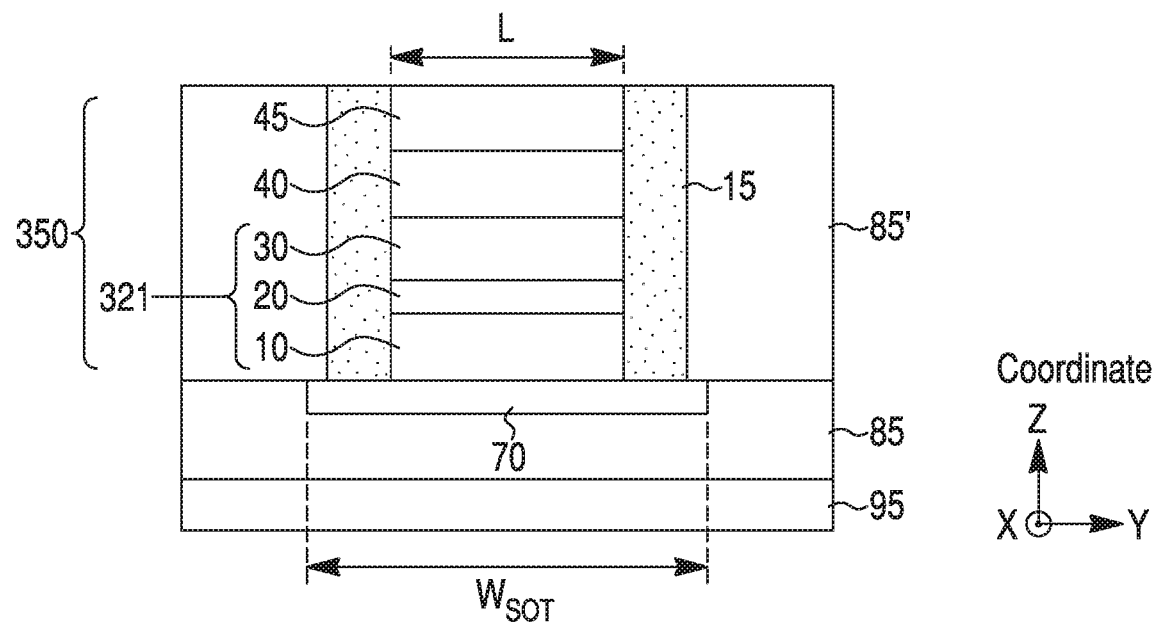
Figure 11H:
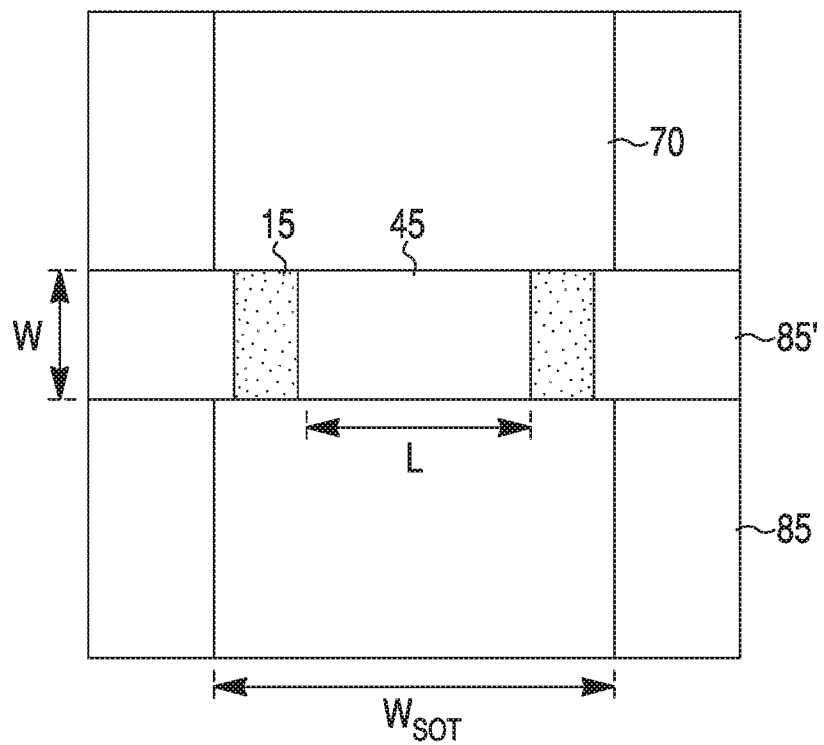

The multi-layer stack, along with the surrounding encapsulation layer 15 and additional encapsulant 85', may then be etched in another direction (i.e., in the direction of the y-axis), to form a size-adjusted stack 350 (step 1160). More particularly, two opposing sides of the multi-layer stack may be etched in the direction of the y-axis until the SOT write line 70 is exposed, to achieve a desired width (W) of the free region 10 (e.g., W≈6-16 nm). In this case, the additional encapsulant 85' may be remained around the SOT write line 70 (as shown in FIGS. 11GG, 11H, and 11HH). Thus, in the exemplary fabrication method 1100, the size-adjusted stack 350 may be formed after a two-step etching process, which includes the etching process described in step 1120 (to achieve a desired length (L)) and the etching process described in step 1160 (to achieve a desired width (W)). FIG. 11G illustrates the multi-layer stack etched to a desired width (i.e., size-adjusted stack 350). FIG. 11H illustrates another schematic cross-sectional view of the size-adjusted stack 350, along the plane 7-7 shown in FIG. 11G. FIGS. 11GG and 11HH illustrate plan views of the size-adjusted stack 350 formed after the two-step etching process, corresponding to FIGS. 11G and 11H respectively. As discussed above with respect to step 720, any suitable etching process may be used to etch the multi-layer stack (e.g., reactive ion etching (RIE), ion beam etching (IBE), etc.).

As discussed above with respect to step 780 and FIG. 8I, additional processing steps may be performed (e.g., BEOL processing) to form a magnetoresistive device from the structure formed in accordance with the method 1100. Because these additional processing steps are known to those of ordinary skill in the art, they are not described in detail herein for the sake of brevity.

FIG. 12A illustrates a plan view of a portion of a memory cell including an exemplary magnetoresistive stack of the present disclosure. FIG. 12B illustrates a cross-sectional view of a portion of a memory cell including an exemplary magnetoresistive stack of the present disclosure, along the plane 8-8 shown in FIG. 12A. FIG. 12C illustrates another cross-sectional view of a portion of a memory cell including an exemplary magnetoresistive stack of the present disclosure, along the plane 9-9 shown in FIG. 12A. In the discussion below, reference will be made to FIGS. 12A-12C.

As shown in FIG. 12A, in each memory cell 300, an SOT write line 70 may be formed at the bottom of a magnetoresistive stack including an MTJ 321. The SOT write line 70 may be made of spin Hall (SH) material discussed above. MTJ 321 may be formed on or above the SOT write line 70. As discussed above in reference to FIG. 1, the SOT write line 70 may be in contact with or positioned proximate to a plurality of MTJ's 321 in a memory array, so that a switching current 95 (i.e., a write current) driven through the SOT write line 70 may impart a spin torque to the proximately-positioned free regions 10 of the plurality of MTJ's 321. In one embodiment, as shown in FIG. 12B, a bit line 50 made of electrically conductive material may be formed above the MTJ 321 to provide a read current through the MTJ 321. In some embodiments, a suitable conductive line (i.e., top electrode 45) made of electrically conductive material, such as, e.g., an electrode, an interconnect, etc. may be formed between the bit line 50 and the MTJ 321, to provide an electrical connection to the MTJ 321, as shown in FIG. 12B. The bit line 50 and the top electrode 45 are not shown in the plan view illustrated in FIG. 12A, so as to not obscure the MTJ 321 formed on the SOT write line 70. In one embodiment, the width of the memory cell 300 ($W_{cell}$) may be approximately 50-120 nm and the length of the memory cell 300 ($L_{cell}$) may be approximately 50-120 nm. In some embodiments, the width and the length of the memory cell 300 may be approximately the same. However, in other embodiments, the width and the length of the memory cell 300 may not be the same. In one embodiment, the width of the SOT write line 70 ($W_{sot}$) may be approximately 25 nm (i.e., narrower than the width of the SOT write line 70 discussed above with reference to FIG. 5A) and the thickness of the SOT write line 70 ($T_{sot}$) may be approximately 5 nm. As discussed above in reference to FIGS. 2A-2B, the width of the MTJ 321 (or of the free region 10 of the MTJ 321) (W) may be approximately 10 nm and the length of the MTJ 321 (or of the free region 10 of the MTJ 321) (L) may be approximately 25 nm, to provide a single domain, coherent magnetization reversal in the free region 10. Notably, in the exemplary embodiment illustrated in FIGS. 12A-12C, the length of the MTJ 321 (or of the free region 10 of the MTJ 321) (L) may be approximately the same as the width of the SOT write line 70 ($W_{sot}$) (i.e., L≈$W_{sot}$≈25 nm). In other words, the opposing ends of the MTJ 321 and the SOT write line 70 along the Y-axis may be aligned. Therefore, encapsulation layers 15 may be formed over the opposing ends of the MTJ 321 and the SOT write line 70 along the Y-axis, as illustrated in FIG. 12C. Thus, the encapsulation layers 15 may extend vertically downward beyond a top surface of the SOT write line 70. Because FIG. 12A is provided for purposes of illustrating the position and the placement of the MTJ 321 with respect to the SOT write line 70, the encapsulation layers 15 are not shown in FIG. 12A for the sake of clarity. It should be noted that the dimensions of the various components of the magnetoresistive device discussed herein are merely exemplary. In other words, dimensions other than the dimensions discussed herein may be used to form the various components of the magnetoresistive device of the present disclosure.

Now with reference to FIG. 12B, each memory cell 300 may include an MTJ 321 positioned between a top electrode 45 coupled to a bit line 50 and an SOT write line 70. The MTJ 321 may be formed on or above the SOT write line 70. More particularly, the free region 10 of the MTJ 321 may be formed on or proximate to the SOT write line 70. Intermediate region 20 may be formed on or above the free region 10, and may be disposed between the fixed region 30 and the free region 10. As indicated by the symbol in the fixed region 30 (i.e., an X enclosed in a circle), the magnetization direction of the fixed region 30 is "pinned" or "fixed" in one direction (e.g., pointing into the page), which is parallel to the SOT write line plane and orthogonal to the switching current 95. As indicated by the symbols in the free region 10 (i.e., an X and a dot enclosed in the respective circles), the magnetization direction of the free region 10 may be "switched" in one direction or the other (e.g., pointing into or out of the page), which is also parallel to the SOT write line plane and orthogonal to the switching current 95. This configuration, similar to the configuration discussed above with respect to FIG. 5B, may lead to a more deterministic and low-current switching of the free region 10 during, for example, a write or reset/set operation. Furthermore, due to a decrease in the cross-sectional area of the SOT write line 70 in the exemplary embodiment illustrated in FIGS. 12A-12C (compared to that of FIGS. 5A-5C), the value of the critical current (i.e., SOT switching current 95 needed to switch the magnetization direction of the free region 10) may be further reduced. For instance, the mathematical expression for the further-reduced critical current (i.e., switching current by spin-orbit-torque) may be as follows:

$$I_{c0}^{SOT} = \frac{4e\alpha}{\hbar\theta_{SH}^{eff}} \frac{A_H}{A_F} Eb$$

where
$A_F$ represents contact area between the free layer and the SOT write line, and
Eb represents energy barrier of the free layer for data retention.

(The rest of the parameters are explained above with reference to FIGS. 2A-2B.)

From the above equation, it can be deduced that the required writing current, $I_w$, is proportional to $W_{SOT}$/L', where L' represents the length of the contact area $A_F$, which may be less than or equal to the length of the MTJ 321, L (i.e., L'L). In order to achieve a low writing current, a shorter $W_{SOT}$ (i.e., a narrower SOT write line 70) and longer L' (i.e., a longer contact area) may be preferred. In order to switch the direction of the magnetization vectors of the free region 10 with a sufficiently low write error rate for an SOT device, a writing current density, $j_w$ [A/cm²], at the portions of the SOT write line 70 underneath the free region 10 may need to be greater than a certain threshold value (i.e., a threshold writing current density). The required writing current $I_w$ may approximately equal the threshold writing current density, $j_w$ (threshold), multiplied by $A_H$, $A_H$ being directly proportional to $W_{sot}$. If $W_{sot}$ is greater than L, the current flowing through the portion of the SOT write line 70 that is not in direct contact with the free region 10 may not contribute to switching and the switching efficiency may thus be low or insufficient. If $W_{sot}$ is less than L, the portion of the free region 10 that is not in direct contact with the SOT write line 70 may not experience spin-orbit torque, also resulting in a low switching efficiency. Therefore, the most energy efficient writing may be obtained when $W_{sot}$ is approximately equal to L. The exemplary embodiment illustrated in FIGS. 12A-12C may achieve an SOT write line 70 having a width that is approximately equal to the length of the MTJ 321 (i.e., $W_{sot}$=L), resulting in energy-efficient writing in the SOT MRAM.

Similar to the discussion above with reference to FIGS. 5A-5C, the same memory cell architecture, or a memory cell architecture that is substantially similar to the memory cell architecture illustrated in FIGS. 12A-12C may be used but with the magnetization directions of the regions 30 and 10 being parallel to the SOT write line plane as well as to the SOT switching current 95, or being orthogonal to the SOT write line plane as well as to the SOT switching current 95. Again, these latter configurations may lead to a non-deterministic (of less-deterministic), high-current switching of the free regions 10 (i.e., significant parts of the free region 10 failing to switch or a strong switching current being necessary to fully switch the free region 10), compared to the configuration explicitly shown in FIGS. 12A-12C. Therefore, the configuration explicitly shown in FIGS. 12A-12C may be preferred. Nonetheless, any of these configurations may be used in the magnetoresistive device of the current disclosure.

With renewed reference to FIG. 12B, free region 10 may be in contact with or positioned proximate to the SOT write line 70, so that the switching current 95 (i.e., a write current) driven through the SOT write line 70 may impart a spin torque to the proximately-positioned free region 10. The magnetization direction of the free region 10 may be dependent on the direction of the switching current 95. For example, as shown in FIG. 12B, if the switching current 95 is driven toward right, the magnetization direction of the free region 10 may be pointing out of the page, indicated by the symbol comprising a dot enclosed in a circle in the free region 10. Conversely, if the switching current 95 is driven toward left, the magnetization direction of the free region 10 may be pointing into the page, indicated by the symbol comprising an X enclosed in a circle in the free region 10.

As discussed above with reference to FIGS. 2A-2B, encapsulation layers 15 may be formed on opposing ends of the free region 10. Notably, the encapsulation layers 15 may be formed such that the encapsulation layer plane may be orthogonal to the magnetization direction of the free region 10 (and also of the fixed region 30) and to the SOT write line plane, as shown in FIG. 12C. In one embodiment, the capsulation layers 15 may be formed on opposing ends of the SOT write line 70, free region 10, intermediate region 20, and fixed region 30. Each encapsulation layer 15 may be formed as a continuous layer covering substantially the entire adjoining surfaces of the SOT write line 70 and regions 10, 20, and 30. Further, in some embodiments, the encapsulation layers 15 may also cover the entire adjoining surfaces of the top electrode 45. Each encapsulation layer 15 may thus be formed as a continuous layer covering the entire adjoining surfaces of the SOT write line 70, regions 10, 20, and 30, and top electrode 45, as shown in FIG. 12C. For example, the encapsulation layers 15 may be formed on the shorter sides of the SOT write line 70, MTJ 321, and the top electrode 45 (i.e., the sides corresponding to width (W) of the free region 10), once the SOT write line 70, MTJ 321, and top electrode 45 are patterned to desired dimensions by etching. As shown in FIG. 12C, the width of the SOT write line 70 ($W_{sot}$) may be approximately the same as the length of the free region 10 (or of the MTJ 321) (i.e., $W_{sot} \approx L$). A bit line 50 may be formed on or above the top electrode 45 and the encapsulation layers 15. As alluded to above, the bit line 50 may provide a read signal through the MTJ 321 to determine a magnetic state of the MTJ 321, based on the voltage drop or the current measured across the MTJ 321.

FIG. 13A illustrates a plan view of a portion of a magnetoresistive device including the exemplary magnetoresistive stack of the present disclosure. FIG. 13B illustrates a cross-sectional view of a portion of a magnetoresistive device including the exemplary magnetoresistive stack of the present disclosure, along the plane 10-10 shown in FIG. 13A. FIG. 13C illustrates another cross-sectional view of a portion of a magnetoresistive device including the exemplary magnetoresistive stack of the present disclosure, along the plane 11-11 shown in FIG. 13A. In particular, a portion of the magnetoresistive device 2000 illustrated in FIGS. 13A-13C includes a horizontal array of memory cells 300 discussed above with reference to FIGS. 12A-12C. Further, each memory cell 300 depicted in FIGS. 13A-13C is a one-transistor, one-diode, one-MTJ memory cell including the exemplary magnetoresistive stack discussed in reference to FIGS. 2A-2B. In the discussion below, reference will be made to FIGS. 13A-13C.

As shown in FIG. 13A, each horizontal array of memory cells in the exemplary magnetoresistive device 2000 may include multiple memory cells 300 spaced apart from each other horizontally. As would be known to a person of ordinary skill in the art, the exemplary magnetoresistive device 2000 may include any number of such horizontal arrays arranged in rows to form a memory array. As alluded to above with reference to FIG. 12A, each memory cell 300 may measure approximately 50-120 nm in width ($W_{cell}$) and 50-120 nm in length ($L_{cell}$). More particularly, in one embodiment, each memory cell 300 may measure approximately 60 nm in width ($W_{cell}$) and 84 nm in length ($L_{cell}$). Each memory cell 300 may include an MTJ 321 formed in an in-plane magnetoresistive stack configuration discussed above with reference to FIGS. 12B-12C. As shown in FIG. 13B, MTJ 321 may be positioned between a top electrode 45 coupled to a bit line 50 and an SOT write line 70. In particular, the free region 10 of the MTJ 321 may be formed on or proximate to the SOT write line 70, such that the switching current provided through the SOT write line 70 may impart a spin torque to the free region 10, to switch the magnetization direction of the free region 10. Intermediate region 20 may be formed on or above the free region 10, and fixed region 30 may be formed on or above the intermediate region 20. The fixed region 30 may be connected to a bit line 50, via a top electrode 45 positioned therebetween. In FIG. 13A, the bit line 50 and/or the top electrode 45 are not shown so as to not obscure the MTJ 321 formed on the SOT write line 70. The stack configuration including the bit line 50 and the top electrode 45 is more clearly shown in FIGS. 13B-13C. In some embodiments, as illustrated in FIG. 13B, a diode 40 may be formed between the fixed region 30 and the top electrode 45, to prevent sneak current (e.g., current traveling through and/or along unintended pathways), which may degrade the read current strength. In some embodiments, the diode 40 may be a thin film diode (TFD) formed on (or above) the fixed regions 30 and connected to the top electrode 45. Diode 40 may be any type of diode however, including but not limited to metal-insulator-metal (MIM) diode or P-N junction diode. The top electrode 45 may be connected to the bit line 50, from which a read signal is provided to determine the magnetic state of the MTJ 321. By controlling the voltages applied to the supply lines (i.e., bit line 50, source line 90, word line 60, etc.), a read current may be generated and may travel from the bit line 50 through the MTJ 321, in order to determine the resistive state of the MTJ 321 (e.g., parallel/low-resistance or anti-parallel/high-resistance), for example, during a read operation. Further, each bit line 50 may be connected to MTJs 321 of all the (or multiple) memory cells (e.g., by way of top electrodes 45 and diodes 40) positioned along the corresponding column in the memory array.

As discussed above, the SOT write line 70 may be in contact with or positioned proximate to the free regions 10 of all the MTJs 321 in the horizontal array. In each memory cell 300, the SOT write line 70 may be connected to the drain D of a transistor 80 by way of via 75. In one embodiment, as shown in FIGS. 13A-13C, the transistor 80 may be a fin field-effect transistor (i.e., FinFET). As would be known to a person of ordinary skill in the art, FinFET is a nonplanar (i.e., three-dimensional), double-gate transistor built on a substrate (e.g., silicon on insulator). In FIG. 13B, via 75, which is in contact with the SOT write line 70 at one end (e.g., top end of the via 75 in FIG. 13B), appears to be in contact with word line 60 at the other end (e.g., bottom end of the via 75 in FIG. 13B). However, this is because the contact point between the bottom end of the via 75 and the transistor 80 is obscured by the word line 60 in FIG. 13B. In reality, the bottom end of the via 75 may actually be in contact with the drain of the transistor 80, as shown in FIG. 13C.

Continuing with reference to FIG. 13C, encapsulation layers 15 may be formed in a manner similar to the description provided with reference to FIG. 12C. For example, the encapsulation layers 15 may be formed vertically, over the opposing ends of the portion of the magnetoresistive stack including the SOT write line 70, MTJ 321, diode 40, and top electrode 45. Each capsulation layer 15 may be formed as a continuous layer covering substantially the entire adjoining surfaces of the SOT write line 70, free region 10, intermediate region 20, fixed region 30, diode 40, and top electrode 45. The width of the SOT write line 70 may approximately equal the length of the free region 10 (or of the MTJ 321) (i.e., $W_{sot} \approx L$). Word line 60 may be in contact with the gate of the transistor 80. As discussed above, a voltage may be applied to word line 60 to "turn on" the transistor 80 to pass a current through. Further, word line 60 may be in contact with the gates G of the transistors 80 of all the memory cells in the horizontal array (e.g., FIGS. 13A-13B). Therefore, applying a voltage to the word line 60 may activate/select the horizontal array for an operation, by "turning on" all the transistors 80 in the horizontal array. Further with reference to FIG. 13C, source line 90 may be in electrical contact with the source S of the transistor 80, by way of an interconnect 43 (e.g., electrode, via, etc.) connected between the source line 90 and the source of the transistor 80. A suitable source line voltage may be applied to one or more source lines 90 in the horizontal array to drive a current through a desired portion of the SOT write line 70, in order to switch the magnetization direction of a target free region 10 during, for example, a write or a reset/set operation. Each source line 90 may be connected to the sources of the transistors 80 of all the (or multiple) memory cells positioned along the corresponding column in the memory array.

It should be noted that although FIGS. 13A-13C each illustrate just four memory cells 300 in a horizontal array, this is only for the sake of simplicity and clarity. As will be known to a person of ordinary skill in the art, any number of memory cells 300 may be included in a horizontal array. Further, the resultant magnetoresistive device may include any number of such horizontal arrays arranged in rows.

Methods of fabricating an exemplary magnetoresistive device 2000 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive device remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 14 is a flow chart of a method 1400 of fabricating an exemplary magnetoresistive device 2000 of the present disclosure. FIGS. 15A-15H are schematic cross-sectional views of the magnetoresistive device 2000 at various stages of the fabrication process. FIGS. 15AA, 15CC, 15FF, 15GG, and 15HH illustrate plan views of the magnetoresistive device 2000 at corresponding stages of the fabrication process. In the description below, reference will be made to FIG. 14, FIGS. 15A-15H, and FIGS. 15AA, 15CC, 15FF, 15GG, and 15HH. For the sake of brevity, conventional manufacturing techniques related to semiconductor processing, and processing steps that are similar to those in the previously described methods (e.g., method 700 and method 1100), may not be described in detail in the following sections. Further, the fabrication processes of the SOT write line 70 and the vias 75 over the IC 95, which are described above with reference to FIGS. 8A-8D, may equally apply to method 1400, and therefore may not be described again in the following sections.

After SOT write line 70 is formed (e.g., step 740 of FIG. 7), multiple layers of materials (e.g., free region 10, intermediate region 20, fixed region 30, diode 40, top electrode 45, in order) may be sequentially formed or deposited on the SOT write line 70 to form a multi-layer stack (step 1410). FIG. 15A illustrates the multi-layer stack formed on the SOT write line 70 in one exemplary embodiment. FIG. 15AA illustrates a plan view of the structure formed in step 1410 and FIG. 15A, showing the exposed surface of the multi-layer stack (i.e., exposed surface of the top electrode 45).

Figure 15B:
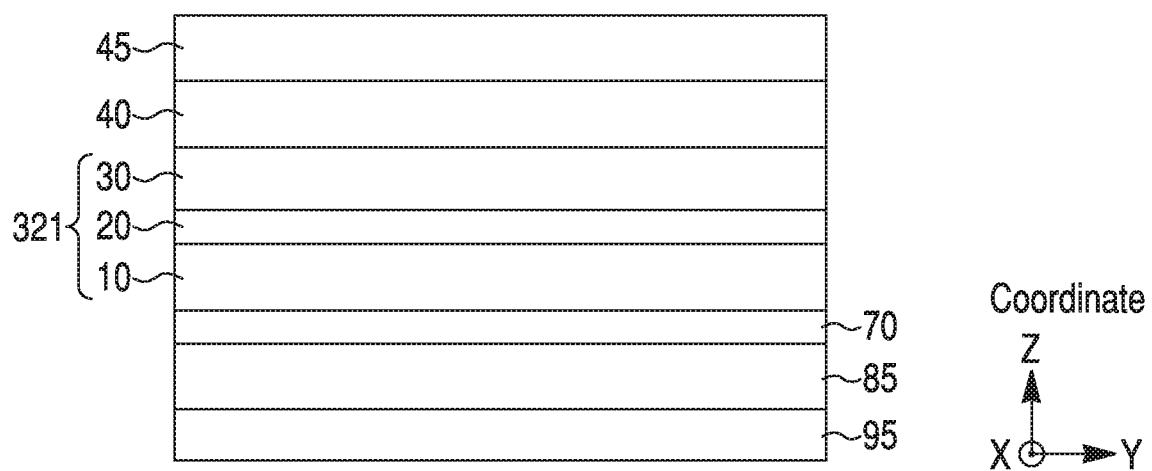

FIG. 15B illustrates another schematic cross-sectional view of the multi-layer stack, along the plane 12-12 shown in FIG. 15A. Notably, as suggested by the SOT write line 70 deposited uniformly over the insulator region 85 in FIG. 15B, pre-patterning of the SOT write line 70 on the insulator region 85 may not be necessary during the fabrication process of the magnetoresistive device 2000. As discussed above with respect to step 710, any now-known or later-developed technique may be used to deposit or form the multi-layer stack (e.g., physical vapor deposition (PVD), chemical vapor deposition (CVD), atomic layer deposition (ALD), etc.).

Figure 15C:
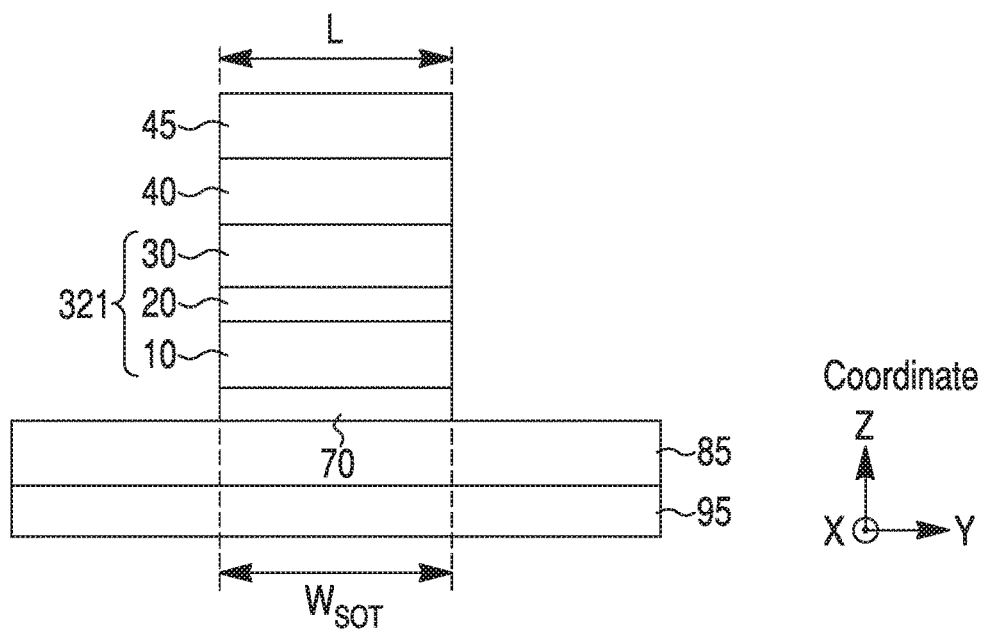
Figure 15C:
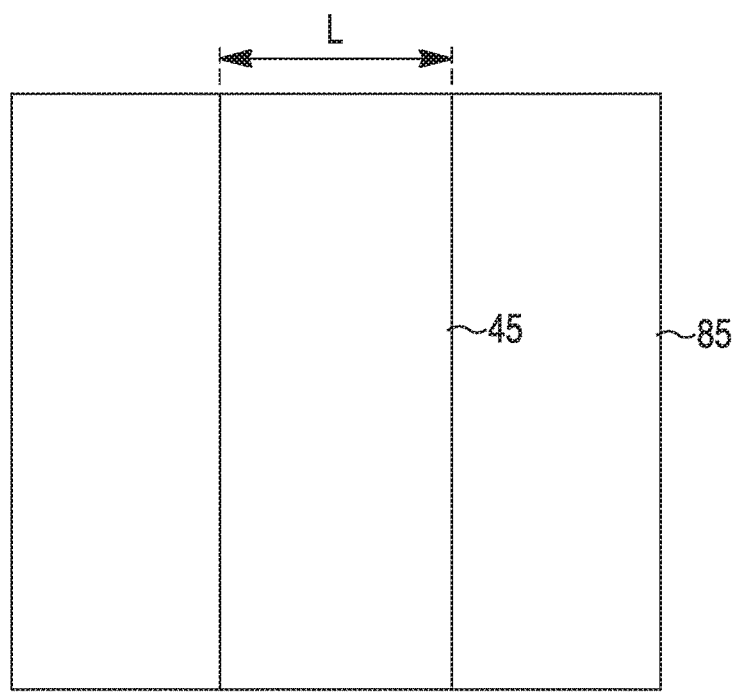

The multi-layer stack (including free region 10, intermediate region 20, fixed region 30, diode 40, and top electrode 45) and the SOT write line 70 may then be etched sequentially in one direction (i.e., in the direction of the x-axis), to form a line of multi-layer stack and SOT write line 70 stacked one on top of another and conforming to the desired length of the MTJ 321 (or of the free region 10) (e.g., L≈25 nm) (step 1420). Notably, the multi-layer stack and the SOT write line 70 may be etched such that the width of the resultant SOT write line 70 ($W_{sot}$) may approximately equal the length of the resultant MTJ 321 (or of the free region 10) (L) (e.g., $W_{sot}$≈L), as discussed above with reference to FIG. 12C. Further, the multi-layer stack and the SOT write line 70 may be etched sequentially until the top surfaces of the insulator region 85 is exposed. FIG. 15C illustrates the multi-layer stack and the SOT write line 70 etched in one direction. FIG. 15CC illustrates a plan view of the etched multi-layer stack and the SOT write line 70. More particularly, the plan view of FIG. 15CC better illustrates the line of multi-layer stack and SOT write line 70 formed along the x-axis. As discussed above with respect to step 720, any suitable etching process may be used to etch the multi-layer stack and the SOT write line 70 (e.g., reactive ion etching (RIE), ion beam etching (IBE), etc.).

Figure 15D:
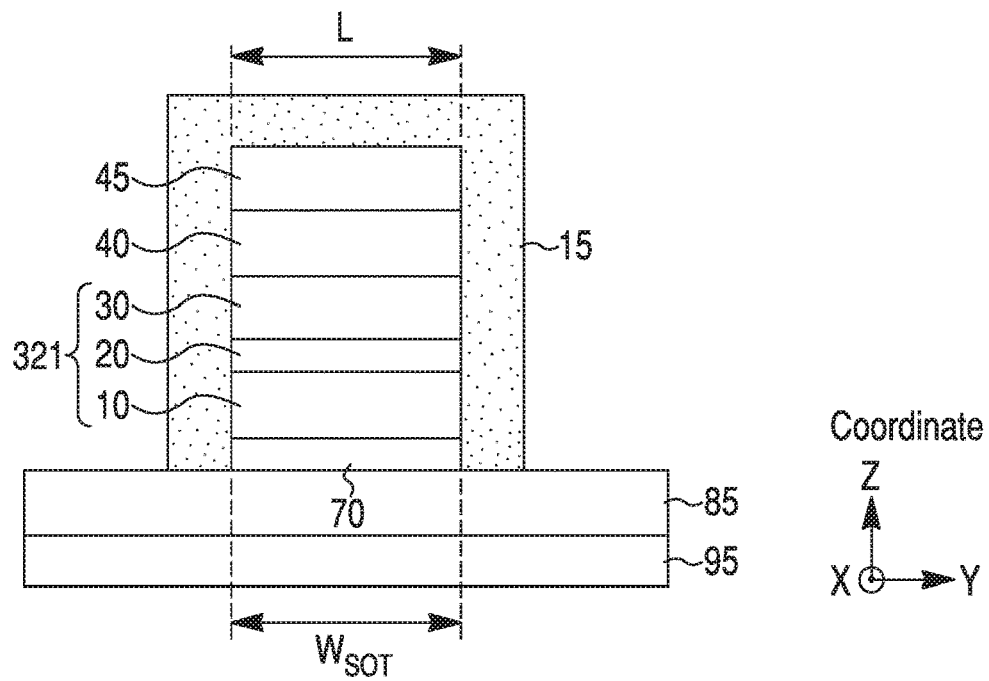

Once the multi-layer stack and SOT write line 70 are etched in one direction, an encapsulation layer 15 may be formed or deposited over the exposed surfaces of the multi-layer stack and SOT write line 70 (step 1430). FIG. 15D illustrates the encapsulation layer 15 formed over the etched multi-layer stack and SOT write line 70 (i.e., forming a coated line of multi-layer stack and SOT write line 70). As discussed above with respect to step 710, any now-known or later-developed technique may be used to deposit or form the encapsulation layer 15 (e.g., physical vapor deposition (PVD), chemical vapor deposition (CVD), atomic layer deposition (ALD), etc.). Then, additional encapsulant 85' may be deposited on the periphery of the coated line of multi-layer stack and SOT write line 70, over the exposed surfaces of the insulator region 85 (at step 1440).

There may be an alternative method to the etching process discussed above in reference to steps 1420 and 1430. In this alternative method, the multi-layer stack may be etched to form a line of multi-layer stack with a desired length (e.g., L≈25 nm), until the top surfaces of the SOT write line 70 are exposed. Then, an encapsulation layer 15 may be formed or deposited over the exposed surfaces of the multi-layer stack. The SOT write line 70 may then be patterned via self-aligned etching by using the encapsulation layer 15 as the side-wall hard mask, to form a line of SOT write line 70 with a desired width, $W_{SOT}$. In this case, the width of the SOT write line 70 may approximately equal the sum of the length of the free region 10 (L) and the thickness of the encapsulation layers 15 formed over the sides of the stack ($2T_{enc}$) $W_{sot}$≈L+$2T_{enc}$). Therefore, a cross-sectional view of the resultant structure may look like the cross-sectional view depicted in FIG. 8I, instead of FIG. 15D or FIG. 15E. This structure may lead to high switching efficiency even when the edge of SOT write line 70 is damaged during patterning and has low spin Hall angle, as the damaged area of SOT write line 70 would not be in contact with the free region 10.

Figure 15E:
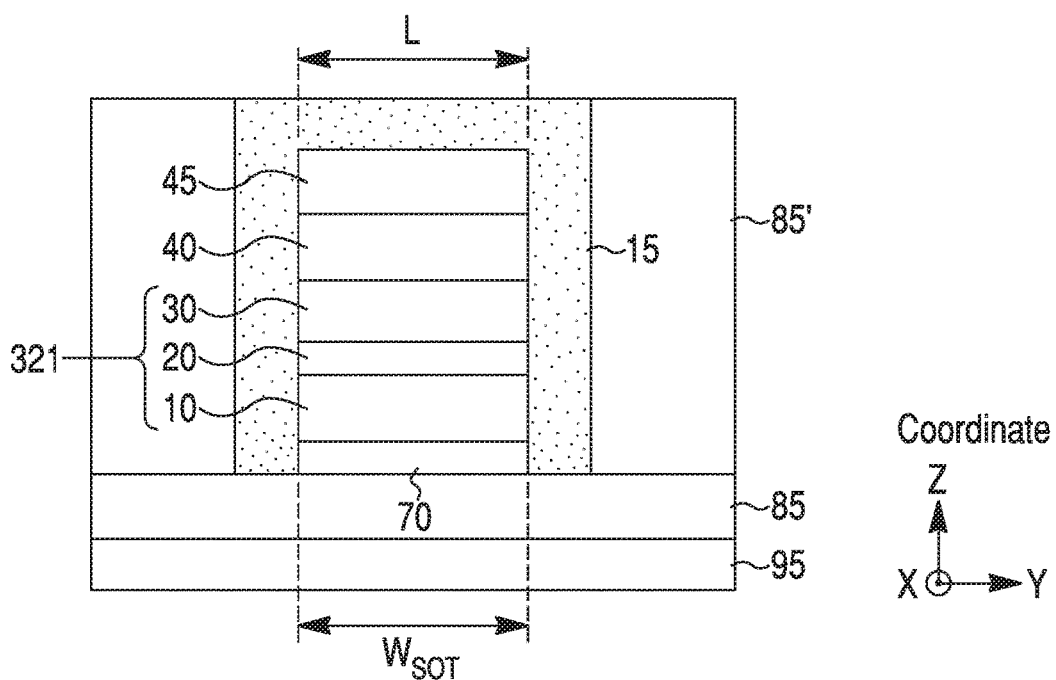

FIG. 15E illustrates the additional encapsulant 85' deposited on the periphery of the coated line of multi-layer stack and SOT write line 70. As discussed above with respect to step 710, any now-known or later-developed technique may be used to deposit or form the additional encapsulant 85' (e.g., physical vapor deposition (PVD), chemical vapor deposition (CVD), atomic layer deposition (ALD), etc.).

Figure 15F:
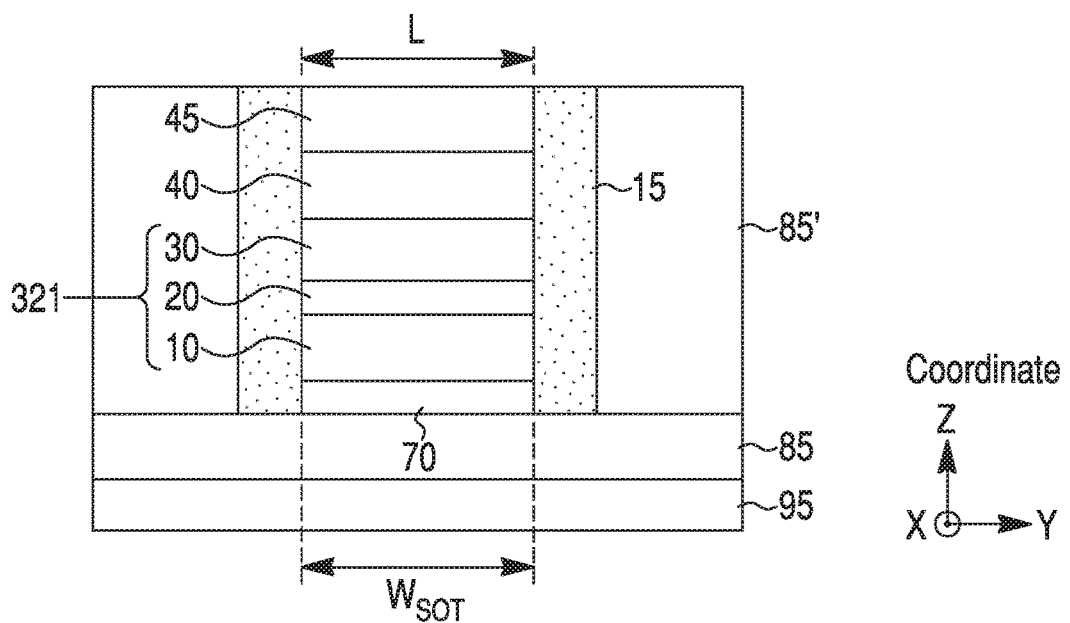
Figure 15F:
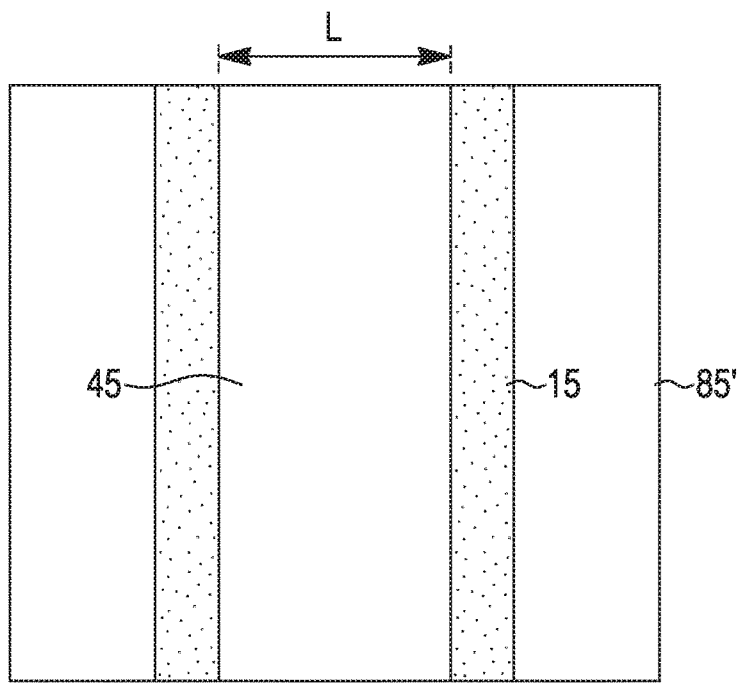

The exposed surfaces of the encapsulation layer 15 and the additional encapsulant 85' may then be polished until the top electrode 45 of the multi-layer stack is exposed (step 1450). FIG. 15F illustrates the exposed top electrode 45 of the multi-layer stack after a suitable polishing process. FIG. 15FF illustrates a plan view of the structure formed in step 1450 and FIG. 15F. Any known process may be used to polish the encapsulation layer 15 and the additional encapsulant 85'. In some embodiments, a technique, such as, e.g., chemical mechanical polishing (CMP) may be used to polish the encapsulation layer 15 and the additional encapsulant 85'. Since CMP processes are known in the art, they are not described herein.

Figure 15G:
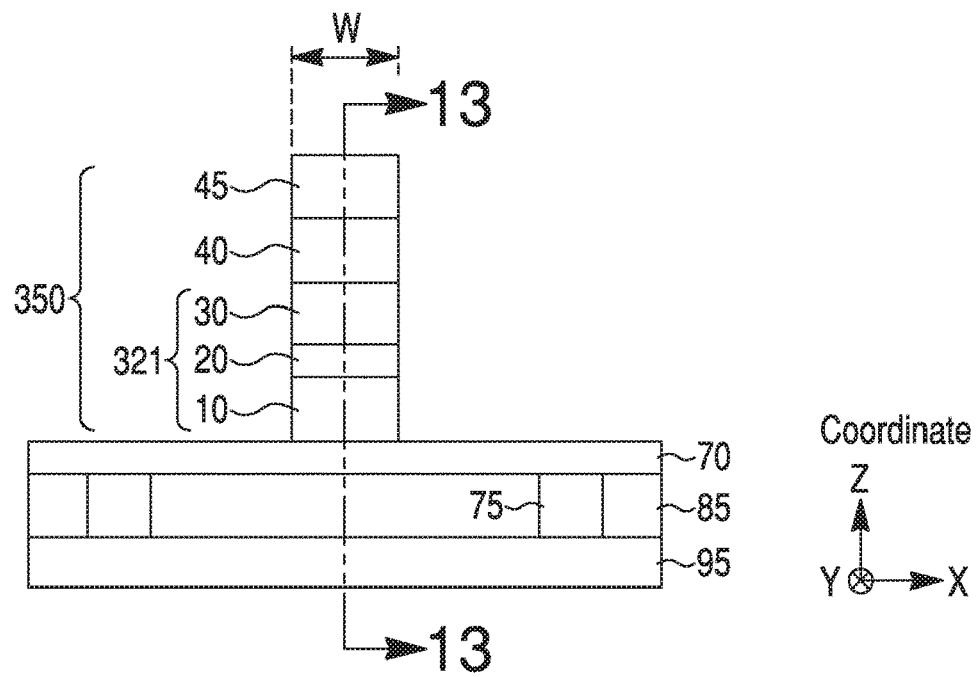
Figure 15G:
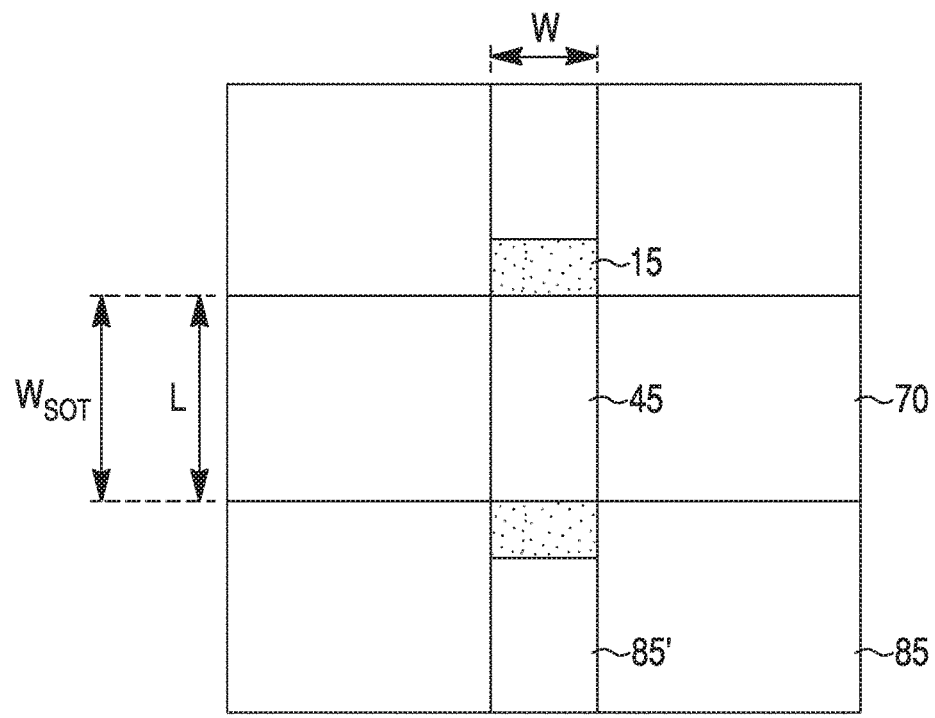
Figure 15H:
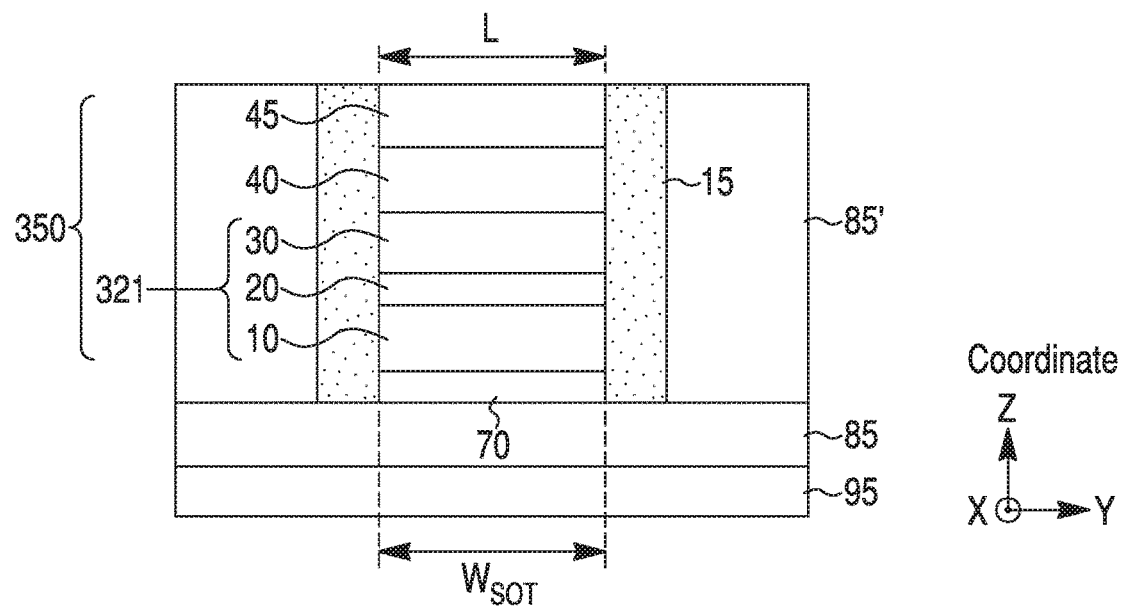
Figure 15H:
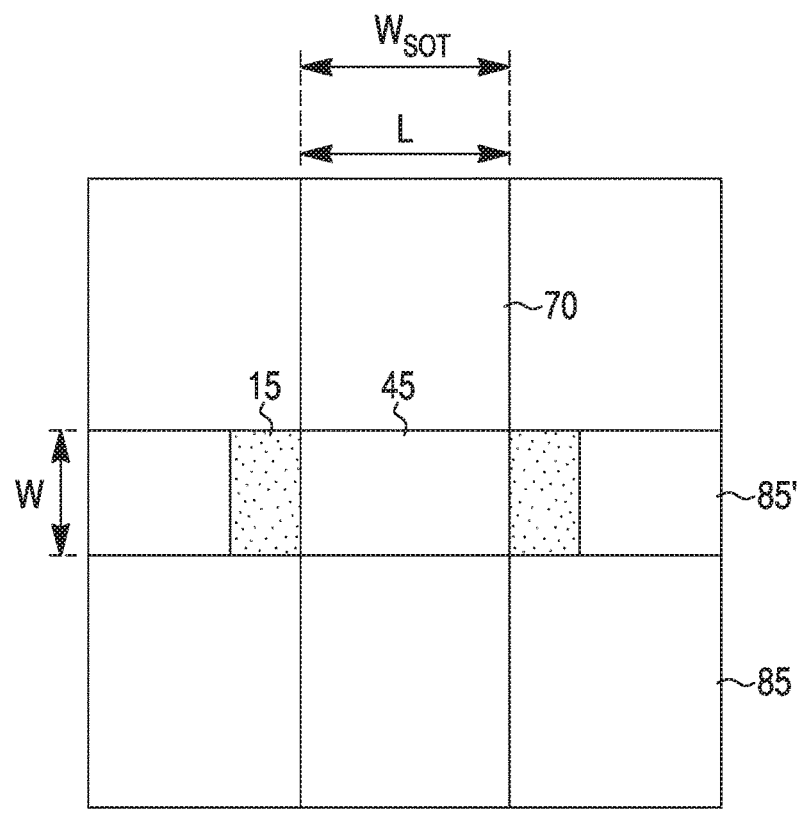

The multi-layer stack, along with the surrounding encapsulation layer 15 and additional encapsulant 85', may then be etched in another direction (i.e., in the direction of the y-axis), to form a size-adjusted stack 350 (step 1460). More particularly, two opposing sides of the multi-layer stack may be etched in the direction of the y-axis until the SOT write line 70 is exposed, to achieve a desired width (W) of the free region 10 (e.g., W≈6-16 nm). In this case, the additional encapsulant 85' may be remained around the SOT write line 70 (as shown in FIGS. 15GG, 15H, and 15HH). Thus, in the exemplary fabrication method 1400, the size-adjusted stack 350 may be formed after a two-step etching process, which includes the etching process described in step 1420 (to achieve a desired length (L)) and the etching process described in step 1460 (to achieve a desired width (W)). FIG. 15G illustrates the multi-layer stack etched to a desired width (i.e., size-adjusted stack 350). FIG. 15H illustrates another schematic cross-sectional view of the size-adjusted stack 350, along the plane 13-13 shown in FIG. 15G. FIGS. 15GG and 15HH illustrate plan views of the size-adjusted stack 350 formed after the two-step etching process, corresponding to FIGS. 15G and 15H respectively. As discussed above with respect to step 720, any suitable etching process may be used to etch the multi-layer stack (e.g., reactive ion etching (RIE), ion beam etching (IBE), etc.).

As discussed above with respect to step 780 and FIG. 8I, additional processing steps may be performed (e.g., BEOL processing) to form a magnetoresistive device from the structure formed in accordance with exemplary method 1400. Because these additional processing steps are known to those of ordinary skill in the art, they are not described in detail herein for the sake of brevity.

FIG. 19A illustrates a plan view of a portion of a magnetoresistive device including an exemplary magnetoresistive stack of the present disclosure. FIG. 19B illustrates a cross-sectional view of a portion of a magnetoresistive device including an exemplary magnetoresistive stack of the present disclosure, along the plane 14-14 shown in FIG. 19A. In particular, FIGS. 19A-19B illustrate a magnetoresistive device 3000 that uses a read selection transistor 42 instead of the diode 40 used in the magnetoresistive devices 1000 and 2000 illustrated in FIGS. 6A-6C and FIGS. 13A-13C, respectively. The use of the read selection transistor 42 may substantially increase the signal-to-noise ratio compared to the case using the diode 40, which in turn may lead to a higher speed reading. For the sake of brevity, various components of a magnetoresistive device that are already discussed with reference to FIGS. 6A-6C and FIGS. 13A-13C are not described again. In particular, the MTJ 321 and the encapsulation layer 15 described with reference to FIGS. 5A-5C, FIGS. 6A-6C, FIGS. 12A-12C, and FIGS. 13A-13C may also be used in the magnetoresistive device 3000. Therefore, the concepts and configurations of the MTJ 321 and the encapsulation layer 15 discussed above may equally apply to the magnetoresistive device 3000. In some embodiments, via 77 may be used to connect the drain of the read selection transistor 42 to a top electrode 45 connected to the MTJ 321 in the magnetoresistive device 3000. In some embodiments, each memory cell 400 of the magnetoresistive device 3000 may measure approximately 144 nm in width ($W_{cell}$) and 228 nm in length ($L_{cell}$).

Table 1 below lists exemplary dimensions and parameters representative of a typical MTJ 321 of an SOT MRAM. For example, these exemplary dimensions and parameters may be used in fabricating the exemplary magnetoresistive devices 1000, 2000, and 3000 of the present disclosure. However, these dimensions and parameters are presented in a non-limiting manner, and a magnetoresistive device fabricated using the method of the present disclosure may have any dimensions and/or parameters.

TABLE 1

| | |
|---|---|
| Free Layer Length (L) | 25 nm |
| Free Layer Width (W) | 10 nm |
| Free Layer Thickness (T) | 10 nm |
| Thickness of SOT Write Line Made of Tungsten (W) ($T_{sot}$) | 5 nm |
| Width of SOT Write Line Made of Tungsten (W) ($W_{sot}$) | 30 nm |
| Thermal Stability Factor at Room Temperature (Eb/kT at RT) | 75 |
| Contact Area between Free Layer and SOT Write Line ($A_F$) | 250 nm$^2$ |
| Cross Sectional Area of SOT Write Line Made of Heavy Metal ($A_H$) | 150 nm$^2$ |
| Gilbert Damping Constant of Free Layer ($\alpha_{damping}$) | 0.01 |
| Effective Spin Hall Angle of SOT Write Line Made of β-Tungsten ($\theta_{SH}^{eff}$) | 0.33 |
| Critical Switching Current by Spin-Orbit-Torque ($I_{c0}^{SOT}$) | 34 μA |
| Switching Current with 50% Switching Probability at Room Temperature using 20 ns-width pulse ($I_c$ at 20 ns) | 27 μA |
| Writing Current at Room Temperature for Adequate Writing Error ($I_w$) | 38 μA |

FIG. 16A shows a graph illustrating the relationship between a dimension (diameter) of a free region and a thermal stability parameter (Eb/kT) that is indicative of thermal stability of an MTJ bit comprising the free region, in one embodiment. In particular, the graph in FIG. 16A is based on a cylindrical-shaped free region made of an amorphous metallic alloy (i.e., amorphous iron boride) $Fe_{75}B_{25}$, with a thickness of approximately 20 nm (i.e., t≈20 nm) and a saturation magnetization of approximately 1194 emu/cc (i.e., Ms≈1194 emu/cc). The x-axis of FIG. 16A indicates the diameter of the free region and the y-axis indicates the calculated value of the thermal stability parameter (i.e., thermal stability factor) at room temperature. Line 160 indicates a desired thermal stability (e.g., for efficient operation) for the MTJ bit in one embodiment.

As would be recognized by a person of ordinary skill in the art, thermal stability is an important factor in determining the usable life (such as, for example, expected data retention time) of a magnetoresistive device. A thermal stability factor, denoted as Eb/kT (where Eb represents the energy barrier between two stable states of an MTJ cell, k the Boltzmann constant, and T the absolute temperature) may be indicative of the thermal stability (and therefore, usable life) of a magnetoresistive device, such as, e.g., devices 1000, 2000, and 3000 of the present disclosure. In one embodiment, a desired value of the thermal stability factor may be set to Eb/kT=75, which is indicated by a dotted line 160 in the graph of FIG. 16A. Line 170 represents a thermal stability factor attributable to the shape anisotropy induced in a free region conforming to certain dimensions. Based on line 170, the diameter of the free region may be configured to fall within region 150, which may be a region that is representative of an optimal size (i.e., optimal diameter of the free region) and an optimal thermal stability factor. In view of line 170 and region 150, based on the shape anisotropy alone, the desired thermal stability factor (Eb/kT=75) may be achieved with a free region measuring approximately from 8 nm to 13 nm in diameter. However, the desired thermal stability factor may be achieved with a free region that may be smaller (or larger), by adding encapsulation layers 15 to the free region to further induce an interface perpendicular anisotropy. Line 180 represents a thermal stability factor attributable to the interface perpendicular anisotropy induced by adding the encapsulation layers 15. Line 190 represents a thermal stability factor that may be achieved by the combined effects of the shape anisotropy and the interface perpendicular anisotropy (i.e., a total thermal stability factor). By inducing both the shape anisotropy and the interface perpendicular anisotropy in the free region 10, the desired thermal stability factor can be achieved with a free region 10 that is substantially smaller in size, as suggested by line 190 in FIG. 16A. When projected to the rectangular parallelepiped-shaped, in-plane MTJ 321 (or free region 10) of the present disclosure, a free region 10 measuring approximately 20 nm in length (L) (i.e., L≈20 nm) and approximately from 7 nm to 12 nm in width (W) and thickness (T) (i.e., W≈T≈7-12 nm) may provide enough energy barrier (Eb) to achieve the desired thermal stability factor.

FIG. 16B shows another graph illustrating the relationship between a dimension (diameter) of a free region and a thermal stability parameter (Eb/kT) that is indicative of thermal stability of an MTJ bit comprising the free region, in another embodiment. The graph in FIG. 16B is also based on a cylindrical-shaped free region made of an amorphous metallic alloy (i.e., amorphous iron boride) $Fe_{75}B_{25}$, but with a thickness of approximately 25 nm (i.e., t=25 nm) and a saturation magnetization of approximately 1194 emu/cc (i.e., Ms=1194 emu/cc). The x-axis of FIG. 16B indicates the diameter of the free region and the y-axis indicates the calculated value of the thermal stability parameter (i.e., thermal stability factor) at room temperature. Line 160 indicates a desired thermal stability factor of 75 (i.e., Eb/kT=75).

As discussed above with reference to FIG. 16A, line 170 represents a thermal stability factor attributable to the shape anisotropy induced in a free region conforming to certain dimensions. In the case of the graph in FIG. 16B, the thickness of the free region may be approximately 25 nm (i.e., t≈25 nm), compared to the approximately 20 nm-thick free region discussed above with reference to FIG. 16A. Based on line 170, the diameter of the free region may be configured to fall within region 150, which may be a region that is representative of an optimal size (i.e., optimal diameter of the free region) and an optimal thermal stability factor. In view of line 170 and region 150, based on the shape anisotropy alone, the desired thermal stability factor (Eb/kT=75) may be achieved with a free region measuring approximately from 7 nm to 16 nm in diameter. However, as discussed above with reference to FIG. 16A, the desired thermal stability factor may be achieved with a free region that may be smaller in size, by adding encapsulation layers 15 to the free region to further induce an interface perpendicular anisotropy. Line 180 represents a thermal stability factor attributable to the interface perpendicular anisotropy induced by adding the encapsulation layers 15. Line 190 represents a total thermal stability factor that may be achieved by the combined effects of the shape anisotropy and the interface perpendicular anisotropy. When projected to the rectangular parallelepiped-shaped, in-plane MTJ 321 (or free region 10) of the present disclosure, a free region 10 measuring approximately 25 nm in length (L) (i.e., L 25 nm) and approximately from 6 nm to 14 nm in width (W) and thickness (T) (i.e., W T 6-14 nm) may provide enough energy barrier (Eb) to achieve the desired thermal stability factor, when the saturation magnetization is approximately 1194 emu/cc.

FIG. 16C shows another graph illustrating the relationship between a dimension (thickness width) of a free region 10 of the present disclosure, and a thermal stability parameter (Eb/kT) that is indicative of thermal stability of an MTJ 321 including the free region 10, in one embodiment. The graph in FIG. 16C is based on a free region 10 contemplated by the present disclosure in one embodiment (i.e., a rectangular parallelepiped-shaped free region 10 with a thickness that approximately equals the width, and a length that is greater than the thickness or width), with a saturation magnetization of approximately 900 emu/cc (i.e., Ms≈900 emu/cc). The x-axis indicates the thickness (T) or width (W) of the free region 10 and the y-axis indicates the calculated value of the thermal stability parameter (i.e., thermal stability factor) at room temperature. Line 160 indicates the desired thermal stability (e.g., for efficient operation) for an MTJ 321 comprising the free region 10.

As discussed above with reference to FIGS. 16A-16B, a desired value of the thermal stability factor may be set to Eb/kT=75, which is represented by a dotted line 160 in the graph of FIG. 16C. Line 170' represents a thermal stability factor achieved by a free region 10 having an aspect ratio of 2.5. Notably, line 170' represents a thermal stability factor attributable solely to the shape anisotropy induced in the free region 10. In some embodiments, as indicated by line 170' in FIG. 16C (i.e., the line representing a thermal stability factor achieved by a free region 10 having an aspect ratio of 2.5), a free region 10 measuring approximately 11.2 nm in width (W) and thickness (T), and approximately 28 nm in length (L) (e.g., aspect ratio=L/W 2.5) may provide enough energy barrier (Eb) to achieve the desired thermal stability factor, when the saturation magnetization is approximately 900 emu/cc and the induced interface perpendicular anisotropy by the encapsulation layers 15 is small.

Based on FIGS. 16A-16B, desirable dimensions for the free region 10 may be considered based on two factors: (1) thermal stability factor due to shape anisotropy and (2) single domain coherent rotation for high switching efficiency. The hatched region in FIG. 16D represent the desirable dimensions, where enough data retention performance and high switching efficiency are expected.

It should be appreciated that the fabrication methods and processes described above are merely exemplary. In some embodiments, the method(s) may include a number of additional or alternative steps, and in some embodiments, one or more of the described steps may be omitted. Any described step may be omitted or modified, or other steps added, as long as the intended result and/or functionality of the subsequently formed magnetoresistive device remains substantially unaltered. Although a certain order is described or implied in the described method, in general, the steps of the described method need not be performed in the illustrated and described order. Further, the described method may be incorporated into a process of fabricating an MTJ bit for the described magnetoresistive device. Since the additional steps needed to form MTJ bits are known to those of ordinary skill in the art, they are not described herein. Additionally, the described method may be incorporated into a more comprehensive procedure or process having additional functionality not described herein.

As alluded to above, the magnetoresistive devices 1000, 2000, and 3000 may include a logic architecture or a memory architecture (among other architectures). For example, in magnetoresistive devices having a memory configuration, the MTJ bits may be electrically connected to access transistors (and/or other select device, e.g., a diode) and configured to couple or connect to various conductors, which may carry one or more control signals, as shown in FIGS. 17A and 17B. A read selection diode is used in the magnetoresistive memory architecture depicted in FIG. 17A, whereas a read selection transistor is used (instead of a read selection diode) in the magnetoresistive memory architecture depicted in FIG. 17B. Those conductors may be connected to various memory architecture or associated circuitry. The magnetoresistive devices may be used in any suitable application, including, e.g., in a memory configuration. In such instances, the magnetoresistive devices may be formed as integrated circuits comprising a discrete memory device (e.g., as shown in FIG. 18A) or an embedded memory device having a logic therein (e.g., as shown in FIG. 18B), each including MRAM, which, in one embodiment, is representative of one or more arrays of MRAM having a plurality of magnetoresistive stacks/structures, according to certain aspects of certain embodiments disclosed herein.

The present disclosure is drawn to, among other things, a magnetoresistive device comprising a magnetically fixed region; a magnetically free region positioned above or below the magnetically fixed region; an intermediate region positioned between the magnetically fixed region and the magnetically free region, wherein the intermediate region includes a first dielectric material; and encapsulation layers formed on opposing side walls of the magnetically free region, wherein the encapsulation layers include the first dielectric material.

In various aspects, the described magnetoresistive device may include one or more of the following features: the magnetically free region is positioned below the magnetically fixed region; the first dielectric material includes magnesium oxide (MgO); a width and a thickness of the magnetically free region are approximately the same; the magnetically free region is made of material having a large exchange stiffness constant; the encapsulation layers extend vertically beyond the side walls of the magnetically free region and cover at least a portion of side walls of the intermediate region; the magnetically free region and the encapsulation layers formed on the opposing sidewalls of the magnetically free region are rounded or oval-shaped; and an easy axis of magnetization of the magnetically free region is aligned with a longest dimension of the magnetically free region, the magnetically free region and the encapsulation layers produce an interfacial magnetic anisotropy perpendicular to an interface between the magnetically free region and the encapsulation layers, and the interfacial magnetic anisotropy and the easy axis of magnetization of the magnetically free region are approximately in a same direction.

In another aspect, the present disclosure is drawn to, among other things, a magnetoresistive memory comprising: a plurality of magnetoresistive devices, wherein each magnetoresistive device includes a magnetically fixed region, a magnetically free region, an intermediate region positioned between the magnetically fixed region and the magnetically free region, and encapsulation layers formed on opposing side walls of the magnetically free region, wherein the intermediate region and each of the encapsulation layers include magnesium oxide (MgO); and a first conductor extending adjacent each magnetoresistive device of the plurality of magnetoresistive devices, wherein the first conductor is in electrical contact with the magnetically free region of each magnetoresistive device, and wherein the encapsulation layers terminate at a surface of the first conductor.

In various aspects, the described magnetoresistive memory may include one or more of the following features: the first conductor is a spin-orbit-torque (SOT) write line; a length of the magnetically free region is smaller than a width of the first conductor; a width of the conductor is equal to or greater than a sum of a length of the magnetically free region and a total thickness of the encapsulation layers; the encapsulation layers extend vertically beyond the side walls of the magnetically free region and cover at least a portion of side walls of the intermediate region and at least a portion of side walls of the magnetically fixed region; and the magnetically free region is made of material having a large exchange stiffness constant.

In another aspect, the present disclosure is drawn to, among other things, a magnetoresistive memory comprising: a plurality of magnetoresistive devices, wherein each magnetoresistive device includes a magnetically fixed region, a magnetically free region, an intermediate region positioned between the magnetically fixed region and the magnetically free region, and encapsulation layers formed on opposing side walls of the magnetically free region, wherein the intermediate region and each of the encapsulation layers include a same dielectric material; and a first conductor extending adjacent each magnetoresistive device of the plurality of magnetoresistive devices, wherein the first conductor is in electrical contact with the magnetically free region of each magnetoresistive device, and wherein the encapsulation layers extend past an interface of a magnetoresistive device and the first conductor.

In various aspects, the described magnetoresistive memory may include one or more of the following features: the first conductor is made of spin Hall material; a length of the magnetically free region is equal to or greater than a width of the first conductor; a width of the first conductor is smaller than a sum of a length of the magnetically free region and a total thickness of the encapsulation layers; the encapsulation layers extend vertically beyond the side walls of the magnetically free region and cover at least a portion of side walls of the intermediate region and at least a portion of side walls of the magnetically fixed region; a width and a thickness of the magnetically free region are approximately the same; and the dielectric material includes magnesium oxide (MgO).

In another aspect, the present disclosure is drawn to, among other things, a magnetoresistive memory comprising: a plurality of magnetoresistive devices, wherein each magnetoresistive device includes a magnetically fixed region, a magnetically free region, an intermediate region positioned between the magnetically fixed region and the magnetically free region, and encapsulation layers formed on opposing side walls of the magnetically free region, wherein the intermediate region and the magnetically free region produce an interfacial magnetic anisotropy perpendicular to an interface between the intermediate region and the magnetically free region, and wherein the intermediate region and each of the encapsulation layers include a same dielectric material; and a first conductor extending adjacent each magnetoresistive device of the plurality of magnetoresistive devices, wherein the first conductor is in electrical contact with the magnetically free region of each magnetoresistive device.

In various aspects, the described magnetoresistive memory may include one or more of the following features: an easy axis of magnetization of the magnetically free region is aligned with a longest dimension of the magnetically free region; and the first conductor and the magnetically free region produce an interface magnetic anisotropy perpendicular to an interface between the first conductor and the magnetically free region.

In another aspect, the present disclosure is drawn to, among other things, a magnetoresistive memory comprising: a plurality of magnetoresistive devices, wherein each magnetoresistive device includes a magnetically fixed region, a magnetically free region, an intermediate region positioned between the magnetically fixed region and the magnetically free region, and encapsulation layers formed on opposing side walls of the magnetically free region, wherein the intermediate region and each of the encapsulation layers include a same dielectric material; and a first conductor extending adjacent each magnetoresistive device of the plurality of magnetoresistive devices, wherein the first conductor is in electrical contact with the magnetically free region of each magnetoresistive device, wherein a constantly-regulated current flows through the first conductor for write operations.

In various aspects, the described magnetoresistive memory may include one or more of the following features: the dielectric material is magnesium oxide (MgO); and a width and a thickness of the magnetically free region are approximately the same.

Although various embodiments of the present disclosure have been illustrated and described in detail, it will be readily apparent to those skilled in the art that various modifications may be made without departing from the present disclosure.

We claim:

1. A magnetoresistive device, comprising:
   a magnetically fixed region;
   a magnetically free region positioned above or below the magnetically fixed region;
   an intermediate region positioned between the magnetically fixed region and the magnetically free region, wherein the intermediate region includes a first dielectric material;
   encapsulation layers formed on opposing side walls of the magnetically free region, wherein the encapsulation layers include the first dielectric material;
   a conductor in electrical contact with the magnetically free region, wherein the encapsulation layers are substantially vertical relative to a plane of the conductor and terminate at an interface between the conductor and the magnetically free region, and wherein the magnetically free region and the encapsulation layers produce an interfacial magnetic anisotropy perpendicular to an interface between the magnetically free region and the encapsulation layers, the interfacial magnetic anisotropy and an easy axis of magnetization of the magnetically free region being approximately in a same direction;
   a top electrode positioned above the magnetically fixed region, wherein the encapsulation layers are formed vertically over opposing ends of the top electrode; and
   a diode positioned between the magnetically fixed region and the top electrode.

2. The magnetoresistive device of claim 1, wherein the magnetically free region is positioned below the magnetically fixed region.

3. The magnetoresistive device of claim 1, wherein the first dielectric material includes magnesium oxide (MgO).

4. The magnetoresistive device of claim 1, wherein a width and a thickness of the magnetically free region are approximately the same.

5. The magnetoresistive device of claim 1, wherein the magnetically free region is made of material having a large exchange stiffness constant.

6. The magnetoresistive device of claim 1, wherein the encapsulation layers extend vertically beyond the side walls of the magnetically free region and cover at least a portion of side walls of the intermediate region.

7. The magnetoresistive device of claim 1, wherein the magnetically free region and the encapsulation layers formed on the opposing sidewalls of the magnetically free region are rounded or oval-shaped.

8. The magnetoresistive device of claim 1, wherein the easy axis of magnetization of the magnetically free region is aligned with a longest dimension of the magnetically free region.

9. A magnetoresistive memory, comprising:
   a plurality of magnetoresistive devices, wherein each magnetoresistive device includes a magnetically fixed region, a magnetically free region, an intermediate region positioned between the magnetically fixed region and the magnetically free region, encapsulation layers formed on opposing side walls of the magnetically free region, a top electrode positioned above the magnetically fixed region, and a diode positioned between the magnetically fixed region and the top electrode, wherein the encapsulation layers are formed vertically over opposing ends of the top electrode, wherein the intermediate region and each of the encapsulation layers include magnesium oxide (MgO); and
   a first conductor extending adjacent each magnetoresistive device of the plurality of magnetoresistive devices, wherein the first conductor is in electrical contact with the magnetically free region of each magnetoresistive device, wherein the encapsulation layers are substantially vertical relative to a plane of the first conductor and terminate at an interface between the first conductor and the magnetically free region of each magnetoresistive device, and wherein the magnetically free region and the encapsulation layers produce an interfacial magnetic anisotropy perpendicular to an interface between the magnetically free region and the encapsulation layers, the interfacial magnetic anisotropy and an easy axis of magnetization of the magnetically free region being approximately in a same direction.

10. The magnetoresistive memory of claim 9, wherein the first conductor is a spin-orbit-torque (SOT) write line.

11. The magnetoresistive memory of claim 9, wherein a length of the magnetically free region is smaller than a width of the first conductor.

12. The magnetoresistive memory of claim 9, wherein a width of the conductor is equal to or greater than a sum of a length of the magnetically free region and a total thickness of the encapsulation layers.

13. The magnetoresistive memory of claim 9, wherein the encapsulation layers extend vertically beyond the side walls of the magnetically free region and cover at least a portion of side walls of the intermediate region and at least a portion of side walls of the magnetically fixed region.

14. The magnetoresistive memory of claim 9, wherein the magnetically free region is made of material having a large exchange stiffness constant.

15. A magnetoresistive memory, comprising:
a plurality of magnetoresistive devices, wherein each magnetoresistive device includes a magnetically fixed region, a magnetically free region, an intermediate region positioned between the magnetically fixed region and the magnetically free region, encapsulation layers formed on opposing side walls of the magnetically free region, a top electrode positioned above the magnetically fixed region, and a diode positioned between the magnetically fixed region and the top electrode, wherein the encapsulation layers are formed vertically over opposing ends of the top electrode, wherein the intermediate region and each of the encapsulation layers include a same dielectric material; and
a first conductor extending adjacent each magnetoresistive device of the plurality of magnetoresistive devices, wherein the first conductor is in electrical contact with the magnetically free region of each magnetoresistive device, and wherein the encapsulation layers extend past an interface of a magnetoresistive device and the first conductor.

16. The magnetoresistive memory of claim 15, wherein the first conductor is made of spin Hall material.

17. The magnetoresistive memory of claim 15, wherein a length of the magnetically free region is equal to or greater than a width of the first conductor.

18. The magnetoresistive memory of claim 15, wherein a width of the first conductor is smaller than a sum of a length of the magnetically free region and a total thickness of the encapsulation layers.

19. The magnetoresistive memory of claim 15, wherein the encapsulation layers extend vertically beyond the side walls of the magnetically free region and cover at least a portion of side walls of the intermediate region and at least a portion of side walls of the magnetically fixed region.

20. The magnetoresistive memory of claim 15, wherein the dielectric material includes magnesium oxide (MgO).

21. A magnetoresistive memory, comprising:
a plurality of magnetoresistive devices, wherein each magnetoresistive device includes a magnetically fixed region, a magnetically free region, an intermediate region positioned between the magnetically fixed region and the magnetically free region, encapsulation layers formed on opposing side walls of the magnetically free region, a top electrode positioned above the magnetically fixed region, and a diode positioned between the magnetically fixed region and the top electrode, wherein the encapsulation layers are formed vertically over opposing ends of the top electrode, wherein the intermediate region and each of the encapsulation layers include a same dielectric material; and
a first conductor extending adjacent each magnetoresistive device of the plurality of magnetoresistive devices, wherein the first conductor is in electrical contact with the magnetically free region of each magnetoresistive device, wherein the encapsulation layers are substantially vertical relative to a plane of the first conductor and terminate at an interface between the first conductor and the magnetically free region of each magnetoresistive device, and wherein the magnetically free region and the encapsulation layers produce an interfacial magnetic anisotropy perpendicular to an interface between the magnetically free region and the encapsulation layers, the interfacial magnetic anisotropy and an easy axis of magnetization of the magnetically free region being approximately in a same direction.

22. The magnetoresistive memory of claim 21, wherein the easy axis of magnetization of the magnetically free region is aligned with a longest dimension of the magnetically free region.

23. The magnetoresistive memory of claim 21, wherein the first conductor and the magnetically free region produce an interface magnetic anisotropy perpendicular to an interface between the first conductor and the magnetically free region.

24. A magnetoresistive memory, comprising:
a plurality of magnetoresistive devices, wherein each magnetoresistive device includes a magnetically fixed region, a magnetically free region, an intermediate region positioned between the magnetically fixed region and the magnetically free region, encapsulation layers formed on opposing side walls of the magnetically free region, a top electrode positioned above the magnetically fixed region, and a diode positioned between the magnetically fixed region and the top electrode, wherein the encapsulation layers are formed vertically over opposing ends of the top electrode, wherein the intermediate region and each of the encapsulation layers include a same dielectric material; and
a first conductor extending adjacent each magnetoresistive device of the plurality of magnetoresistive devices, wherein the first conductor is in electrical contact with the magnetically free region of each magnetoresistive device, wherein the encapsulation layers are substantially vertical to a plane of the first conductor and terminate at an interface between the first conductor and the magnetically free region of each magnetoresistive device, wherein a constantly-regulated current flows through the first conductor for write operations, and wherein the magnetically free region and the encapsulation layers produce an interfacial magnetic anisotropy perpendicular to an interface between the magnetically free region and the encapsulation layers, the interfacial magnetic anisotropy and an easy axis of magnetization of the magnetically free region being approximately in a same direction.

25. The magnetoresistive memory of claim 24, wherein the dielectric material is magnesium oxide (MgO).

26. The magnetoresistive memory of claim 24, wherein a width and a thickness of the magnetically free region are approximately the same.

* * * * *